US012786582B2

(12) United States Patent
Kumagai et al.

(10) Patent No.: US 12,786,582 B2

(45) Date of Patent: Nov. 3, 2026

(54) PHOTODETECTION ELEMENT AND PHOTODETECTION DEVICE

(71) Applicant: SONY SEMICONDUCTOR SOLUTIONS CORPORATION, Kanagawa (JP)

(72) Inventors: Yoshimichi Kumagai, Kanagawa (JP); Masashi Bando, Kanagawa (JP); Naoyuki Osawa, Kanagawa (JP); Shunya Akiyama, Kanagawa (JP); Toru Shirakata, Kanagawa (JP); Takashi Abe, Kanagawa (JP); Tomoya Aota, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 163 days.

(21) Appl. No.: 18/692,442

(22) PCT Filed: Sep. 22, 2022

(86) PCT No.: PCT/JP2022/035385

§ 371 (c)(1),
(2) Date: Mar. 15, 2024

(87) PCT Pub. No.: WO2023/048235

PCT Pub. Date: Mar. 30, 2023

(65) Prior Publication Data

US 2025/0126375 A1 Apr. 17, 2025

(30) Foreign Application Priority Data

Sep. 27, 2021 (JP) ................................ 2021-156399
Mar. 4, 2022 (WO) .................. PCT/JP2022/009285

(51) Int. Cl.

*H04N 25/616* (2023.01)
*H04N 25/59* (2023.01)
(Continued)

(52) U.S. Cl.

CPC ........... *H04N 25/616* (2023.01); *H04N 25/59* (2023.01); *H04N 25/77* (2023.01); *H04N 25/771* (2023.01);
(Continued)

(58) Field of Classification Search

CPC .... H04N 25/59; H04N 25/616; H04N 25/771; H04N 25/79

See application file for complete search history.

(56) References Cited

U.S. PATENT DOCUMENTS

| | | | |
|---|---|---|---|
| 2006/0007329 | A1 | 1/2006 | Panicacci |
| 2016/0088251 | A1 | 3/2016 | Luo |

(Continued)

FOREIGN PATENT DOCUMENTS

| | | |
|---|---|---|
| JP | 2019-057873 | 4/2019 |
| TW | 201633518 A | 9/2016 |

(Continued)

OTHER PUBLICATIONS

English Translation of International Search Report prepared by the Japan Patent Office on Nov. 2, 2022, for International Application No. PCT/JP2022/035385, 2 pgs.

*Primary Examiner* — Daniel M Pasiewicz

(74) *Attorney, Agent, or Firm* — SHERIDAN ROSS P.C.

(57) ABSTRACT

A pixel layout is optimized. An amplification unit generates a signal corresponding to a charge held in a charge holding unit and outputs the signal to a predetermined first output node. A first capacitive element has one end connected to the first output node and holds a reset level that is a level of the signal at the time of resetting. A second capacitive element has one end connected to the first output node and holds an image signal level that is a level of the signal when the charge is transferred to the charge holding unit. A readout circuit is connected to a second output node, reads each of the reset level held in the first capacitive element and the image signal level held in the second capacitive element, and outputs the reset level and the image signal level as a reset signal and an image signal, respectively.

19 Claims, 61 Drawing Sheets

(51) Int. Cl.
*H04N 25/77* (2023.01)
*H04N 25/771* (2023.01)
*H04N 25/79* (2023.01)
*H10F 39/00* (2025.01)

(52) U.S. Cl.
CPC ....... *H04N 25/79* (2023.01); *H10F 39/80377* (2025.01)

(56) References Cited

U.S. PATENT DOCUMENTS

| | | | | |
|---|---|---|---|---|
| 2018/0103226 | A1 | 4/2018 | Raynor | |
| 2019/0149754 | A1 | 5/2019 | Otaka | |
| 2020/0112699 | A1 | 4/2020 | Huang | |
| 2020/0195863 | A1 | 6/2020 | Shim | |
| 2020/0260034 | A1 | 8/2020 | Moue et al. | |
| 2020/0279876 | A1 | 9/2020 | Lee et al. | |
| 2020/0389614 | A1* | 12/2020 | Benjaram .............. | H04N 25/78 |
| 2021/0084249 | A1 | 3/2021 | Nakazawa et al. | |
| 2022/0191416 | A1* | 6/2022 | Fowler ................. | H04N 25/616 |
| 2024/0348947 | A1* | 10/2024 | Hasegawa ............ | H04N 25/772 |

FOREIGN PATENT DOCUMENTS

| | | | |
|---|---|---|---|
| TW | 201820602 | A | 6/2018 |
| TW | 201926658 | A | 7/2019 |
| TW | 202010145 | A | 3/2020 |
| TW | 202029485 | A | 8/2020 |
| TW | 202123439 | A | 6/2021 |
| WO | WO 2019/131965 | | 7/2019 |

* cited by examiner

PHOTODETECTION ELEMENT AND PHOTODETECTION DEVICE

CROSS REFERENCE TO RELATED APPLICATIONS

This application is a national stage application under 35 U.S.C. 371 and claims the benefit of PCT Application No. PCT/JP2022/035385, having an international filing date of 22 Sep. 2022, which designated the United States, which PCT application claimed the benefit of Japanese Patent Application No. 2021-156399, filed 27 Sep. 2021, and PCT Application No. PCT/JP2022/009285, filed 4 Mar. 2022, the entire disclosures of each of which are incorporated herein by reference.

FIELD

The present disclosure relates to a photodetection element and a photodetection device.

BACKGROUND

A photodetection element that generates an image of a subject is used. The photodetection element is configured by arranging pixels having photoelectric conversion elements in a two-dimensional matrix. Further, the photodetection element repeats exposure for performing photoelectric conversion of light from a subject and reading of an image signal based on a charge generated by the photoelectric conversion from a pixel, to thereby output a generated image.

In this pixel, the charge generated by photoelectric conversion during an exposure period is accumulated inside the photoelectric conversion element. Then, the charge accumulated in the photoelectric conversion element after the lapse of the exposure period is transferred to a charge holding unit. The charge holding unit can be constituted by a floating diffusion layer formed by a diffusion region disposed on a semiconductor substrate on which the photoelectric conversion elements are formed. An amplification transistor is connected to this, and a signal corresponding to the charge held in the floating diffusion layer is generated. Such a signal generation method is referred to as a floating diffusion amplifier. Note that the floating diffusion layer is reset by the reset unit to discharge the charge remaining immediately before the transfer of the charge.

On the other hand, reading is sequentially performed for each row of pixels arranged in a two-dimensional matrix. At this time, reading is simultaneously performed in the pixels arranged in one row. As a method of generating this image, a rolling shutter method and a global shutter method are used.

The rolling shutter method is a method in which exposure and reading are sequentially performed with a period shifted for each row, and is a method in which the configuration of the photodetection element can be simplified. However, the timing of exposure differs for each row in the rolling shutter method, and thus there is a problem that distortion occurs in an image when a moving subject is imaged.

The global shutter method is a method in which exposure is simultaneously performed in all the pixels and the charge generated during the exposure period is held. The reading is sequentially performed for each row on the basis of the held charge. Image distortion can be prevented by a global shutter that simultaneously exposes all pixels. Because it takes time from the end of the exposure period to the reading, the charge is transferred to a second charge holding unit different from the above-described floating diffusion layer, and a signal is generated on the basis of the charge of the second charge holding unit at the time of reading. The floating diffusion layer is adjacent to the photoelectric conversion element, and thus there is a problem that a charge due to incident light leaking is superimposed on the charge of the floating diffusion layer. In order to prevent this deterioration in image quality, the second charge holding unit is needed.

In the photodetection element employing the global shutter method, a photodetection element in which a capacitive element is applied to a second charge holding unit has been proposed. For example, a photodetection element (imaging element) including a sample and hold circuit having two capacitive elements for each pixel has been proposed (see, for example, Patent Literature 1).

CITATION LIST

Patent Literature

Patent Literature 1: US 2020/279876 A

SUMMARY

Technical Problem

However, in the above-described conventional technique, since the floating diffusion layer (floating diffusion region) and the reset transistor are disposed apart from each other in the pixel, there is a problem that noise increases. This is because it is difficult to discharge the residual charge of the floating diffusion layer by the reset transistor.

Accordingly, in the present disclosure, an optimal pixel layout is proposed in a photodetection element employing the global shutter method.

Solution to Problem

A photodetection element according to the present disclosure includes: a photoelectric conversion unit that is formed on a semiconductor substrate and generates a charge corresponding to incident light; a charge transfer unit that transfers the charge to a charge holding unit that holds the charge; a first reset unit that is disposed adjacent to the charge holding unit and resets the charge holding unit; an amplification unit that generates a signal corresponding to the charge held in the charge holding unit and outputs the signal to a predetermined first output node; a constant current circuit that is connected to the first output node and constitutes a load of the amplification unit; a first capacitive element that has one end connected to the first output node and holds a reset level that is a level of the signal at a time of resetting by the first reset unit; a second capacitive element that has one end connected to the first output node and holds an image signal level that is a level of the signal when the charge is transferred to the charge holding unit; a first switch element that is connected between another end of the first capacitive element and a predetermined second output node and controls a current flowing through the first capacitive element; a second switch element that is connected between another end of the second capacitive element and the second output node and controls a current flowing through the second capacitive element; a second reset unit that resets the second output node; a readout circuit that is connected to the second output node, reads each of the reset level held in the first capacitive element and the image signal level held in the second capacitive element, and outputs the reset level and the image signal level as a reset signal and an image signal, respectively; and a substrate contact that supplies a reference potential to the semiconductor substrate.

DESCRIPTION OF EMBODIMENTS

Figure 1:
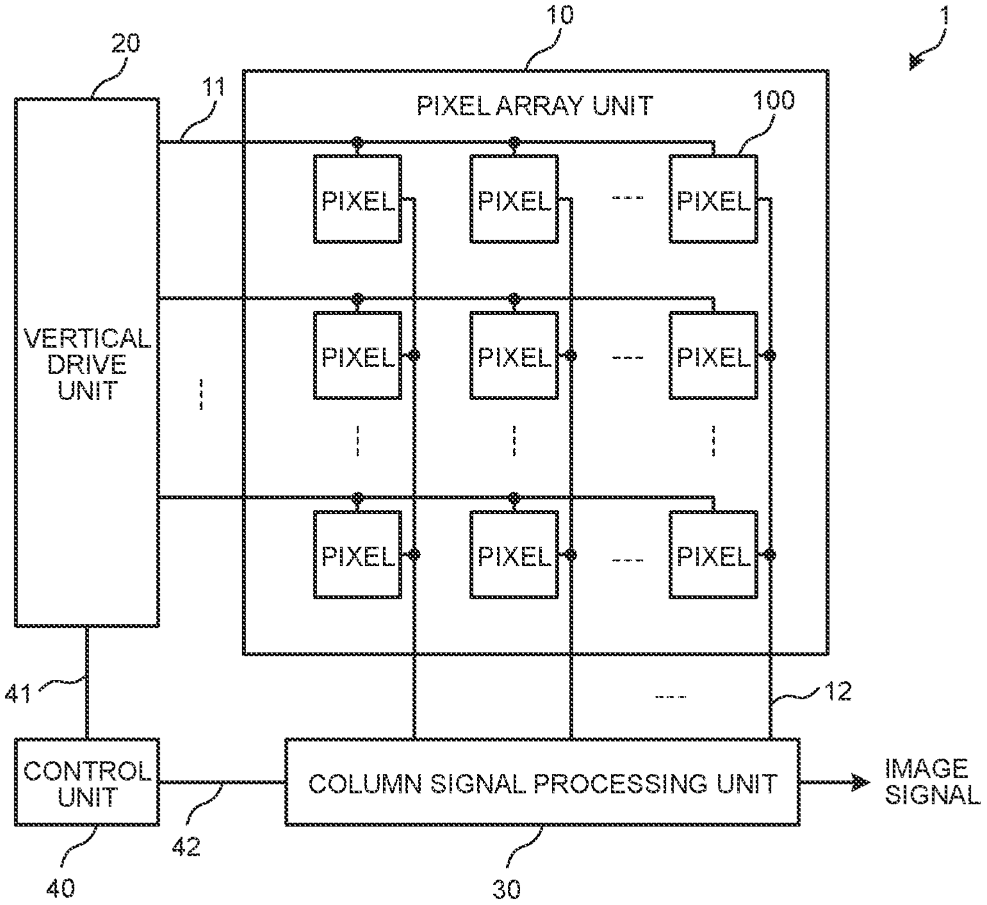
FIG. 1 is a diagram depicting a configuration example of a photodetection device according to an embodiment of the present disclosure.

Hereinafter, an embodiment of the present disclosure will be described in detail with reference to the drawings. The description will be given in the following order. Note that in each of the following embodiments, the same parts are denoted by the same reference numerals, and redundant description will be omitted.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Thirteenth Embodiment
14. Fourteenth Embodiment
15. Application Example
16. Application Example to Mobile Body
17. Application Example to Endoscopic Surgery System

1. First Embodiment

[Configuration of Imaging Element]

FIG. 1 is a diagram depicting a configuration example of a photodetection device according to an embodiment of the present disclosure. The drawing is a block diagram depicting a configuration example of a photodetection device 1. The photodetection device 1 is a semiconductor element that generates image data of a subject. The photodetection device 1 includes a pixel array unit 10, a vertical drive unit 20, a column signal processing unit 30, and a control unit 40.

The pixel array unit 10 is configured by arranging a plurality of pixels 100. The pixel array unit 10 in the drawing represents an example in which a plurality of pixels 100 is arranged in a shape of a two-dimensional matrix. Here, the pixels 100 each include a photoelectric conversion unit that performs photoelectric conversion of incident light, and generates an image signal of a subject on the basis of the emitted incident light. For example, a photodiode can be used as the photoelectric conversion unit. Signal lines 11 and 12 are wired to each pixel 100. The pixel 100 is controlled by a control signal transmitted by the signal line 11 to generate an image signal, and outputs the generated image signal via the signal line 12. Note that the signal line 11 is disposed for each row of the shape of the two-dimensional matrix, and is commonly wired to a plurality of pixels 100 arranged in one row. The signal line 12 is disposed for each column of the shape of the two-dimensional matrix, and is commonly wired to a plurality of pixels 100 arranged in one column.

The vertical drive unit 20 generates a control signal of the pixel 100 described above. The vertical drive unit 20 in the drawing generates a control signal for each row of the two-dimensional matrix of the pixel array unit 10 and sequentially outputs the control signal via the signal line 11.

The column signal processing unit 30 processes the image signal generated by the pixel 100. The column signal processing unit 30 in the drawing simultaneously processes the image signals from the plurality of pixels 100 arranged in one row of the pixel array unit 10 transmitted via the signal line 12. As this processing, for example, analog-digital conversion for converting an analog image signal generated by the pixel 100 into a digital image signal and correlated double sampling (CDS) for removing an offset error of the image signal can be performed. The processed image signal is output to a circuit or the like outside the photodetection device 1.

The control unit 40 controls the vertical drive unit 20 and the column signal processing unit 30. The control unit 40 in the drawing outputs respective control signals via signal lines 41 and 42 to control the vertical drive unit 20 and the column signal processing unit 30. Note that the pixel array unit 10 is an example of a photodetection element described in the claims. The column signal processing unit 30 is an example of a processing circuit described in the claims.

[Configuration of Pixel]

Figure 2:
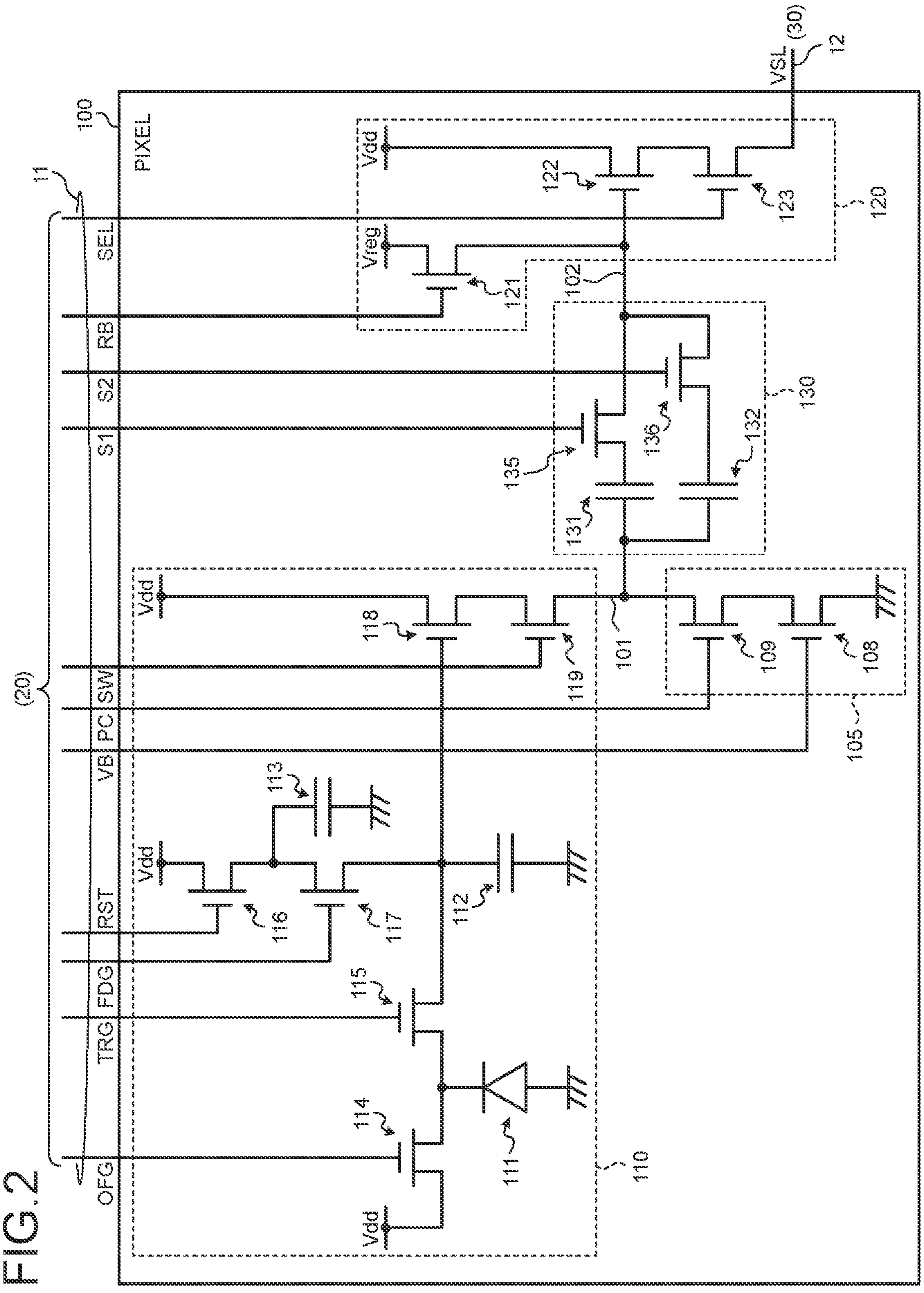
FIG. 2 is a diagram depicting a configuration example of a pixel according to a first embodiment of the present disclosure.

FIG. 2 is a diagram depicting a configuration example of a pixel according to a first embodiment of the present disclosure. The drawing is a circuit diagram depicting a configuration example of the pixel 100. The pixel 100 in the drawing includes a pre-stage circuit 110, a constant current circuit 105, a signal level holding circuit 130, and a post-stage circuit 120. In the pixel 100, a signal line OFG, a signal line TRG, a signal line FDG, a signal line RST, a signal line VB, a signal line PC, a signal line SW, a signal line S1, a signal line S2, a signal line RB, and a signal line SEL are wired. These signal lines constitute the signal line 11. Further, a signal line VSL is connected to the pixel 100. The signal line VSL constitutes the signal line 12. In addition, power supply lines Vdd and Vreg are wired to the pixel 100. The power supply line Vdd is a power supply line that supplies power to the pixel 100 and supplies a reset voltage by a first reset unit 116 described later. The power supply line Vreg is a power supply line that supplies a reset voltage by a second reset unit 121 described later. Note that n-channel MOS transistors can be used as the MOS transistors disposed in the drawing.

The pre-stage circuit 110 is a circuit that generates a signal corresponding to incident light. The pre-stage circuit 110 outputs the generated signal to a first output node 101. The pre-stage circuit 110 in the drawing includes a photoelectric conversion unit 111, a charge holding unit 112, a second charge holding unit 113, a charge discharge unit 114, a charge transfer unit 115, a first reset unit 116, a coupling unit 117, an amplification unit 118, and a first selection unit 119.

An anode of the photoelectric conversion unit 111 is grounded, and a cathode is connected to a source of the charge discharge unit 114 and a source of the charge transfer unit 115. A drain of the charge discharge unit 114 is connected to the power supply line Vdd. A drain of the charge transfer unit 115 is connected to a source of the coupling unit 117, a gate of the amplification unit 118 and one end of the charge holding unit 112. Another end of the charge holding unit 112 is grounded. A drain of the coupling unit 117 is connected to a source of the first reset unit 116 and one end of the second charge holding unit 113. Another end of the second charge holding unit 113 is grounded. A drain of the first reset unit 116 is connected to the power supply line Vdd. A drain of the amplification unit 118 is connected to the power supply line Vdd, and a source thereof is connected to a drain of the first selection unit 119. A source of the first selection unit 119 is connected to the first output node 101. A signal line OFG, a signal line TRG, a signal line FDG, a signal line RST, and a signal line SW are connected to a gate of the charge discharge unit 114, a gate of the charge transfer unit 115, a gate of the coupling unit 117, a gate of the first reset unit 116, and a gate of the first selection unit 119, respectively.

The photoelectric conversion unit 111 performs photoelectric conversion of incident light. The photoelectric conversion unit 111 can include a photodiode formed on a semiconductor substrate.

The charge discharge unit 114 discharges and resets the charge accumulated in the photoelectric conversion unit 111. The charge discharge unit 114 in the drawing discharges the charge accumulated in the photoelectric conversion unit 111 to the power supply line Vdd.

The charge transfer unit 115 transfers the charge of the photoelectric conversion unit 111 to the charge holding unit 112. The charge transfer unit 115 transfers a charge by causing conduction of the photoelectric conversion unit 111 and the charge holding unit 112.

The charge holding unit 112 holds a charge generated by photoelectric conversion of the photoelectric conversion unit 111. The above-described floating diffusion layer can be used for the charge holding unit 112.

The second charge holding unit 113 holds a charge generated by photoelectric conversion of the photoelectric conversion unit 111. The second charge holding unit 113 holds a charge when coupled to the charge holding unit 112.

The coupling unit 117 couples the charge holding unit 112 and the second charge holding unit 113. The coupling unit 117 couples the second charge holding unit 113 to the charge holding unit 112 by connecting the second charge holding unit 113 to the charge holding unit 112 in parallel. By this coupling, it is possible to increase the holding capacity of the charge generated by the photoelectric conversion unit 111, and it is possible to adjust the sensitivity.

The first reset unit 116 resets the charge holding unit 112. The first reset unit 116 performs reset by discharging the charge of the charge holding unit 112 to the power supply line Vdd. The first reset unit 116 in the drawing resets the charge holding unit 112 via the coupling unit 117. Further, the first reset unit 116 further resets the second charge holding unit 113.

The amplification unit 118 generates a signal corresponding to the charge held in the charge holding unit 112. The amplification unit 118 constitutes a source follower circuit together with the constant current circuit 105 connected via the first output node 101, and outputs the generated signal to the first output node 101.

The first selection unit 119 outputs the signal generated by the amplification unit 118 to the first output node 101. The first selection unit 119 is connected between the amplification unit 118 and the first output node 101, and transmits a signal of the amplification unit 118 to the first output node 101 by conduction of itself. By arranging the first selection unit 119 to be in the non-conductive state, it is possible to reduce the leakage current when the amplification unit 118 is in the off-state. Note that the first selection unit 119 is an example of a selection unit described in the claims.

Note that the second charge holding unit 113 and the coupling unit 117 can be omitted. In that case, the first reset unit 116 is directly connected to the charge holding unit 112. Further, the first selection unit 119 can be omitted. In that case, the amplification unit 118 is directly connected to the first output node.

The constant current circuit 105 is a constant current circuit constituting a load of the amplification unit 118 described above. The constant current circuit 105 supplies a constant current suction current (sink current) to the first output node 101. The constant current circuit 105 in the drawing includes MOS transistors 109 and 108.

A drain of the MOS transistor 109 is connected to the first output node 101, and a source thereof is connected to the drain of the MOS transistor 108. A source of the MOS transistor 108 is grounded. A gate of the MOS transistor 108 and a gate of the MOS transistor 109 are connected to the signal line VB and the signal line PC, respectively.

The signal line VB and the signal line PC each transmit a bias voltage. The bias voltage from the signal line PC is applied to the gate of the MOS transistor 109, and the MOS transistor 109 supplies a constant current corresponding to the applied bias voltage. Similarly, the bias voltage from the signal line VB is applied to the gate of the MOS transistor 108, and the MOS transistor 108 supplies a constant current corresponding to the applied bias voltage. As depicted in the drawing, noise can be reduced by connecting the two MOS transistors in series and supplying different bias voltages to the respective gates. Further, it is possible to reduce the fluctuation of the output current when the power supply voltage fluctuates. Note that either of the MOS transistors 108 and 109 can be omitted.

The signal level holding circuit 130 is a circuit that is connected to the first output node 101 and holds the level of a signal output from the pre-stage circuit 110. The signal level holding circuit 130 in the drawing includes a first capacitive element 131, a second capacitive element 132, a first switch element 135, and a second switch element 136.

One end of the first capacitive element 131 and one end of the second capacitive element 132 are commonly connected to the first output node 101. Another end of the first capacitive element 131 and another end of the second capacitive element 132 are connected to a source of the first switch element 135 and a source of the second switch element 136, respectively. A drain of the first switch element 135 and a drain of the second switch element 136 are commonly connected to a second output node 102. A gate of the first switch element 135 and a gate of the second switch element 136 are connected to the signal line S1 and the signal line S2, respectively.

The first capacitive element 131 is a capacitive element that holds a reset level that is a level of a signal at the time of resetting by the first reset unit 116.

The second capacitive element 132 is a capacitive element that holds an image signal level that is a level of the signal when the charge of the photoelectric conversion unit 111 is transferred by the charge transfer unit 115 to the charge holding unit 112 and held therein.

The first switch element 135 is an element that controls a current flowing through the first capacitive element 131. The first switch element 135 is connected between the first capacitive element 131 and the second output node 102.

The second switch element 136 is an element that controls a current flowing through the second capacitive element 132. The second switch element 136 is connected between the second capacitive element 132 and the second output node 102.

The post-stage circuit 120 generates and outputs an image signal corresponding to a signal level held in the first capacitive element 131 and the second capacitive element 132. The post-stage circuit 120 in the drawing includes a second reset unit 121, a second amplification unit 122, and a second selection unit 123.

A source of the second reset unit 121 and a gate of the second amplification unit 122 are commonly connected to the second output node 102. A drain of the second reset unit 121 is connected to the power supply line Vreg. A drain of the second amplification unit 122 is connected to the power supply line Vdd, and a source thereof is connected to a drain of the second selection unit 123. A source of the second selection unit 123 is connected to the signal line VSL.

The second reset unit 121 resets the second output node 102. The second reset unit 121 performs reset by applying the voltage of the power supply line Vreg to the second output node 102.

The second amplification unit 122 is an element that generates a signal corresponding to the voltage of the second output node 102. The second amplification unit 122 reads each of the reset level held in the first capacitive element 131 and the image signal level held in the second capacitive element 132, and generates a reset signal and an image signal.

The second selection unit 123 is an element that outputs the signal generated by the second amplification unit 122 to the signal line VSL. The second selection unit 123 is connected between the second amplification unit 122 and the signal line VSL, and transmits the signal of the second amplification unit 122 to the signal line VSL by conduction of itself. Note that circuits of the second amplification unit 122 and the second selection unit 123 constitute a readout circuit.

Note that the configuration of the pixel 100 is not limited to this example. For example, the charge discharge unit 114 can be omitted. In this case, the charge of the photoelectric conversion unit 111 can be discharged by causing conduction of the charge transfer unit 115 and the first reset unit 116.

[Configuration of Cross-Section of Pixel]

Figure 3:
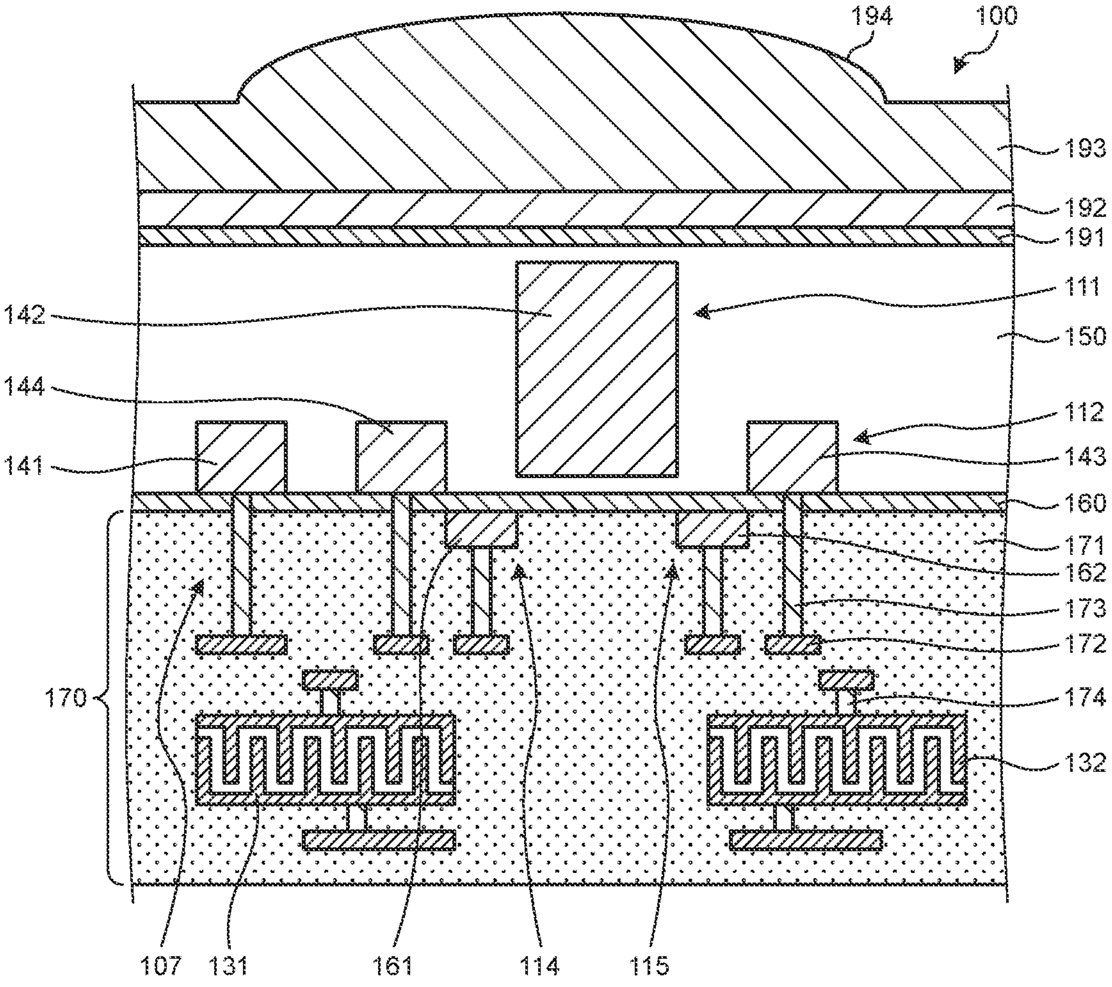
FIG. 3 is a cross-sectional view depicting a configuration example of the pixel according to the first embodiment of the present disclosure.

FIG. 3 is a cross-sectional view depicting a configuration example of the pixel according to the first embodiment of the present disclosure. The drawing is a cross-sectional view depicting a configuration example of the pixel 100. The pixel 100 in the drawing includes a semiconductor substrate 150, insulating films 160 and 191, a wiring region 170, a color filter 192, a planarization film 193, and an on-chip lens 194.

The semiconductor substrate 150 is a semiconductor substrate on which the diffusion layer of elements of the pixel 100 is disposed. The semiconductor substrate 150 can include, for example, silicon (Si). The elements such as the photoelectric conversion unit 111 can be disposed in a well region formed in the semiconductor substrate 150. For convenience, the semiconductor substrate 150 in the drawing is assumed to be formed in a p-type well region. By disposing an n-type or p-type semiconductor region in the well region, a diffusion layer of the elements can be formed. In the drawing, the photoelectric conversion unit 111, the charge holding unit 112, the charge transfer unit 115, and the charge discharge unit 114 are depicted as examples.

The photoelectric conversion unit 111 includes an n-type semiconductor region 141. Specifically, a photodiode formed by a pn junction at an interface between an n-type semiconductor region 142 and the surrounding p-type well region corresponds to the photoelectric conversion unit 111. Charges generated by photoelectric conversion of the photoelectric conversion unit 111 during the exposure period are accumulated in the n-type semiconductor region 142. The accumulated charges are transferred to and held in the charge holding unit 112 by the charge transfer unit 115 after the lapse of the exposure period.

The charge holding unit 112 includes a semiconductor region 143. This semiconductor region is an n-type semiconductor region having a relatively high impurity concentration. The semiconductor region 143 corresponds to the above-described floating diffusion layer.

The charge transfer unit 115 includes a MOS transistor disposed between the photoelectric conversion unit 111 and the charge holding. Specifically, the charge transfer unit 115 is a MOS transistor having the semiconductor region 142 and the semiconductor region 143 as a source region and a drain region, respectively, and having a region where a channel is formed between the semiconductor region 142 and the semiconductor region 143. A gate 162 is disposed adjacent to the region where the channel is formed.

The charge discharge unit 114 includes a MOS transistor disposed adjacent to the photoelectric conversion unit 111. Specifically, the charge discharge unit 114 is a MOS transistor having the semiconductor region 142 and a semiconductor region 144 as a source region and a drain region, respectively, and having a region where a channel is formed between the semiconductor region 142 and the semiconductor region 143. A gate 161 is disposed adjacent to the region where the channel is formed.

Note that the semiconductor region 141 is further depicted in the semiconductor substrate 150 of the drawing. The semiconductor region 141 is a p-type semiconductor region having a relatively high impurity concentration. A well contact 107 to be described later is connected to the semiconductor region 141. Hereinafter, the semiconductor region to which the well contact is connected is referred to as a well contact region.

The insulating film 160 is a film that insulates a front surface side of the semiconductor substrate 150. The insulating film 160 can include silicon oxide ($SiO_2$) or silicon nitride (SiN). Note that the insulating film 160 immediately below the gates 161 and 162 constitutes a gate insulating film.

The wiring region 170 is a region disposed on the front surface side of the semiconductor substrate 150 and in which the wiring of the pixel 100 is disposed. The wiring region 170 includes wirings 172 and an insulating layer 171. The wirings 172 transmit a signal or the like of an element of the pixel 100. The wirings 172 can include a conductor such as copper (Cu) or tungsten (W). The insulating layer 171 insulates the wirings 172 and the like. The insulating layer 171 can include, for example, $SiO_2$.

The wirings 172 and the semiconductor region 143 of the semiconductor substrate 150, the gate 162, and the like can be connected by a contact plug 173. The contact plug 173 can include, for example, columnar tungsten or the like. Further, the wirings 172 disposed in different layers can be connected by a via plug 174. The via plug 174 can include, for example, columnar Cu.

The well contact 107 is disposed in the semiconductor region 141 constituting the well contact region. The well contact 107 supplies a reference potential to the well region of the semiconductor substrate 150. Here, the reference potential is a potential serving as a reference of a circuit or a signal of the pixel 100. For example, a ground potential can be applied to the reference potential. Further, a fixed potential other than the ground potential can be applied to the reference potential. Note that the well contact 107 is an example of a substrate contact described in the claims.

Note that the first capacitive element 131 and the second capacitive element 132 are further disposed in the wiring region 170 in the drawing. Details of the configurations of the first capacitive element 131 and the second capacitive element 132 will be described later.

The insulating film 191 insulates a back surface side of the semiconductor substrate 150. The insulating film 191 can include, for example, $SiO_2$.

The color filter 192 is an optical filter that transmits light of a predetermined wavelength among the incident light. As the color filter 192, for example, a color filter that transmits red light, green light, and blue light can be used.

The planarization film 193 planarizes the surface of the color filter 192. The planarization film 193 can include the same material as the on-chip lens 194 described later.

The on-chip lens 194 is a lens that condenses incident light. The on-chip lens 194 is formed in a hemispherical shape, and condenses incident light on the photoelectric conversion unit 111.

The pixel 100 having the configuration in the drawing is an element that detects light incident from the back surface side of the semiconductor substrate 150.

[Configuration of Capacitive Element]

Figure 4:
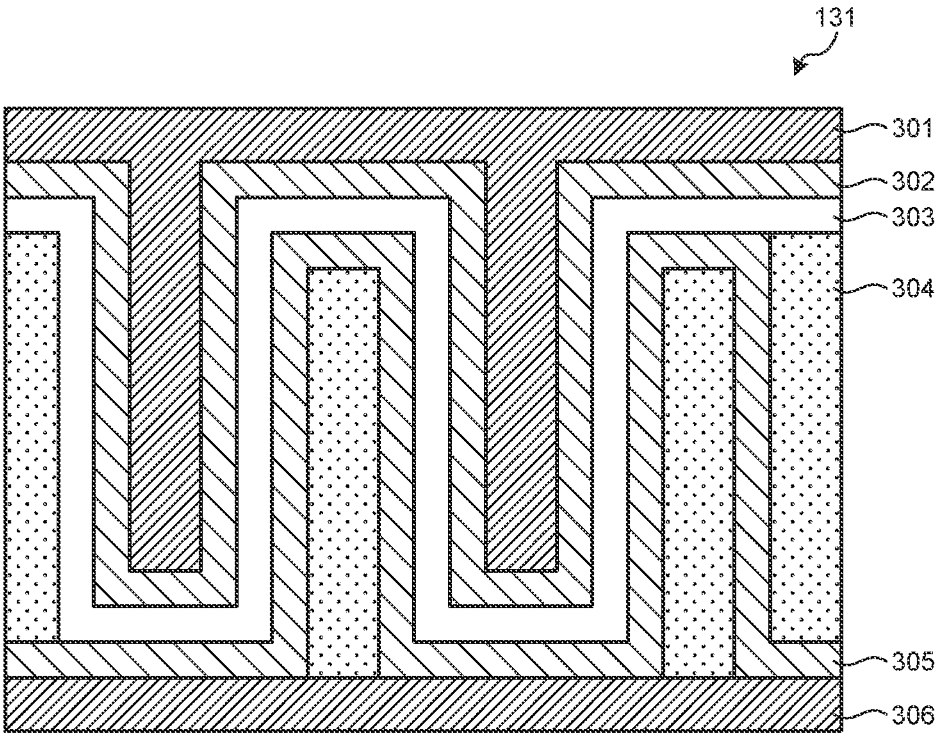
FIG. 4 is a view depicting a configuration example of a capacitive element according to an embodiment of the present disclosure.

FIG. 4 is a view depicting a configuration example of a capacitive element according to the embodiment of the present disclosure. The drawing is a cross-sectional view depicting a configuration example of the first capacitive element 131. The first capacitive element 131 in the drawing includes metal films 301 and 306, barrier metals 302 and 305, and insulating films 303 and 304.

The metal films 301 and 306 are films of metal such as Cu. Columnar protrusions are formed on the metal film 301 in the drawing.

The barrier metals 302 and 305 are films disposed adjacent to the metal films 301 and 306, respectively, to prevent diffusion of Cu. These barrier metals 302 and 305 can include, for example, titanium nitride (TiN).

The insulating film 303 is a dielectric disposed between the barrier metals 302 and 305. The insulating film 303 can include, for example, a film of zirconium oxide ($ZrO_2$) or aluminum oxide ($Al_2O_3$).

The insulating film 304 is a film that insulates the metal film 301 and the like. The same $SiO_2$ as that of the insulating layer 171 described in FIG. 3 can be used for the insulating film 304.

As depicted in the drawing, the metal films 301 and 306 facing each other with the insulating film 303 interposed therebetween constitute a capacitive element. By forming a large number of protrusions on the metal film 301, the surface area can be increased, and the electrostatic capacitance can be increased. Note that the second capacitive element 132 can have a similar configuration. The first capacitive element 131 depicted in the drawing is referred to as a metal insulator metal (MIM) structure.

[Configuration of Plane of Pixel]

Figure 5:
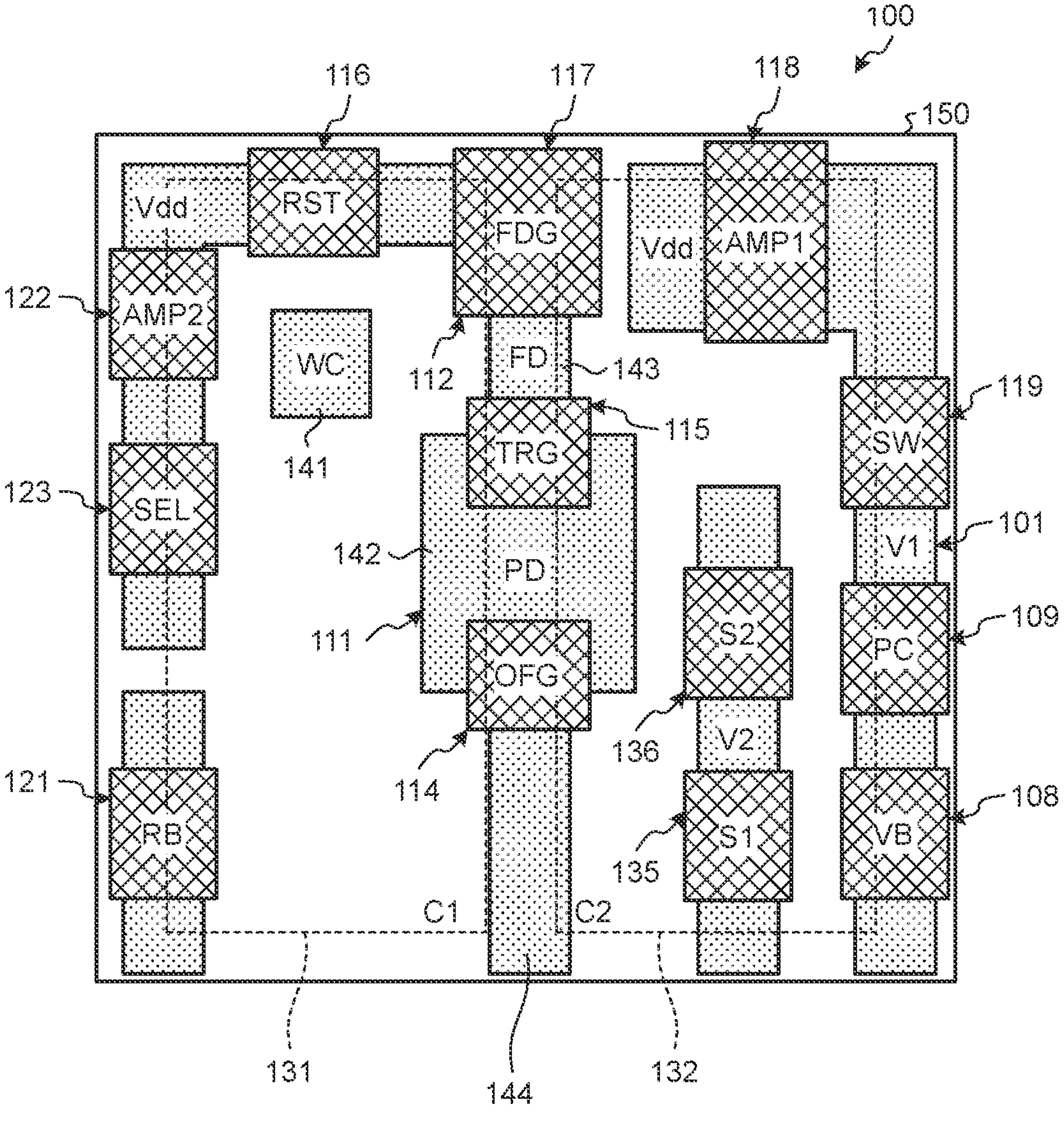
FIG. 5 is a plan view depicting a configuration example of the pixel according to the first embodiment of the present disclosure.

FIG. 5 is a plan view depicting a configuration example of the pixel according to the first embodiment of the present disclosure. The drawing is a plan view depicting a configuration example of the pixel 100. The drawing depicts a configuration of the pixel 100 on the front surface side of the semiconductor substrate 150, and describes an arrangement of elements such as the photoelectric conversion unit 111. As depicted in the drawing, the pixel 100 can be configured in a substantially square shape. In the drawing, a dot-hatched region represents a semiconductor region. Further, a mesh-hatched region represents a gate. Furthermore, an outlined region in the drawing represents a separation region. The separation region is a region that electrically separates the diffusion layer. The separation region can be configured by, for example, shallow trench isolation (STI). Further, dotted-line rectangles in the drawing represent the first capacitive element 131 and the second capacitive element 132 disposed in the wiring region 170.

Further, “OFG”, “PD”, “TRG”, “FD”, “FDG”, “RST”, and “AMP1” in the drawing represent the charge discharge unit 114, the photoelectric conversion unit 111, the charge transfer unit 115, the charge holding unit 112, the coupling unit 117, the first reset unit 116, and the amplification unit 118, respectively. Furthermore, “SW”, “PC”, “VB”, “RB”, and “AMP2” in the drawing respectively represent the first selection unit 119, the MOS transistor 109, the MOS transistor 108, the second reset unit 121, and the second amplification unit 122. Further, “S1” and “S2” in the drawing represent the first switch element 135 and the second switch element 136, respectively.

Further, “SEL” and “WC” in the drawing respectively represent the second selection unit 123 and the well contact region (semiconductor region 141). Furthermore, “C1” and “C2” in the drawing represent the first capacitive element 131 and the second capacitive element 132, respectively. Further, “Vdd” in the drawing represents a semiconductor region to which the power supply line Vdd is connected. In the drawing, “V1” and “V2” represent semiconductor regions constituting the first output node 101 and the second output node 102, respectively.

As depicted in the drawing, the semiconductor region 142 of the photoelectric conversion unit 111 is disposed at the center of the pixel 100. The gate of the charge discharge unit 114 and the semiconductor region 144 are sequentially disposed on a lower side of the photoelectric conversion unit 111 in the drawing. Hereinafter, a notation such as “lower side” in a plan view as in the drawing represents a direction in the drawing. The gate of the charge transfer unit 115, the charge holding unit 112 (semiconductor region 143), and the gate of the coupling unit 117 are sequentially disposed on an upper side of the photoelectric conversion unit 111. The gate of the first reset unit 116 and a semiconductor region (drain region of the first reset unit 116) connected to the power supply line Vdd are disposed on a left side of the coupling unit 117. The second amplification unit 122 and the second selection unit 123 are sequentially disposed on a lower side of the semiconductor region. The second reset unit 121 is disposed on a lower side of the second selection unit 123 with a separation region interposed therebetween.

Further, on a right side of the coupling unit 117, a semiconductor region (drain region of the amplification unit 118) connected to the power supply line Vdd with a separation region interposed therebetween, the gate of the amplification unit 118, and a semiconductor region (source region of the amplification unit 118) are disposed in this order. The gate of the first selection unit 119, the first output node 101, the MOS transistor 109, and the MOS transistor 108 are sequentially disposed on a lower side of the source region of the amplification unit 118. Furthermore, the second switch element 136 is disposed between the photoelectric conversion unit 111 and the MOS transistor 109, and the first switch element 135 is disposed on a lower side of the second switch element 136. A semiconductor region between the gate of the first switch element 135 and the gate of the second switch element 136 is the semiconductor region constituting the second output node 102. Further, the semiconductor region 141 constituting the well contact region is disposed in a region between the charge holding unit 112 and the second amplification unit 122. Furthermore, the first capacitive element 131 and the second capacitive element 132 are disposed on a left side and a right side of the drawing, respectively.

As described above, in the pixel 100 in the drawing, the coupling unit 117 and the first reset unit 116 are disposed adjacent to the charge holding unit 112. Thus, the charge of the charge holding unit 112 can be discharged with high efficiency. As compared with a case where the charge holding unit 112 and the first reset unit 116 are connected by the wiring 172 or the like, the charge remaining in the charge holding unit 112 at the time of resetting can be reduced. Further, in the pixel 100 in the drawing, the power supply line of the first reset unit 116 and the second selection unit 123 can be shared. Furthermore, since the power supply line Vdd is shared by the first reset unit 116 and the second amplification unit 122, the area efficiency of the pixel 100 can be improved.

[Generation of Image Signal]

Figure 6:
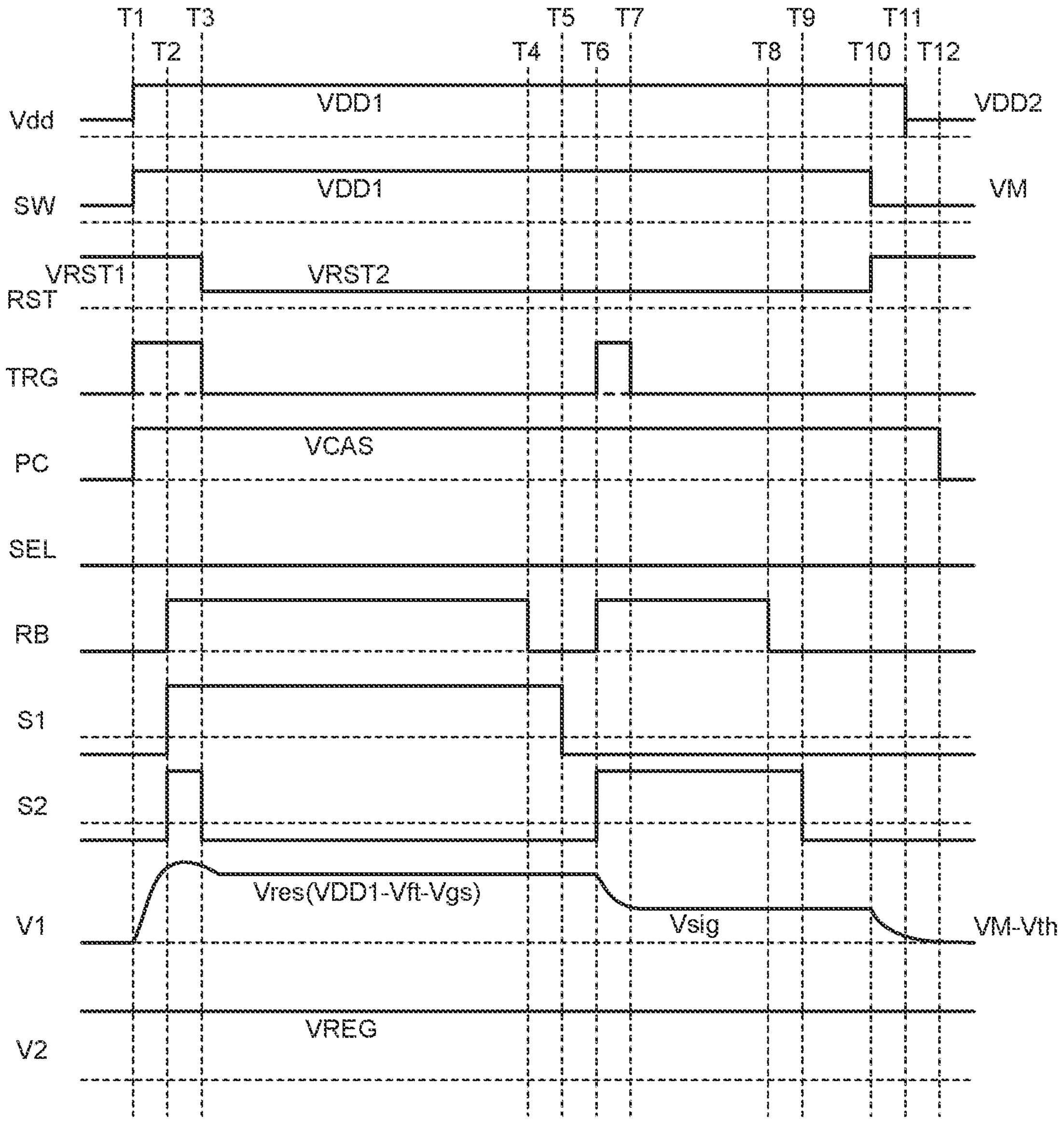
FIG. 6 is a diagram depicting an example of generation of an image signal according to the first embodiment of the present disclosure.
Figure 7:
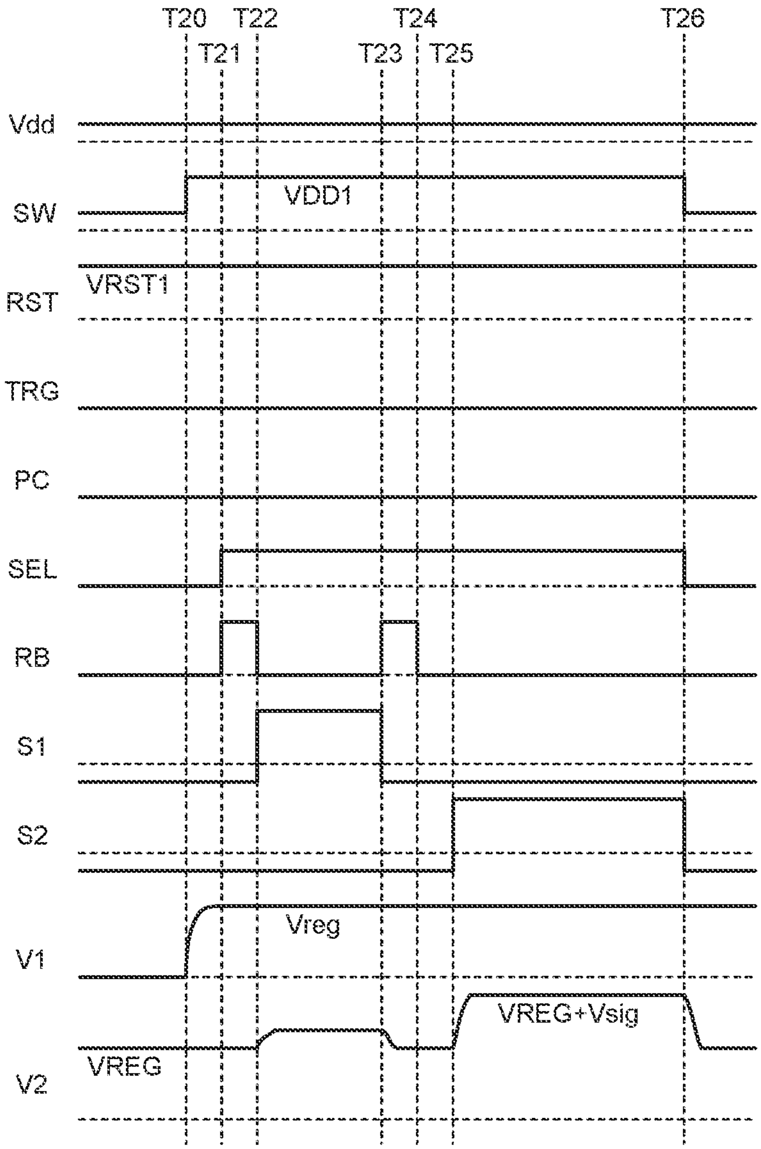
FIG. 7 is a diagram depicting an example of generation of the image signal according to the first embodiment of the present disclosure.

FIGS. 6 and 7 are diagrams depicting an example of generation of an image signal according to the first embodiment of the present disclosure. FIGS. 6 and 7 are timing diagrams depicting an example of generation of an image signal in the pixel 100. FIG. 6 depicts a procedure at the time of exposure of image signal generation. The procedure of FIG. 6 is a procedure simultaneously executed in all the pixels 100 of the pixel array unit 10. Further, FIG. 7 depicts a procedure at the time of reading of image signal generation. The procedure of FIG. 7 is a procedure executed in the pixel 100 disposed in the selected row. Note that the procedures of FIGS. 6 and 7 describe an example of a case where the charge discharge unit 114, the second charge holding unit 113, and the coupling unit 117 are omitted.

Further, in FIGS. 6 and 7, “Vdd” represents the power supply voltage of the power supply line Vdd. “SW” represents a control signal of the first selection unit 119 transmitted by the signal line SW. “RST” represents a control signal of the first reset unit 116 transmitted by the signal line RST. “TRG” represents a control signal of the charge transfer unit 115 transmitted by the signal line TRG. “PC” represents the bias voltage of the MOS transistor 109 transmitted by the signal line PC. “SEL” represents a control signal of the second selection unit 123 transmitted by the signal line SEL. “RB” represents a control signal of the second reset unit 121 transmitted by the signal line RB. “S1” represents a control signal of the first switch element 135 transmitted by the signal line S1. “S2” represents a control signal of the second switch element 136 transmitted by the signal line S2. “V1” represents a voltage waveform of the first output node 101. “V2” represents a voltage waveform of the second output node 102. Further, dotted lines of the waveforms in FIGS. 6 and 7 represent the level of 0 V.

Further, in the following description, an "ON signal" represents a control signal for bringing a MOS transistor into a conductive state.

The procedure of the exposure period will be described using FIG. 6. Note that different power supply voltages are supplied to the power supply line Vdd in the exposure period and a readout period. In the initial state, VDD2 is applied as the power supply voltage of the power supply line Vdd. A low level voltage VM is applied to the signal line SW, and the first selection unit 119 is brought into a non-conductive state. A signal of a voltage VRST1 is applied to the signal line RST. This VRST1 is a signal that causes conduction of the first reset unit 116. Thus, the charge holding unit 112 is reset. 0 V is applied to the signal line TRG, and the charge transfer unit 115 is brought into a non-conductive state. 0 V is applied to the signal line PC, and the MOS transistor 109 is brought into a non-conductive state. 0 V is applied to the signal line SEL, and the second selection unit 123 is brought into a non-conductive state. A negative signal is applied to the signal line S1, and the first switch element 135 is brought into a non-conductive state. A negative signal is also applied to the signal line S2, and the second switch element 136 is brought into a non-conductive state. The first output node 101 is at a voltage of 0 V. Further, the second output node 102 is in a state in which the power supply voltage VREG of the power supply line Vreg is applied.

At T1, the power supply voltage of the power supply line Vdd becomes VDD1 higher than VDD2. Further, VDD1 is applied to the signal line SW, and the first selection unit 119 is brought into a conductive state. Furthermore, an ON signal is applied to the signal line TRG, and the charge transfer unit 115 is brought into a conductive state. Further, a predetermined bias voltage VCAS is applied to the signal line PC, and the MOS transistor 109 supplies a constant current to the first output node 101. Since the first reset unit 116 is in a conductive state and the charge transfer unit 115 is in the conductive state, the photoelectric conversion unit 111 and the charge holding unit 112 are reset. Furthermore, since the first selection unit 119 is conductive, the voltage of the first output node 101 increases.

At T2, an ON signal is applied to the signal line RB, and the second reset unit 121 is brought into a conductive state. Further, an ON signal is applied to the signal line S1, and the first switch element 135 is brought into a conductive state. Furthermore, an ON signal is applied to the signal line S2, and the second switch element 136 is brought into a conductive state. During a period from T1 to T2, the charge holding unit 112 is reset, and the first capacitive element 131 and the second capacitive element 132 are also reset. Further, the second output node 102 becomes the reset voltage VREG.

At T3, VRST2 that is an intermediate voltage between VRST1 and the ground potential (0 V) is applied to the signal line RST, and the first reset unit 116 is brought into a non-conductive state. Further, the application of the ON signal to the signal line TRG is stopped, and the charge transfer unit 115 is brought into a non-conductive state. Furthermore, the application of the ON signal to the signal line S2 is stopped, and the second switch element 136 is brought into a non-conductive state. Thus, resetting of the photoelectric conversion unit 111 and the charge holding unit 112 ends. This resetting corresponds to global resetting that is simultaneously executed in all the pixels 100. With the end of the resetting, the exposure period is started, and the charge generated by the photoelectric conversion is accumulated in the photoelectric conversion unit 111. The voltage of the first output node 101 becomes Vres. This Vres corresponds to a voltage obtained by subtracting a gate-source voltage Vgs of the amplification unit 118 and a voltage drop Vft of the first selection unit 119 from the power supply voltage VDD1 of the power supply line Vdd. This is a voltage corresponding to the reset level. The first capacitive element 131 is charged to the reset level.

At T4, the application of the ON signal to the signal line RB is stopped, and the second reset unit 121 is brought into a non-conductive state. Thus, the reset level is held in the first capacitive element 131.

At T5, the application of the ON signal to the signal line S1 is stopped, and the first switch element 135 is brought into a non-conductive state.

At T6, an ON signal is applied to the signal line TRG, and the charge transfer unit 115 is brought into a conductive state. Thus, the charge of the photoelectric conversion unit 111 is transferred to the charge holding unit 112. Further, an ON signal is applied to the signal line RB, and the second reset unit 121 is brought into a conductive state. Furthermore, an ON signal is applied to the signal line S2, and the second switch element 136 is brought into a conductive state. The voltage of the first output node 101 decreases according to the charge transferred to the charge holding unit 112.

At T7, the application of the ON signal to the signal line TRG is stopped, and the charge transfer unit 115 is brought into a non-conductive state. The voltage of the first output node 101 becomes Vsig. This is a voltage corresponding to the image signal level. The second capacitive element 132 is charged to the image signal level.

At T8, the application of the ON signal to the signal line RB is stopped, and the second reset unit 121 is brought into a non-conductive state. Thus, the image signal level is held in the second capacitive element 132.

At T9, the application of the ON signal to the signal line S2 is stopped, and the second switch element 136 is brought into a non-conductive state.

At T10, the voltage of the signal line SW changes from VDD1 to VM, which is a voltage of 0 V. Thus, the first selection unit 119 is brought into a non-conductive state. Further, the voltage applied to the signal line RST changes from VRST2 to VRST1. Thus, the first reset unit 116 is brought into a conductive state. Consequently, the voltage of the first output node 101 decreases.

At T11, the voltage of the power supply line Vdd changes to VDD2. This voltage corresponds to a voltage obtained by subtracting the above-described Vgs and Vft from VDD1.

At T12, the application of the bias voltage to the signal line PC is stopped. Thus, the MOS transistor 109 is brought into a non-conductive state.

According to the above procedure, the reset level and the image signal level can be held in each pixel 100 by the first capacitive element 131 and the second capacitive element 132, respectively.

The procedure of the readout period will be described using FIG. 7. Note that VRST1 is applied to the signal line RST in the readout period. 0 V is applied to the signal line TRG and the signal line PC.

At T20, VDD1 is applied to the signal line SW, and the first selection unit 119 is brought into a conductive state. Thus, the first output node 101 rises to a voltage equal to VREG.

At T21, an ON signal is applied to the signal line SEL, and the first selection unit 119 is brought into a conductive state. Further, an ON signal is applied to the signal line RB, and the second reset unit 121 is brought into a conductive state. Thus, the second output node 102 is reset.

At T22, the application of the ON signal to the signal line RB is stopped, and the second reset unit 121 is brought into a non-conductive state. Further, an ON signal is applied to the signal line S1, and the first switch element 135 is brought into a conductive state. The second output node 102 becomes a voltage in which the reset level is superimposed on VREG. An image signal corresponding to this voltage is generated by the second amplification unit 122 and output to the signal line VSL. This image signal corresponds to an image signal at the time of resetting.

At T23, the application of the ON signal to the signal line S1 is stopped, and the first switch element 135 is brought into a non-conductive state. Further, an ON signal is applied to the signal line RB, and the second reset unit 121 is brought into a conductive state. Thus, the second output node 102 is reset.

At T24, the application of the ON signal to the signal line RB is stopped, and the second reset unit 121 is brought into a non-conductive state.

At T25, an ON signal is applied to the signal line S2, and the second switch element 136 is brought into a conductive state. The second output node 102 becomes a voltage in which the image signal level is superimposed on VREG. An image signal corresponding to this voltage is generated by the second amplification unit 122 and output to the signal line VSL as an image signal.

At T26, the application of the ON signal to the signal line SW is stopped, and the first selection unit 119 is brought into a non-conductive state. Further, the application of the ON signal to the signal line SEL is stopped, and the second selection unit 123 is brought into a non-conductive state. Furthermore, the application of the ON signal to the signal line S2 is stopped, and the second switch element 136 is brought into a non-conductive state.

The procedures from T20 to T26 are sequentially executed for all the rows of the pixel array unit 10. Thus, an image signal for one screen can be generated. Note that the column signal processing unit 30 performs CDS processing of subtracting the image signal at the time of resetting output from the pixel 100 at T22 to T23 from the image signal output from the pixel 100 at T25 to T26. Note that the influence of an offset error of the pixel circuit can be reduced by performing subtraction processing while holding the reset level and the image signal level in the first capacitive element 131 and the second capacitive element 132, respectively. The offset error corresponds to, for example, an error due to a charge generated by incident light leaking from the vicinity of the photoelectric conversion unit 111. By the above-described subtraction processing, an error due to an offset commonly generated in the first capacitive element 131 and the second capacitive element 132 is reduced, and parasitic light sensitivity (PLS), which is sensitivity based on leaked incident light, can be reduced.

The image signal can be generated by the procedure described above. Note that, in a case where the charge discharge unit 114 is used, the photoelectric conversion unit 111 can be reset by bringing it into a conductive state during the period from T1 to T3 in FIG. 6. In this case, the charge transfer unit 115 can be brought into a non-conductive state in the period from T1 to T3.

As described above, in the photodetection device 1 according to the first embodiment of the present disclosure, the charge holding unit 112, the second reset unit 121, and the coupling unit 117 are disposed adjacent to each other. Thus, the residual charge of the charge holding unit 112 at the time of resetting can be reduced, and noise can be reduced.

2. Second Embodiment

The pixel 100 according to the first embodiment described above includes the first capacitive element 131 and the second capacitive element 132. On the other hand, a photodetection device 1 according to a second embodiment of the present disclosure is different from the photodetection device 1 according to the first embodiment described above in that the photodetection device 1 includes four or more capacitive elements.

[Configuration of Pixel]

Figure 8:
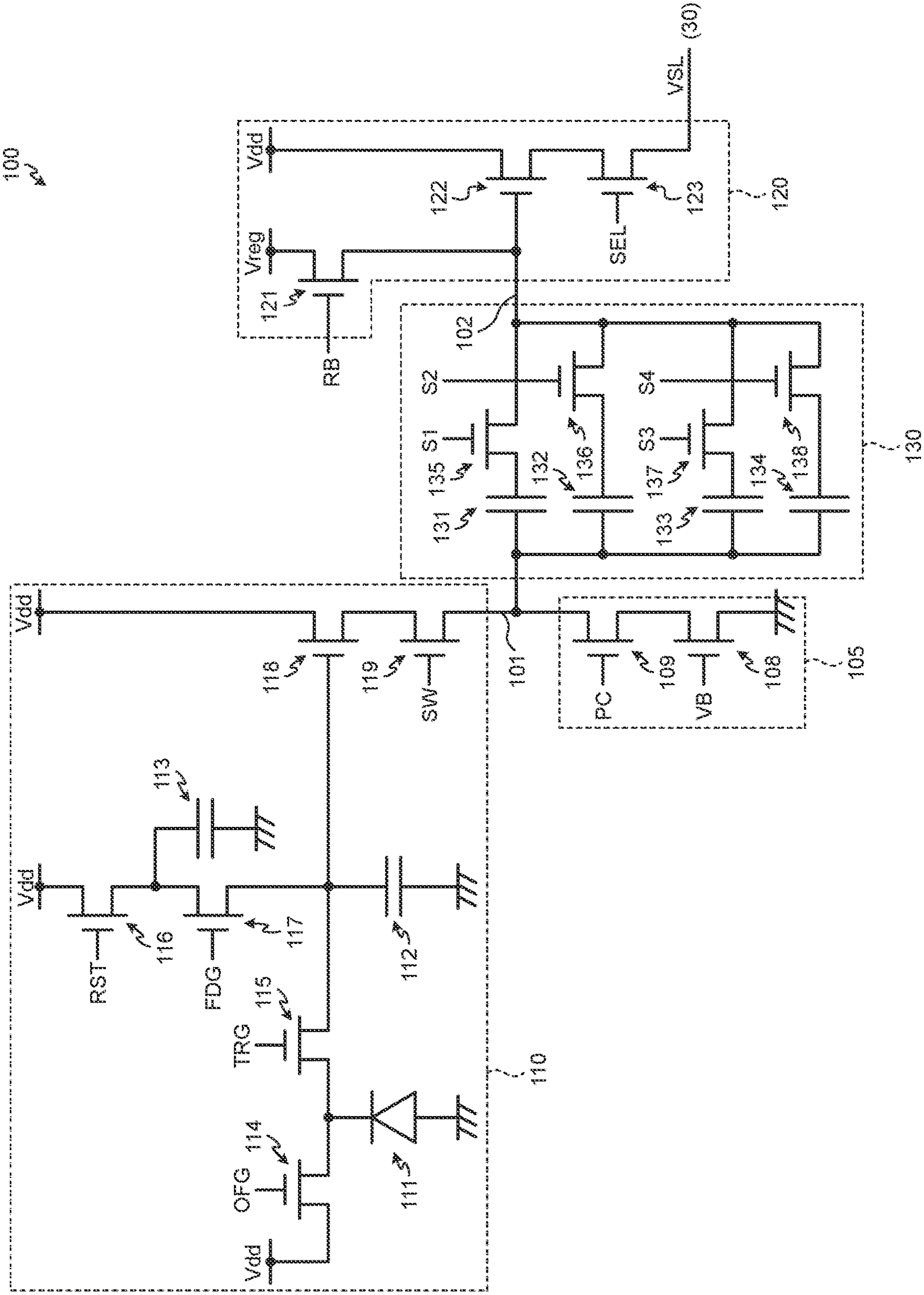
FIG. 8 is a diagram depicting a configuration example of a pixel according to a second embodiment of the present disclosure.

FIG. 8 is a diagram depicting a configuration example of the pixel according to the second embodiment of the present disclosure. The drawing is a circuit diagram depicting a configuration example of the pixel 100 as in FIG. 2. The pixel 100 in the drawing is different from the pixel 100 in FIG. 2 in further including a third capacitive element 133, a fourth capacitive element 134, a third switch element 137, and a fourth switch element 138. An n-channel MOS transistor can be used for the third switch element 137 and the fourth switch element 138.

One end of the third capacitive element 133 is connected to the first output node 101, and another end is connected to the source of the third switch element 137. A drain of the third switch element 137 is connected to the second output node 102, and a gate thereof is connected to the signal line S3. One end of the fourth capacitive element 134 is connected to the first output node 101, and another end is connected to the source of the fourth switch element 138. A drain of the fourth switch element 138 is connected to the second output node 102, and the gate is connected to the signal line S3.

As is the first capacitive element 131, the third capacitive element 133 is a capacitive element that holds a reset level. By causing conduction of the third switch element 137 simultaneously with the first switch element 135, the reset level can be held in the first capacitive element 131 and the third capacitive element 133.

As is the second capacitive element 132, the fourth capacitive element 134 is a capacitive element that holds an image signal level. By causing conduction of the fourth switch element 138 simultaneously with the second switch element 136, the image signal level can be held by the second capacitive element 132 and the fourth capacitive element 134.

As described above, by connecting the third capacitive element 133 and the fourth capacitive element 134 in parallel to the first capacitive element 131 and the second capacitive element 132, it is possible to increase the holding capacities of the reset level and the image signal level. Thus, the sensitivity can be adjusted.

[Configuration of Plane of Pixel]

Figure 9:
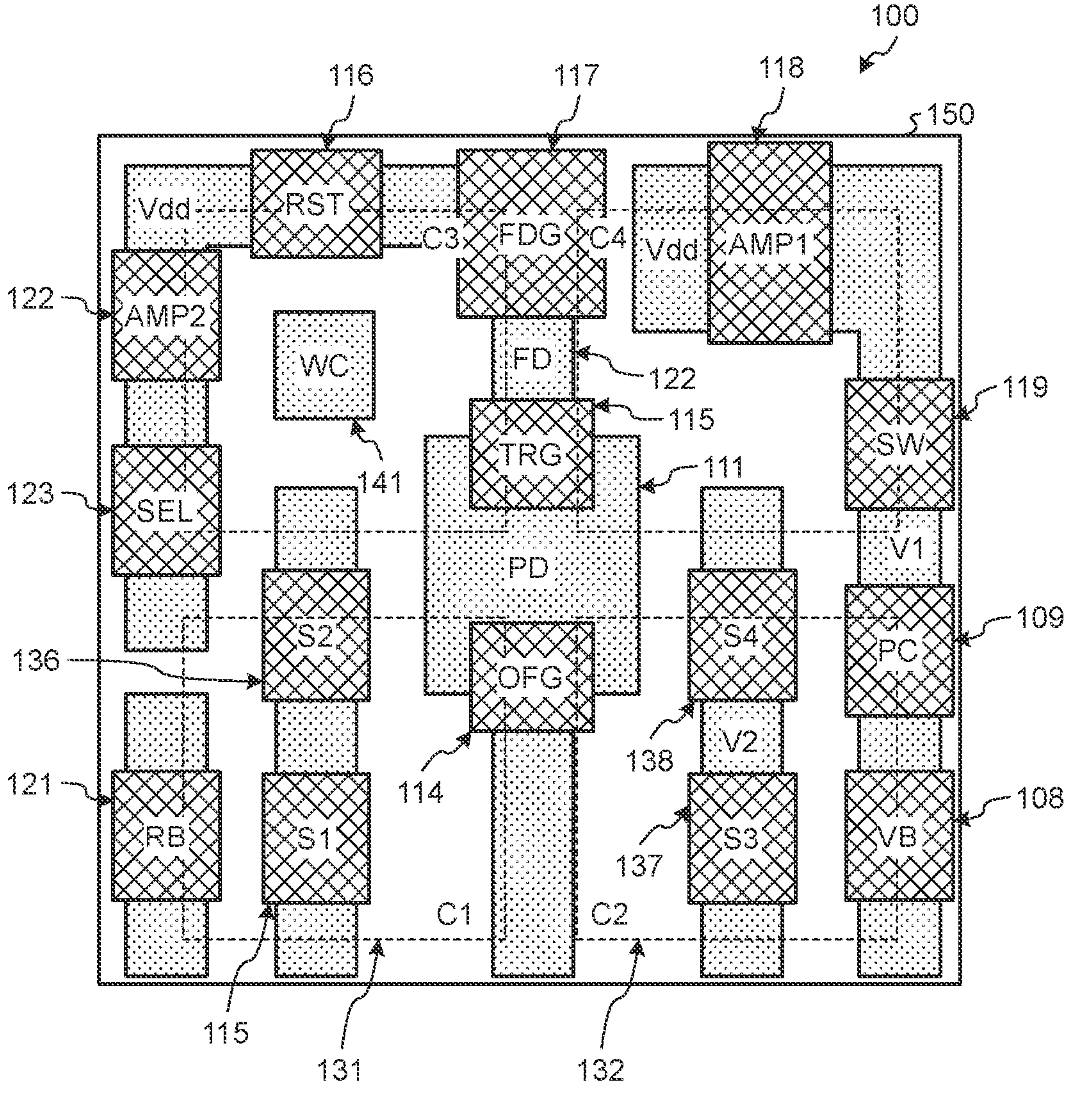
FIG. 9 is a plan view depicting a configuration example of a pixel according to the second embodiment of the present disclosure.

FIG. 9 is a plan view depicting a configuration example of the pixel according to the second embodiment of the present disclosure. The drawing is a plan view depicting a configuration example of the pixel 100 as in FIG. 5. The pixel 100 in the drawing is different from the pixel 100 in FIG. 5 in that the third capacitive element 133, the fourth capacitive element 134, the third switch element 137, and the fourth switch element 138 are further disposed.

"S3" and "S4" in the drawing represent the third switch element 137 and the fourth switch element 138, respectively.

Further, "C3" and "C4" in the drawing represent the third capacitive element 133 and the fourth capacitive element 134, respectively.

The second switch element 136 is disposed between the photoelectric conversion unit 111 and the second selection unit 123, and the first switch element 135 is disposed on a lower side of the second switch element 136. Further, the fourth switch element 138 is disposed between the photoelectric conversion unit 111 and the MOS transistor 109, and the third switch element 137 is disposed on a lower side of the fourth switch element 138. The first capacitive element 131 is disposed at the lower left of the pixel 100. The second capacitive element 132 is disposed at the lower right of the pixel 100. The third capacitive element 133 is disposed at the upper left of the pixel 100. The fourth capacitive element 134 is disposed at the upper right of the pixel 100.

[Other Configurations of Plane of Pixel]

Figure 10A:
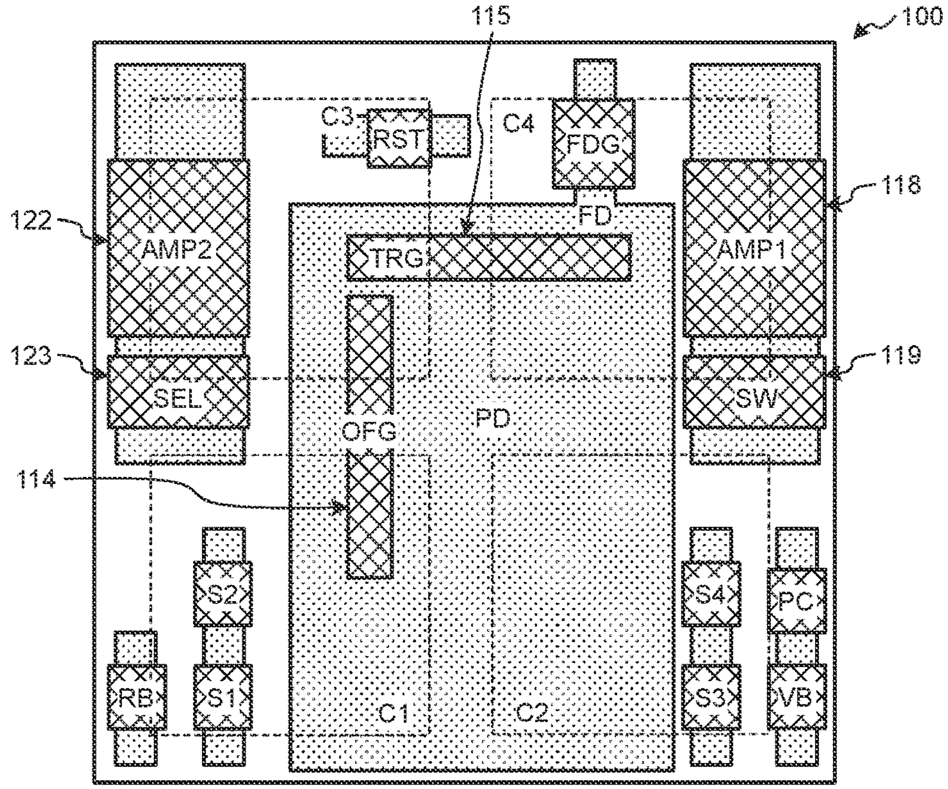
FIG. 10A is a plan view depicting another configuration example of the pixel according to the second embodiment of the present disclosure.
Figure 10B:
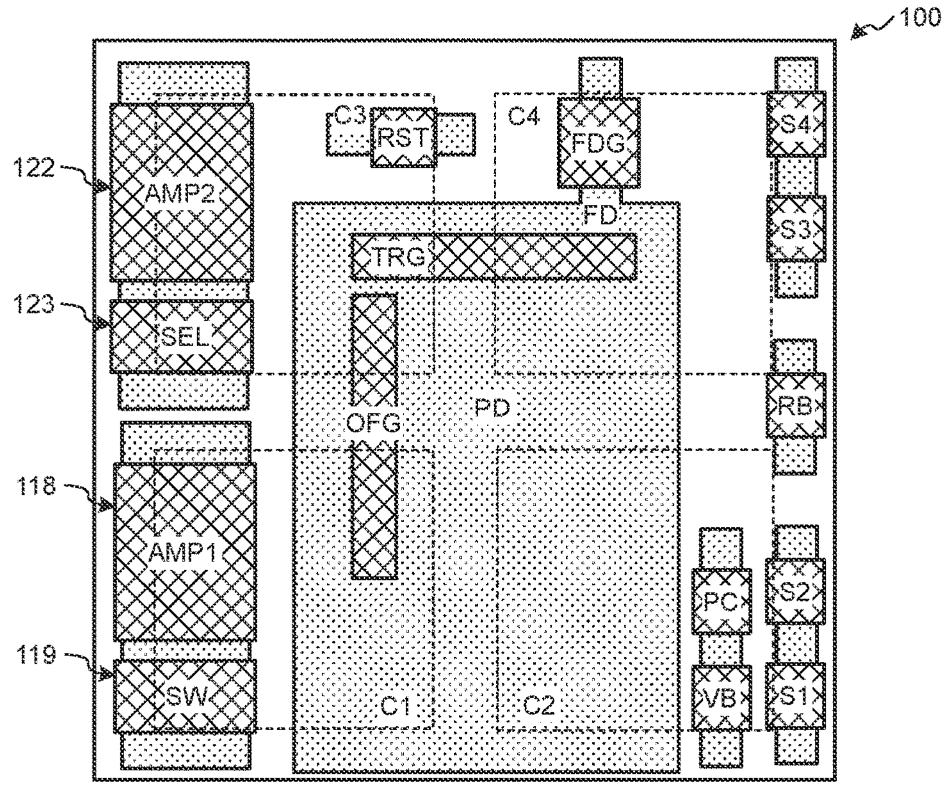
FIG. 10B is a plan view depicting another configuration example of the pixel according to the second embodiment of the present disclosure.

FIGS. 10A and 10B are plan views depicting other configuration examples of the pixel according to the second embodiment of the present disclosure. FIGS. 10A and 10B are plan views depicting configuration examples of the pixel 100 as in FIG. 9. The pixel 100 in FIGS. 10A and 10B represents a configuration example of the pixel 100 configured in a large size.

In FIG. 10A, the photoelectric conversion unit 111 is disposed at the center of the pixel 100. The charge transfer unit 115 is disposed on the upper side of the photoelectric conversion unit 111, and the charge discharge unit 114 is disposed on a left side of the photoelectric conversion unit 111. The charge holding unit 112 and the coupling unit 117 are sequentially disposed at the upper right of the photoelectric conversion unit 111. The second amplification unit 122, the second selection unit 123, the second switch element 136, the first switch element 135, and the second reset unit 121 are disposed on the left side of the pixel 100 photoelectric conversion unit 111. The amplification unit 118, the first selection unit 119, the fourth switch element 138, the third switch element 137, the MOS transistor 109, and the MOS transistor 108 are disposed on a right side of the photoelectric conversion unit 111.

As depicted in FIG. 10A, in the pixel 100 in the drawing, the charge transfer unit 115 and the charge discharge unit 114 are arranged in directions orthogonal to each other. Further, the first switch element 135, the second switch element 136, the third switch element 137, and the fourth switch element 138 are disposed at corner portions of the pixel 100. Consequently, the influence of the incident light on the first switch element 135 and the like can be reduced.

In FIG. 10B, the second amplification unit 122, the second selection unit 123, the amplification unit 118, and the first selection unit 119 are disposed on the left side of the photoelectric conversion unit 111. The fourth switch element 138 and the third switch element 137, the second reset unit 121, the second switch element 136 and the first switch element 135, and the MOS transistor 109 and the MOS transistor 108 are disposed on the right side of the photoelectric conversion unit 111. Other than this, the arrangement is similar to that of the pixels 100 in FIG. 10A, and thus the description thereof will be omitted.

The configuration of the photodetection device 1 other than this is similar to the configuration of the photodetection device 1 in the first embodiment of the present disclosure, and thus the description thereof will be omitted.

As described above, the photodetection device 1 according to the second embodiment of the present disclosure further includes the third capacitive element 133 and the fourth capacitive element 134, and can adjust the sensitivity of the pixel 100.

3. Third Embodiment

The pixel 100 according to the first embodiment described above includes the pre-stage circuit 110, the constant current circuit 105, the signal level holding circuit 130, and the post-stage circuit 120. On the other hand, pixels 100 according to a third embodiment of the present disclosure are different from those of the above-described first embodiment in that components are shared by a plurality of pixels 100.

[Configuration of Pixel]

Figure 11:
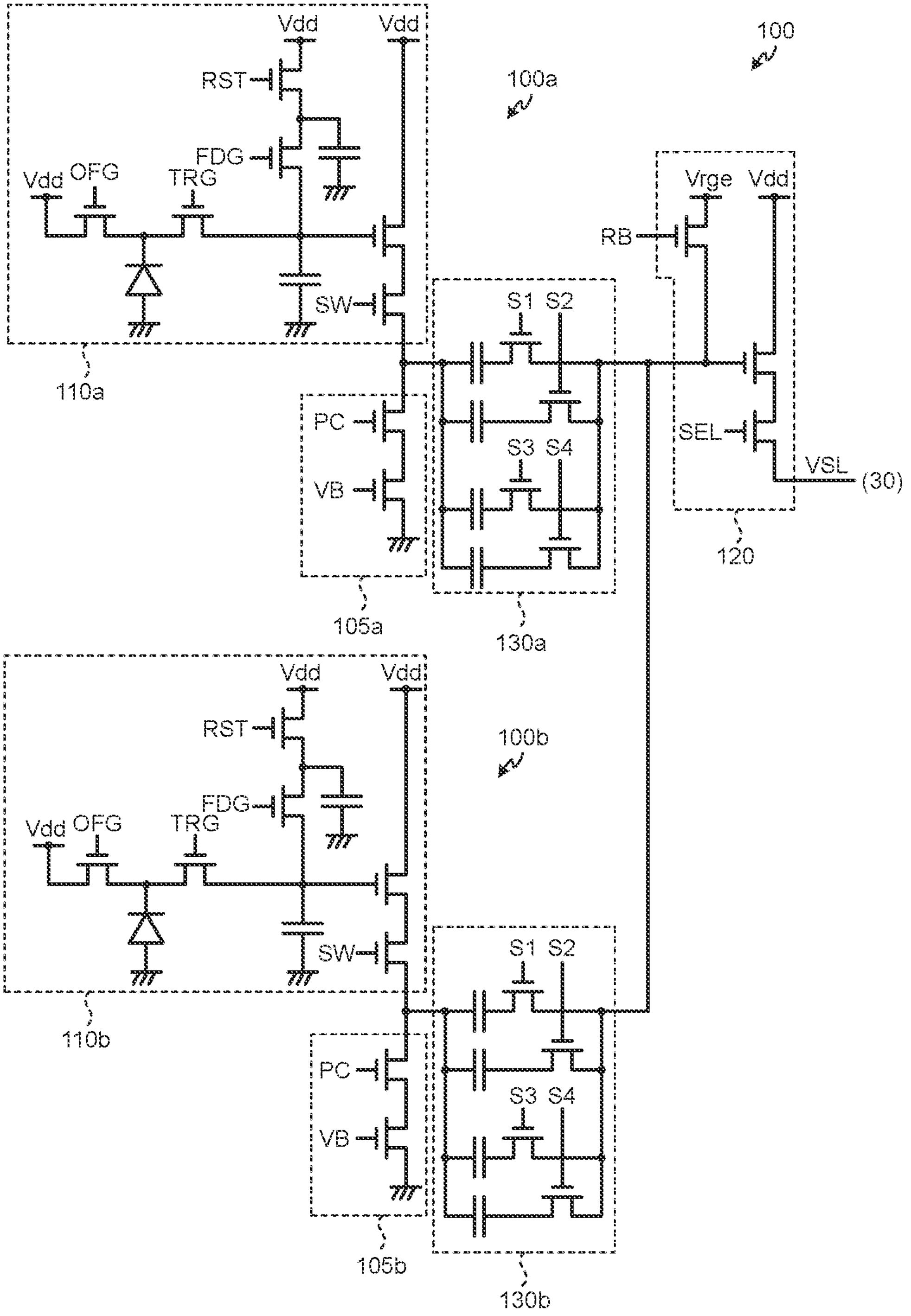
FIG. 11 is a diagram depicting a configuration example of pixels according to a third embodiment of the present disclosure.

FIG. 11 is a diagram depicting a configuration example of pixels according to the third embodiment of the present disclosure. The drawing is a circuit diagram depicting a configuration example of the pixels 100 as in FIG. 2. The drawing is different from the pixel 100 of FIG. 2 in that the post-stage circuit 120 is shared by a plurality of pixels 100.

A pixel 100*a* in the drawing includes a pre-stage circuit 110*a*, a constant current circuit 105*a*, and a signal level holding circuit 130*a*. A pixel 100*b* in the drawing includes a pre-stage circuit 110*b*, a constant current circuit 105*b*, and a signal level holding circuit 130*b*. Further, the pixel 100*a* and the pixel 100*b* share one post-stage circuit 120. Specifically, the second output node 102 of the pixel 100*a* and the second output node 102 of the pixel 100*b* are commonly connected to the post-stage circuit 120. As described above, the drawing depicts an example in which the post-stage circuit 120 is shared by the two pixels 100.

[Configuration of Plane of Pixel]

Figure 12:
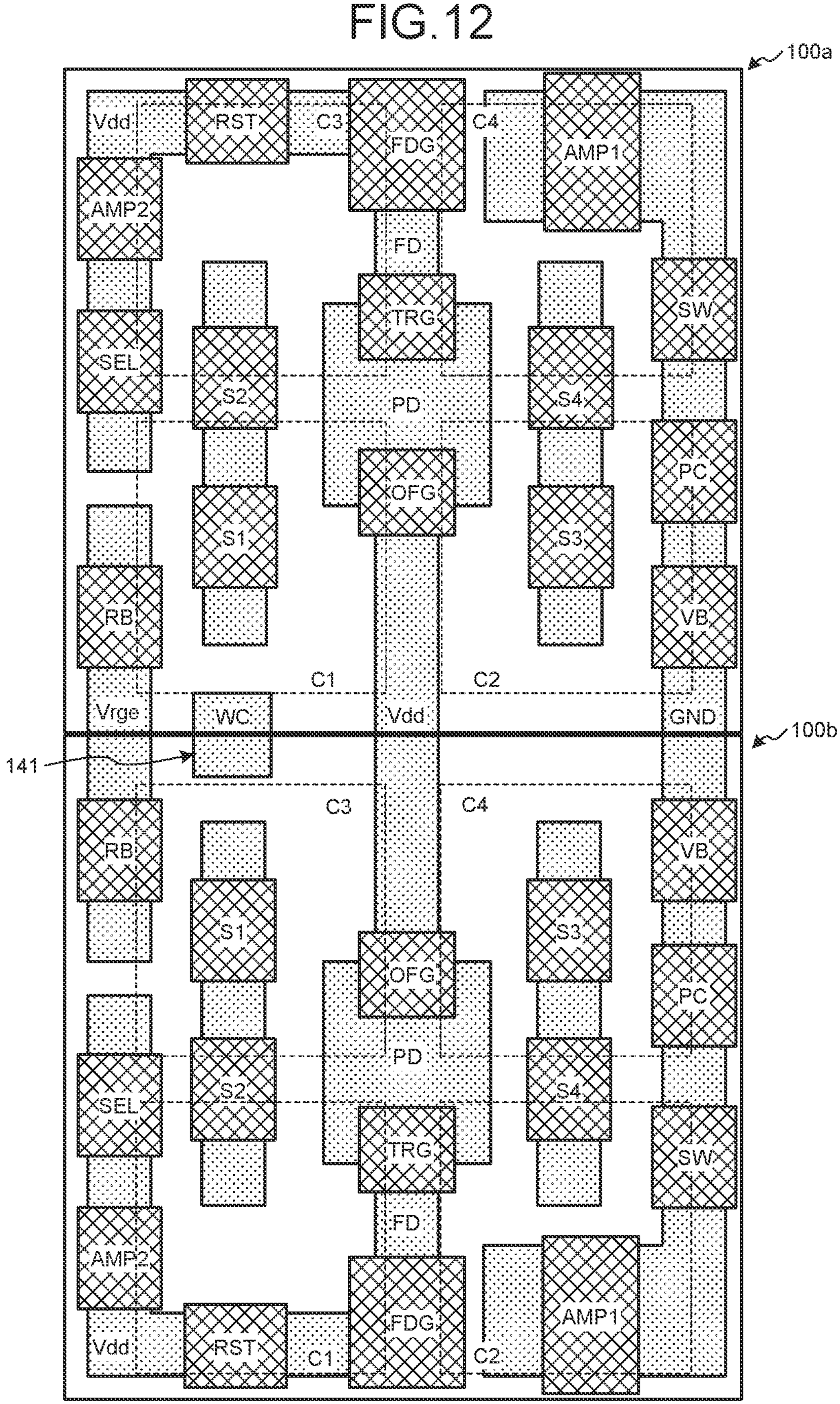
FIG. 12 is a plan view depicting a configuration example of pixels according to the third embodiment of the present disclosure.

FIG. 12 is a plan view depicting a configuration example of pixels according to the third embodiment of the present disclosure. The drawing is a plan view depicting a configuration example of the pixels 100 as in FIG. 5. The pixels 100 in the drawing represent an example in a case where the well contact 107, the power supply line Vdd, the power supply line Vreg, and the ground line GND are shared by the two pixels 100.

In the drawing, the pixel 100*a* and the pixel 100*b* are disposed adjacent to each other. The well contact 107 is disposed at a boundary between the pixel 100*a* and the pixel 100*b*. Further, a semiconductor region to which the power supply line Vdd is connected, a semiconductor region to which the power supply line Vreg is connected, and a semiconductor region to which the ground line GND is connected are disposed at boundaries between the pixel 100*a* and the pixel 100*b*, respectively. The well contact 107 and the like are shared by the pixel 100*a* and the pixel 100*b*.

Figure 13:
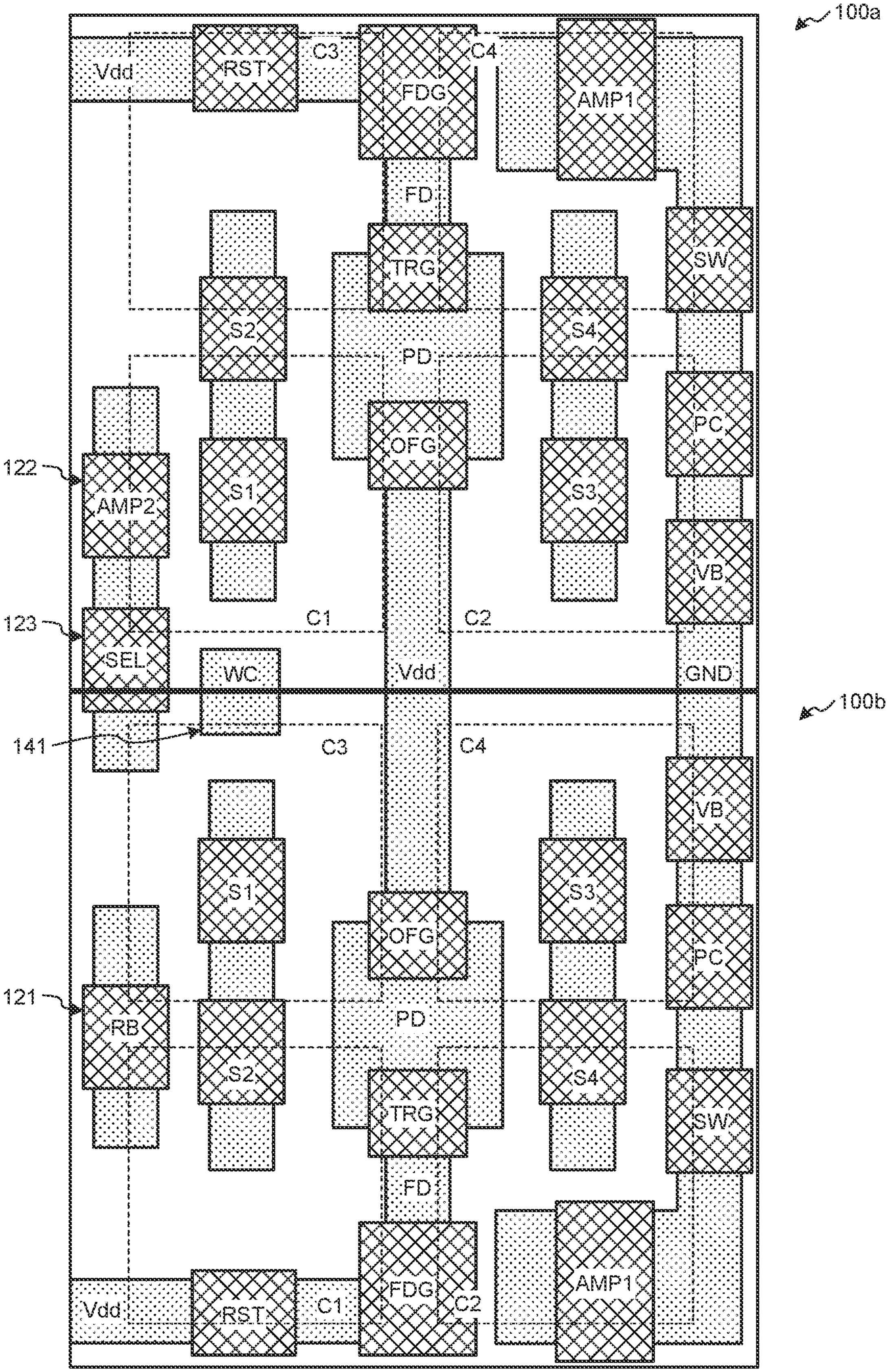
FIG. 13 is a plan view depicting another configuration example of the pixels according to the third embodiment of the present disclosure.

FIG. 13 is a plan view depicting another configuration example of the pixels according to the third embodiment of the present disclosure. The drawing is a plan view depicting a configuration example of the pixels 100 as in FIG. 12. The pixel 100 in the drawing is a diagram depicting an example of a case where the post-stage circuit 120 (the second reset unit 121, the second amplification unit 122, and the second selection unit 123) is shared by the two pixels 100, and is a diagram depicting a layout example of the pixel 100 having the same configuration as the circuit diagram in FIG. 11. The pixel 100*a* and the pixel 100*b* in the drawing represent an example of a case where the post-stage circuit 120, the well contact 107, the power supply line Vdd, and the ground line GND are shared. The second amplification unit 122 and the second selection unit 123 are disposed on a left side of the pixels 100*a* and 100*b* in the drawing. Further, the second reset unit 121 is disposed on the left side of the pixel 100*b* in the drawing.

The configuration of the photodetection device 1 other than this is similar to the configuration of the photodetection device 1 in the first embodiment of the present disclosure, and thus the description thereof will be omitted.

As described above, in the photodetection device 1 according to the third embodiment of the present disclosure, two adjacent pixels 100 share components. Thus, the configuration of the photodetection device 1 can be simplified.

4. Fourth Embodiment

In the pixels 100 according to the third embodiment described above, two pixels 100 share components. On the other hand, pixels 100 according to a fourth embodiment of the present disclosure are different from those of the above-described third embodiment in that components are shared by four pixels 100.

[Configuration of Pixel]

Figure 14:
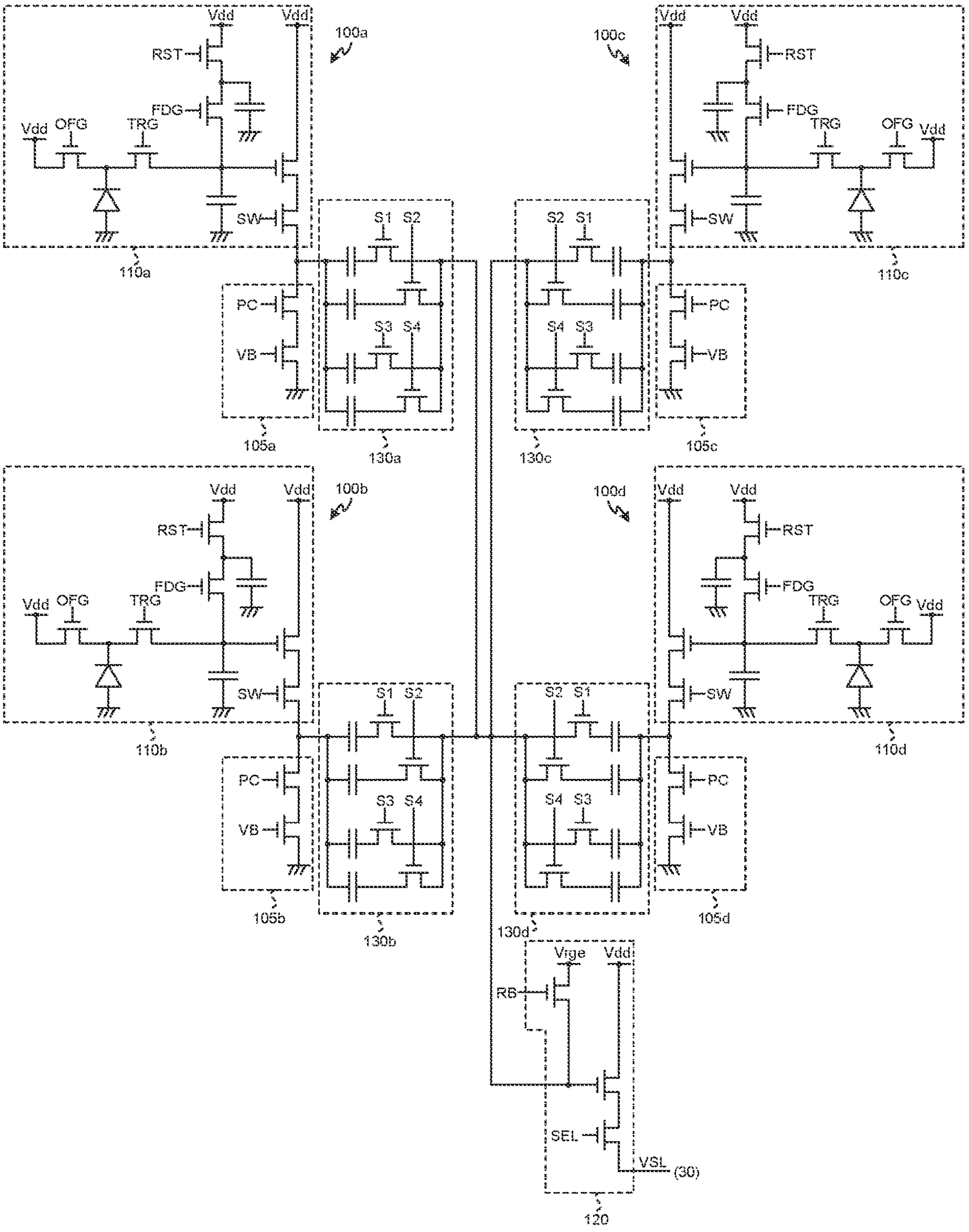
FIG. 14 is a diagram depicting a configuration example of pixels according to a fourth embodiment of the present disclosure.

FIG. 14 is a diagram depicting a configuration example of the pixels according to the fourth embodiment of the present disclosure. The drawing is a circuit diagram depicting a configuration example of the pixels 100 as in FIG. 11. The drawing is different from the pixel 100 in FIG. 11 in further including a pixel 100*c* and a pixel 100*d*.

The pixel 100*c* in the drawing includes a pre-stage circuit 110*c*, a constant current circuit 105*c*, and a signal level holding circuit 130*c*. The pixel 100*d* in the drawing includes a pre-stage circuit 110*d*, a constant current circuit 105*d*, and a signal level holding circuit 130*d*. Further, the pixel 100*a*, the pixel 100*b*, the pixel 100*c*, and the pixel 100*d* share one post-stage circuit 120. Specifically, the second output node 102 of each of the pixel 100*a*, the pixel 100*b*, the pixel 100*c*, and the pixel 100*d* is commonly connected to the post-stage circuit 120. As described above, the drawing depicts an example in which the post-stage circuit 120 is shared by the four pixels 100.

[Configuration of Plane of Pixel]

Figure 15:
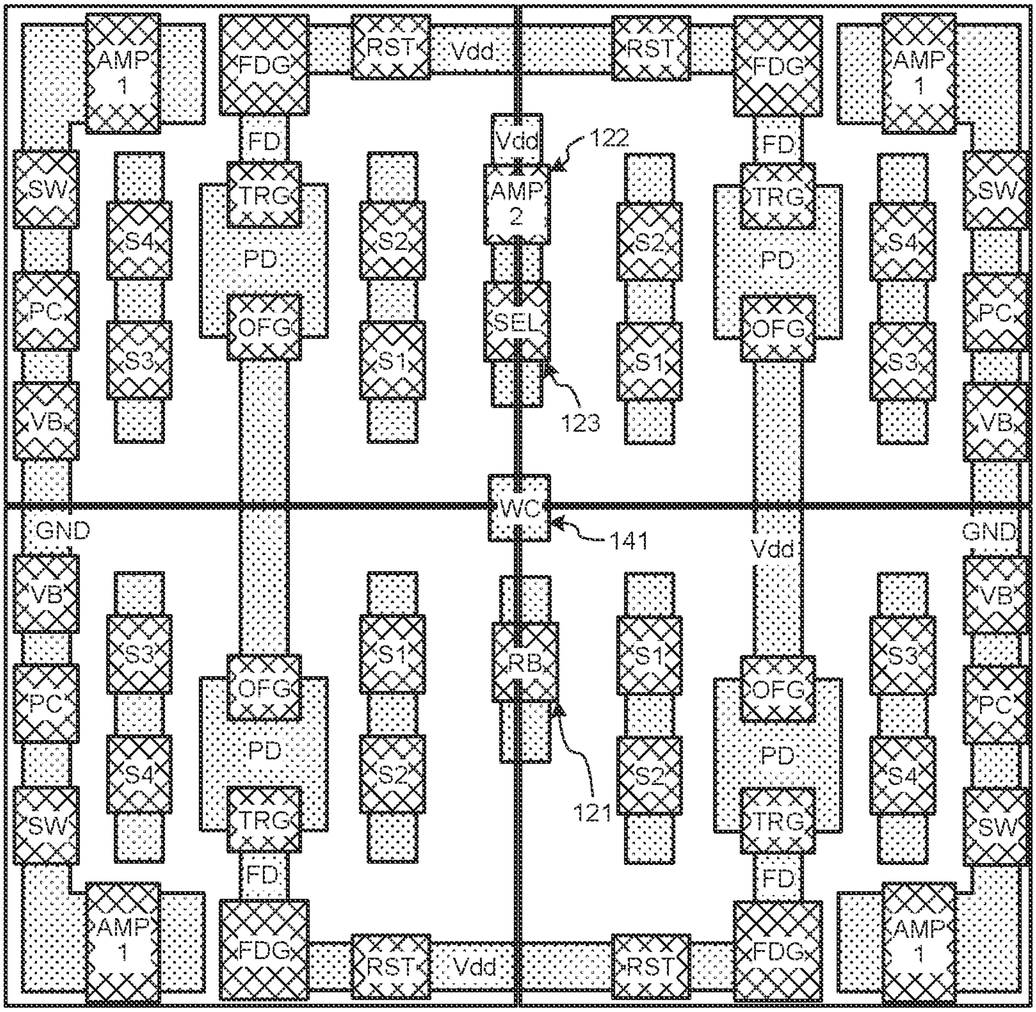
FIG. 15 is a plan view depicting a configuration example of pixels according to the fourth embodiment of the present disclosure.

FIG. 15 is a plan view depicting a configuration example of the pixels according to the fourth embodiment of the present disclosure. The drawing is a plan view depicting a configuration example of the pixels 100 as in FIG. 13. The pixel 100 in the drawing depicts an example in a case where the four pixels 100 share the post-stage circuit 120 (the second reset unit 121, the second amplification unit 122, and the second selection unit 123), the well contact 107, the power supply line Vdd, and the ground line GND.

The configuration of the photodetection device 1 other than this is similar to the configuration of the photodetection device 1 in the first embodiment of the present disclosure, and thus the description thereof will be omitted.

As described above, in the photodetection device 1 according to the fourth embodiment of the present disclosure, the four pixels 100 share components. Thus, the configuration of the photodetection device 1 can be further simplified.

5. Fifth Embodiment

The pixel 100 of the above-described first embodiment is disposed on the semiconductor substrate 150. On the other hand, a pixel 100 according to a fifth embodiment of the present disclosure is different from that of the above-described first embodiment in that the pixel is dispersedly disposed on a plurality of semiconductor substrates.

[Configuration of Pixel]

Figure 16:
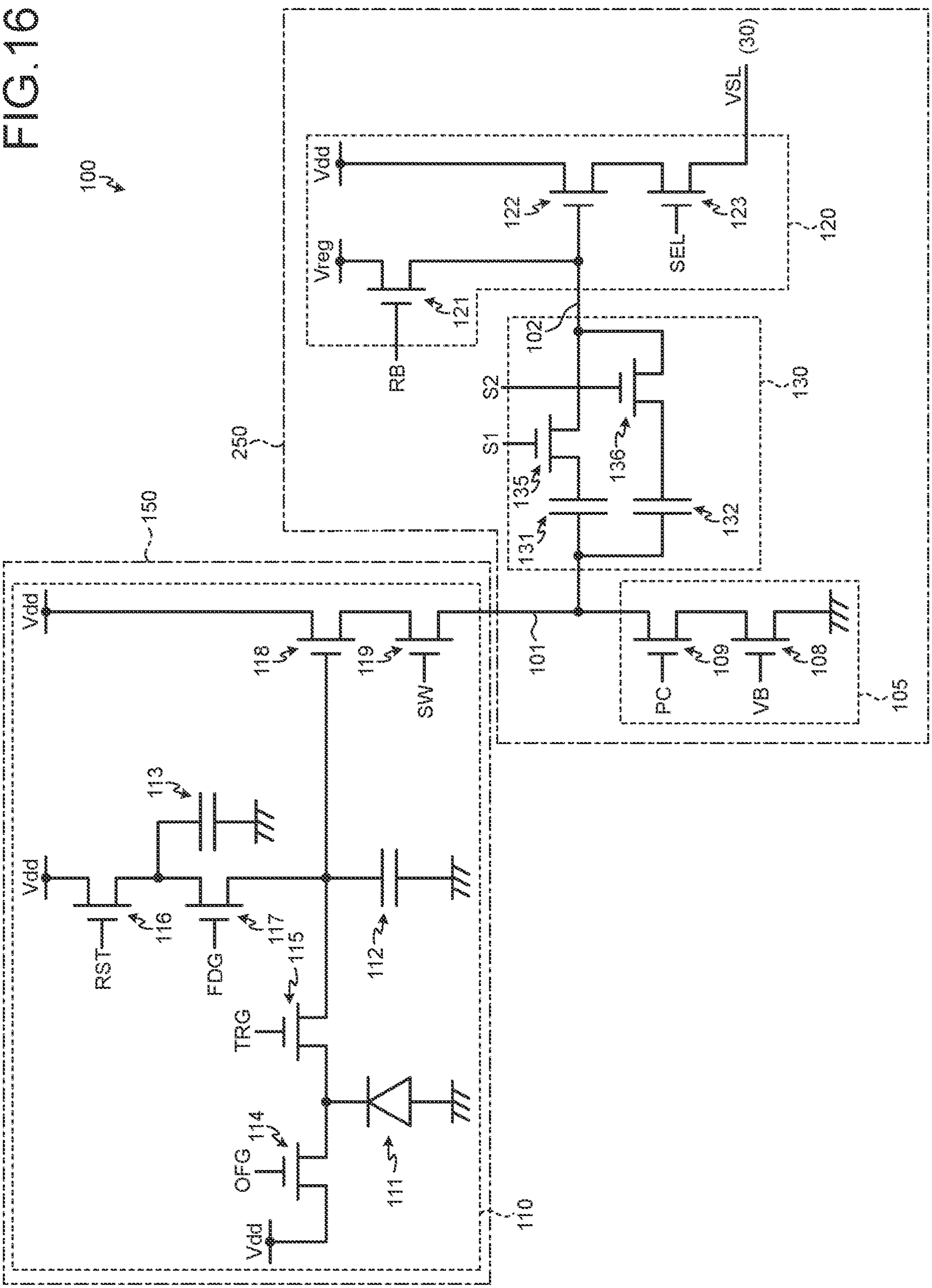
FIG. 16 is a diagram depicting a configuration example of a pixel according to a fifth embodiment of the present disclosure.

FIG. 16 is a diagram depicting a configuration example of a pixel according to the fifth embodiment of the present disclosure. The drawing is a circuit diagram depicting a configuration example of the pixel 100 as in FIG. 2. This drawing is different from the pixel 100 of FIG. 2 in that the pre-stage circuit 110, the constant current circuit 105, the signal level holding circuit 130, and the post-stage circuit 120 are disposed on different semiconductor substrates.

The pixel 100 in the drawing is divided into the semiconductor substrate 150 and a semiconductor substrate 250. As depicted in the drawing, the pre-stage circuit 110 is disposed on the semiconductor substrate 150. On the other hand, the constant current circuit 105, the signal level holding circuit 130, and the post-stage circuit 120 are disposed on the semiconductor substrate 250. In this manner, an example in which the pixel 100 in the drawing is divided into two by the first output node 101 is depicted.

[Configuration of Cross-Section of Pixel]

Figure 17:
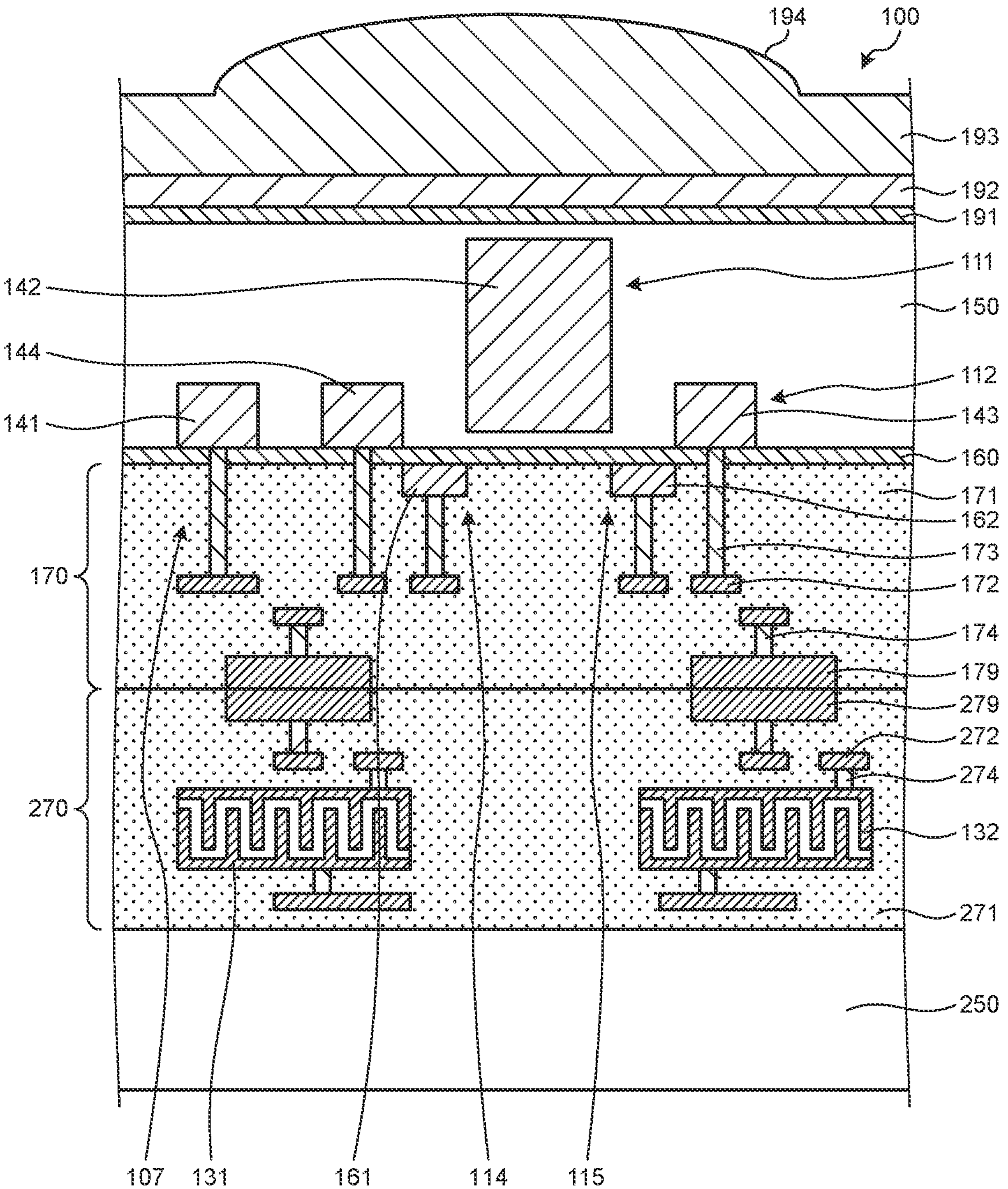
FIG. 17 is a cross-sectional view depicting a configuration example of the pixel according to the fifth embodiment of the present disclosure.

FIG. 17 is a cross-sectional view depicting a configuration example of the pixel according to the fifth embodiment of the present disclosure. The drawing is a cross-sectional view depicting a configuration example of the pixel 100 as in FIG. 3. The pixel 100 in the drawing is different from the pixel 100 in FIG. 3 in further including the semiconductor substrate 250 and a wiring region 270.

As is the semiconductor substrate 150, the semiconductor substrate 250 is a semiconductor substrate on which the diffusion layer of the element of the pixel 100 is disposed. On the semiconductor substrate 250 in the drawing, the constant current circuit 105, the signal level holding circuit 130, and the post-stage circuit 120 (not depicted) are disposed.

The wiring region 270 is a wiring region disposed on the front surface side of the semiconductor substrate 250. The wiring region 270 includes an insulating layer 271, a wiring 272, and a via plug 274. Further, the first capacitive element 131 and the second capacitive element 132 are disposed in the wiring region 270.

The pixel 100 in the drawing is configured by stacking the semiconductor substrate 150 and the semiconductor substrate 250. At the time of this stacking, the wiring region 170 of the semiconductor substrate 150 and the wiring region 270 of the semiconductor substrate 250 are joined. A pad 179 is disposed in the wiring region 170 in the drawing. Further, a pad 279 is disposed in the wiring region 270. The pad 179 and the pad 279 are joined and electrically connected. These pads 179 and 279 can include Cu. Such connection by Cu pads is referred to as CuCu connection.

[Another Configuration of Cross-Section of Pixel]

Figure 18:
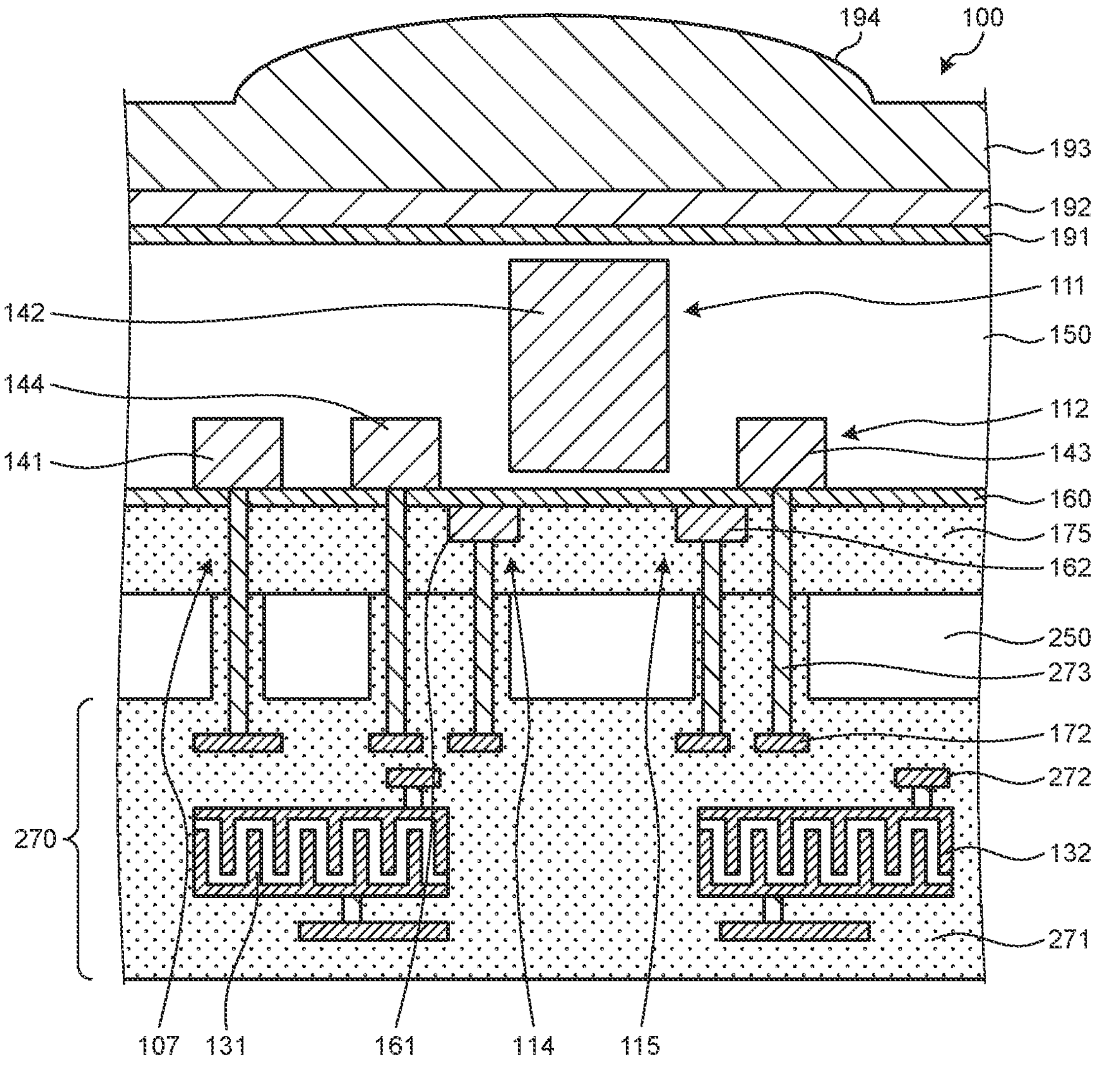
FIG. 18 is a cross-sectional view depicting another configuration example of the pixel according to the fifth embodiment of the present disclosure.

FIG. 18 is a cross-sectional view depicting another configuration example of the pixel according to the fifth embodiment of the present disclosure. The drawing is a cross-sectional view depicting a configuration example of the pixel 100 as in FIG. 17. The pixel 100 in the drawing is different from the pixel 100 in FIG. 17 in that the back surface side of the semiconductor substrate 250 is stacked on the front surface side of the semiconductor substrate 150.

On the front surface side of the semiconductor substrate 150, an interlayer film 175 is disposed instead of the wiring region 170. The interlayer film 175 can include, for example, $SiO_2$. The back surface side of the semiconductor substrate 250 is stacked via the interlayer film 175. The wiring region 270 is disposed on the front surface side of the semiconductor substrate 250. The first capacitive element 131 and the second capacitive element 132 are disposed in the wiring region 270.

The semiconductor region or the gate of the semiconductor substrate 150 and the wiring 272 of the wiring region 270 can be connected by a through via 273. The through via 273 is a via plug disposed in a through hole formed in the semiconductor substrate 250. On the semiconductor substrate 250 in the drawing, the constant current circuit 105, the signal level holding circuit 130, and the post-stage circuit 120 (not depicted) are disposed.

As described above, the pixel 100 according to the fifth embodiment of the present disclosure can employ either of the configurations in FIGS. 17 and 18. Hereinafter, the pixel 100 having the configuration of FIG. 18 is assumed. Note that the semiconductor substrate 250 is an example of a second semiconductor substrate described in the claims.

[Configuration of Plane of Pixel]

Figure 19A:
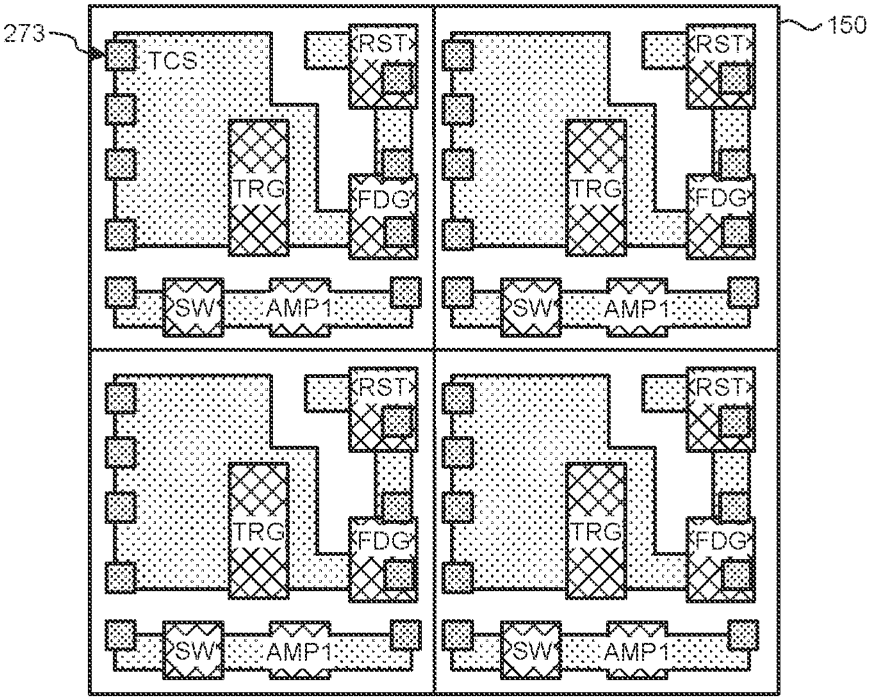
FIG. 19A is a plan view depicting a configuration example of pixels according to the fifth embodiment of the present disclosure.
Figure 19B:
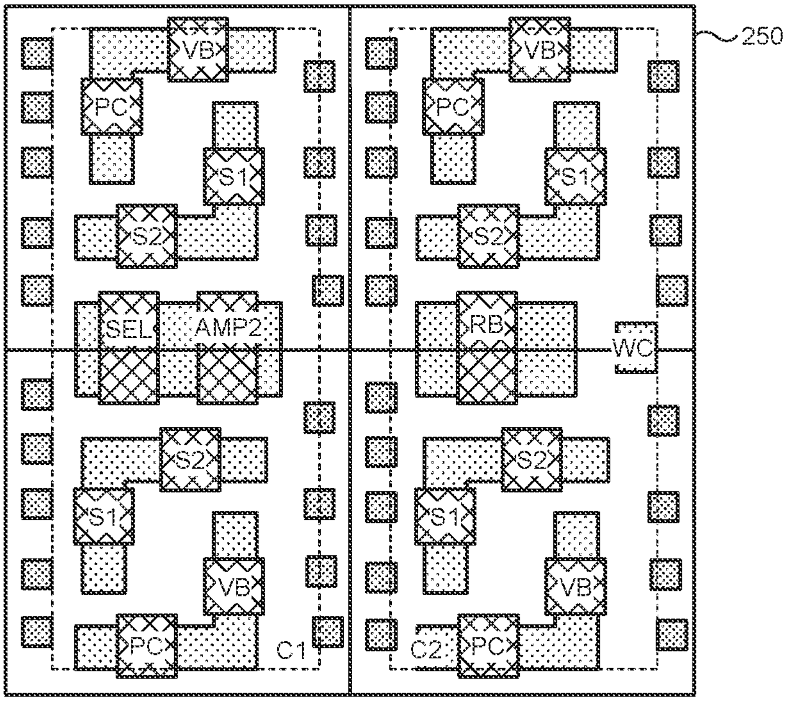
FIG. 19B is a plan view depicting a configuration example of the pixels according to the fifth embodiment of the present disclosure.

FIGS. 19A and 19B are plan views depicting configuration examples of pixels according to the fifth embodiment of the present disclosure. FIGS. 19A and 19B assume an example in which the post-stage circuit 120 is shared by the four pixels 100 described in FIG. 14. Further, FIGS. 19A and 19B depict arrangement examples in a case where the charge discharge unit 114 is omitted. FIG. 19A depicts a configuration example of the semiconductor substrate 150, and FIG. 19B depicts a configuration example of the semiconductor substrate 250. Note that a square region in FIGS. 19A and 19B represents a through via 273.

In FIG. 19A, as described above, the pre-stage circuit 110 of each of the four pixels 100 is disposed on the semiconductor substrate 150. They can be disposed identically. The arrangement will be described using the lower left pixel 100 in FIG. 19A as an example. The charge transfer unit 115 (TRG) is disposed at the center of the pixel 100. The photoelectric conversion unit 111 is disposed on a left side thereof. The charge holding unit 112 and the coupling unit 117 (FDG) are disposed on a right side of the charge transfer unit 115 (TRG). The first reset unit 116 (RST) is disposed on an upper side of the coupling unit 117 (FDG). The first selection unit 119 (SW) and the amplification unit 118 (AMP1) are disposed on a lower side of the pixel 100. Note that a well contact (not depicted) is disposed on the semiconductor substrate 150 in the drawing.

In FIG. 19B, the constant current circuit 105, the signal level holding circuit 130, and the post-stage circuit 120 are disposed on the semiconductor substrate 250. Among them, the post-stage circuit 120 is shared by the four pixels 100. The four pixels 100 of the semiconductor substrate 250 can be disposed symmetrically up and down. In the pixels 100 on an upper side in the drawing, the MOS transistor 108 (VB) is disposed on an upper side, and the MOS transistor 109 (PC) is disposed on a left side. The second switch element 136 (S2) is disposed on a lower side of the pixel 100, and the first switch element 135 is disposed on a right side. In the pixels 100 on a lower side in the drawing, the components of the upper pixels 100 can be disposed vertically symmetrically.

The well contact 107 (WC), the second reset unit 121 (RB), the second amplification unit 122 (AMP2), and the second selection unit 123 (SEL) are disposed at the centers of the upper and lower pixels 100. In this manner, the post-stage circuit 120 shared by the four pixels 100 is disposed at the center of the second semiconductor substrate, and the MOS transistors 109 (PC) and the like disposed in the respective pixels 100 are symmetrically disposed in the upper and lower pixels 100. Thus, the layout can be simplified.

Further, as depicted in FIG. 19A, by forming each pixel 100 in the semiconductor substrate 150 in a square shape in plan view and arranging each MOS transistor in the same direction, it is possible to improve the periodicity of the pixels 100 arranged consecutively. Even in a case where incident light is obliquely incident, the sensitivity of each pixel 100 can be equalized.

[Other Configurations of Plane of Pixel]

Figure 20A:
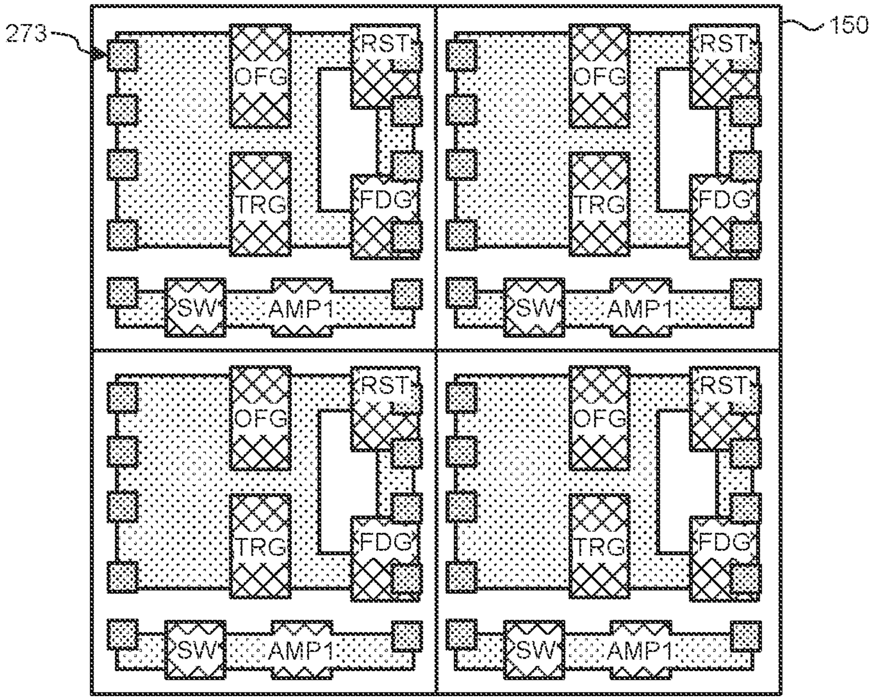
FIG. 20A is a plan view depicting another configuration example of the pixels according to the fifth embodiment of the present disclosure.
Figure 20B:
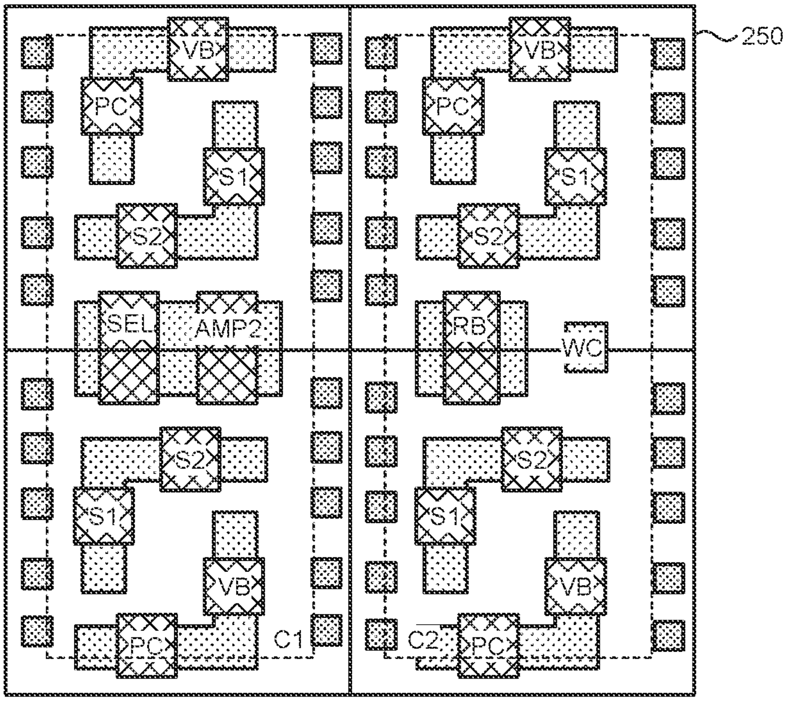
FIG. 20B is a plan view depicting another configuration example of the pixels according to the fifth embodiment of the present disclosure.

FIGS. 20A and 20B are plan views depicting other configuration examples of the pixels according to the fifth embodiment of the present disclosure. FIGS. 20A and 20B depict arrangement examples in a case where the charge discharge unit 114 is provided. The arrangement will be described using the lower left pixel 100 in FIG. 20A as an example. The charge discharge unit 114 (OFG) is disposed on an upper side of the charge transfer unit 115 (TRG) in the central portion of the pixel 100. The semiconductor region to which the power supply line Vdd is connected and the first reset unit 116 (RST) are sequentially disposed adjacent to a right side of the charge discharge unit 114. Other than this, the arrangement can be similar to that in FIG. 19A. Further, the configuration of the semiconductor substrate 250 in FIG. 20B can be arranged as in FIG. 19B.

[Other Configurations of Plane of Pixel]

Figure 21A:
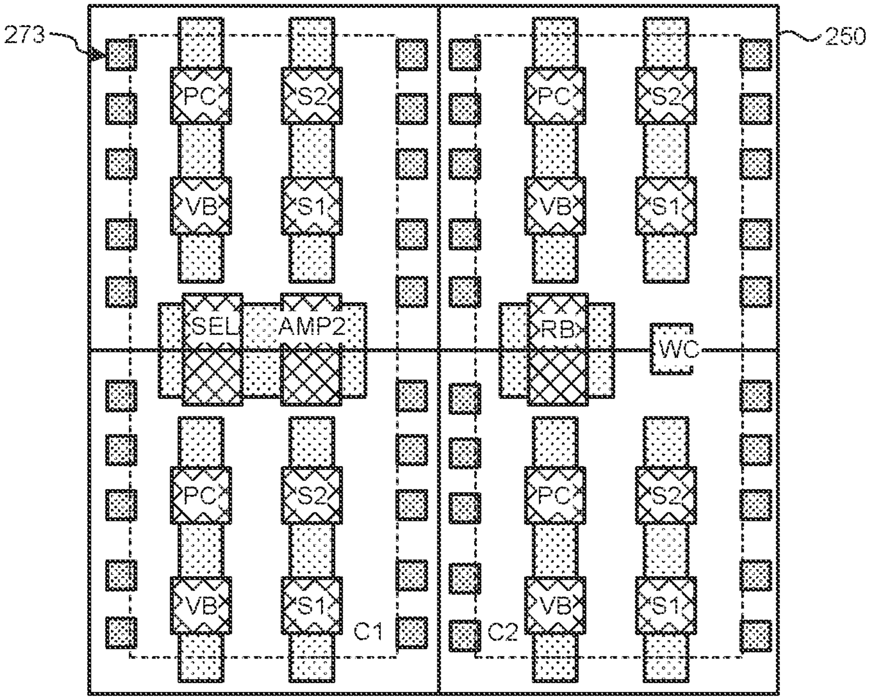
FIG. 21A is a plan view depicting another configuration example of the pixels according to the fifth embodiment of the present disclosure.
Figure 21B:
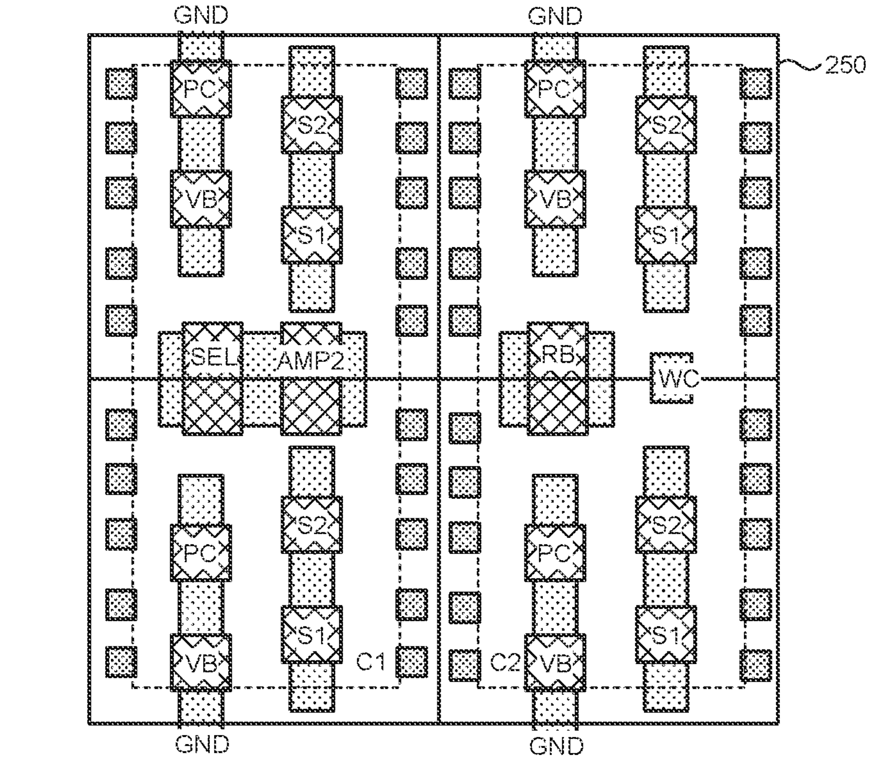
FIG. 21B is a plan view depicting another configuration example of the pixels according to the fifth embodiment of the present disclosure.

FIGS. 21A and 21B are plan views depicting other configuration examples of the pixels according to the fifth embodiment of the present disclosure. FIGS. 21A and 21B depict variations of arrangement examples in the semiconductor substrate 250.

In FIG. 21A, the MOS transistor 109 (PC) and the MOS transistor 108 (VB), and the second switch element 136 (S2) and the first switch element 135 (S1) are arranged in parallel.

In FIG. 21B, the semiconductor region to which the ground line GND of the MOS transistor 108 (VB) is connected is shared by the vertically adjacent pixels 100.

[Other Configurations of Plane of Pixel]

Figure 22A:
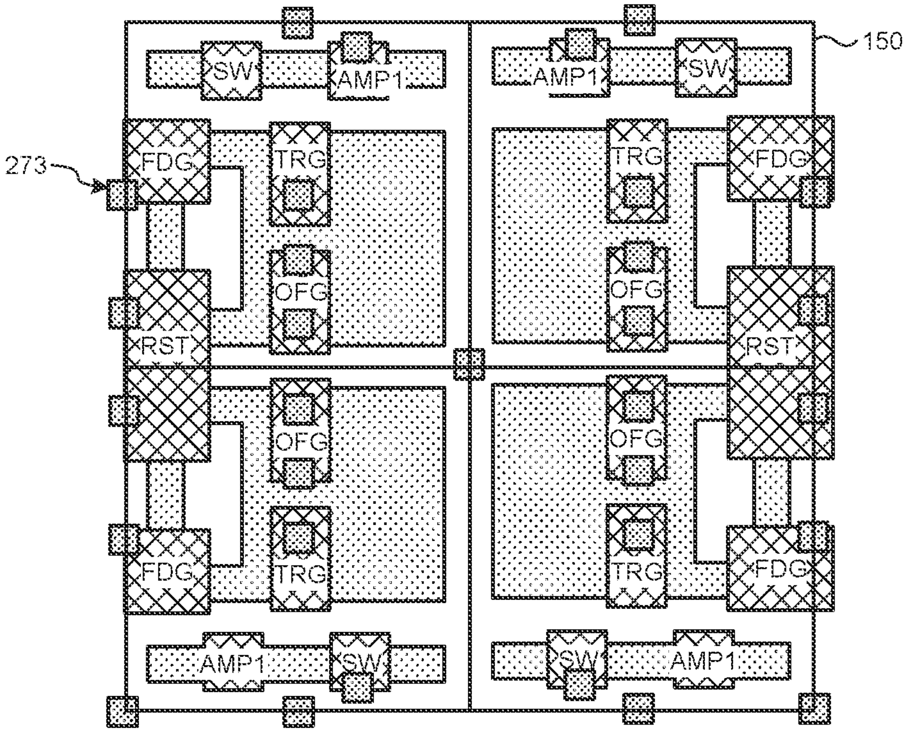
FIG. 22A is a plan view depicting another configuration example of the pixels according to the fifth embodiment of the present disclosure.
Figure 22B:
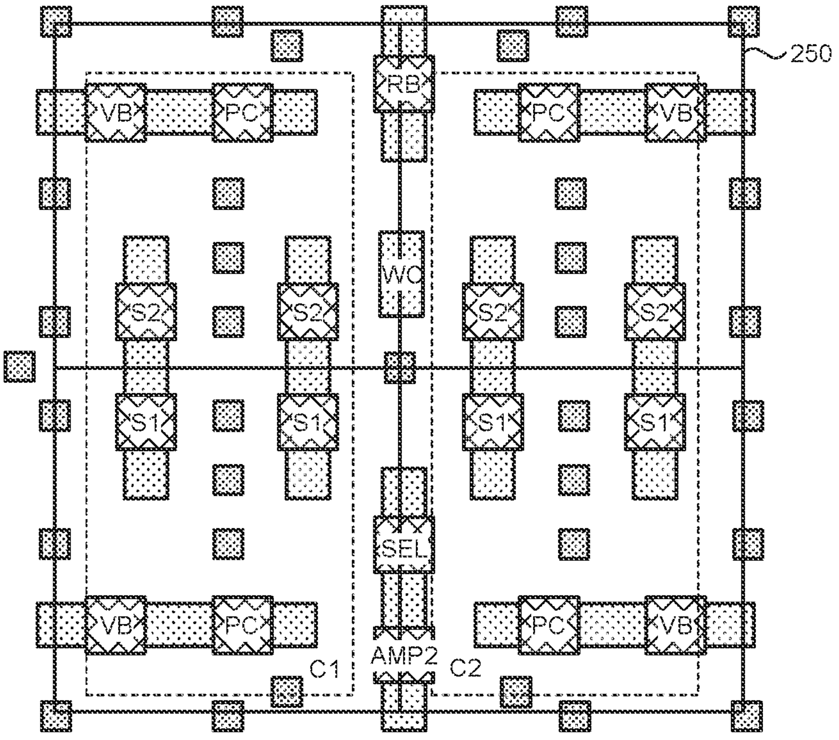
FIG. 22B is a plan view depicting another configuration example of the pixels according to the fifth embodiment of the present disclosure.

FIGS. 22A and 22B are plan views depicting other configuration examples of the pixels according to the fifth embodiment of the present disclosure.

In FIG. 22A, upper and lower pixels 100 share the first reset unit 116 (RST). Thus, the through vias 273 can be reduced.

In FIG. 22B, the MOS transistor 108 (VB), the MOS transistor 109 (PC), the first switch element 135 (S1), and the second switch element 136 (S2) are disposed symmetrically in the four pixels 100. Further, a semiconductor region to which the ground line GND of the MOS transistor 108 (VB) is connected is shared by the pixels 100 adjacent to each other on the left and right. Furthermore, the semiconductor region to which the power supply line Vdd in the second reset unit 121 (RB) and the second amplification unit 122 (AMP2) is connected is shared by the upper and lower pixels 100.

[Other Configurations of Plane of Pixel]

Figure 23:
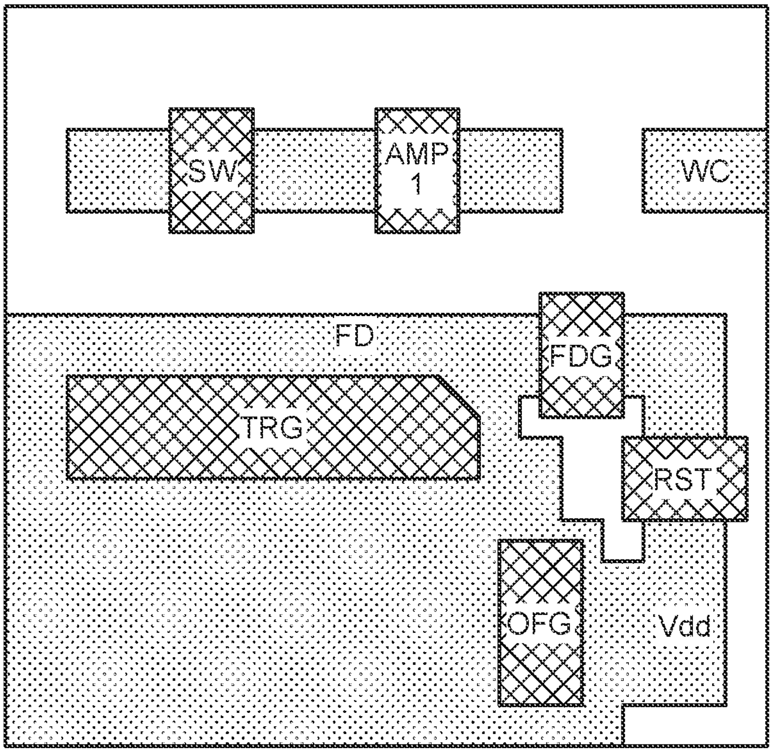
FIG. 23 is a plan view depicting another configuration example of the pixels according to the fifth embodiment of the present disclosure.

FIG. 23 is a plan view depicting another configuration example of the pixels according to the fifth embodiment of the present disclosure. The drawing depicts an arrangement example of the pixels 100 in the semiconductor substrate 150. The charge holding unit 112 (FD) is disposed on an upper side of the charge transfer unit 115 (TRG). The coupling unit 117 (FDG) is disposed on a right side of the charge holding unit 112 (FD). Thus, the charge transfer unit 115 (TRG), the charge holding unit 112 (FD), and the coupling unit 117 (FDG) can share a diffusion layer. Further, the amplification unit 118 (AMP1) is disposed in a normal direction of a line connecting the charge holding unit 112 (FD) and the coupling unit 117 (FDG). Thus, the connection distance between the charge holding unit 112 (FD) and the amplification unit 118 (AMP1) can be shortened.

The configuration of the photodetection device 1 other than this is similar to the configuration of the photodetection device 1 in the first embodiment of the present disclosure, and thus the description thereof will be omitted.

As described above, by arranging the pixels 100 on the semiconductor substrate 150 and the semiconductor substrate 250 that are stacked, the sizes of the pixels 100 can be reduced.

6. Sixth Embodiment

The pixel 100 according to the first embodiment described above uses the first capacitive element 131 and the second capacitive element 132. On the other hand, a pixel 100 according to a sixth embodiment of the present disclosure is different from the above-described first embodiment in that a MOS transistor is disposed between two capacitive elements and the first output node 101.

[Configuration of Pixel]

Figure 24:
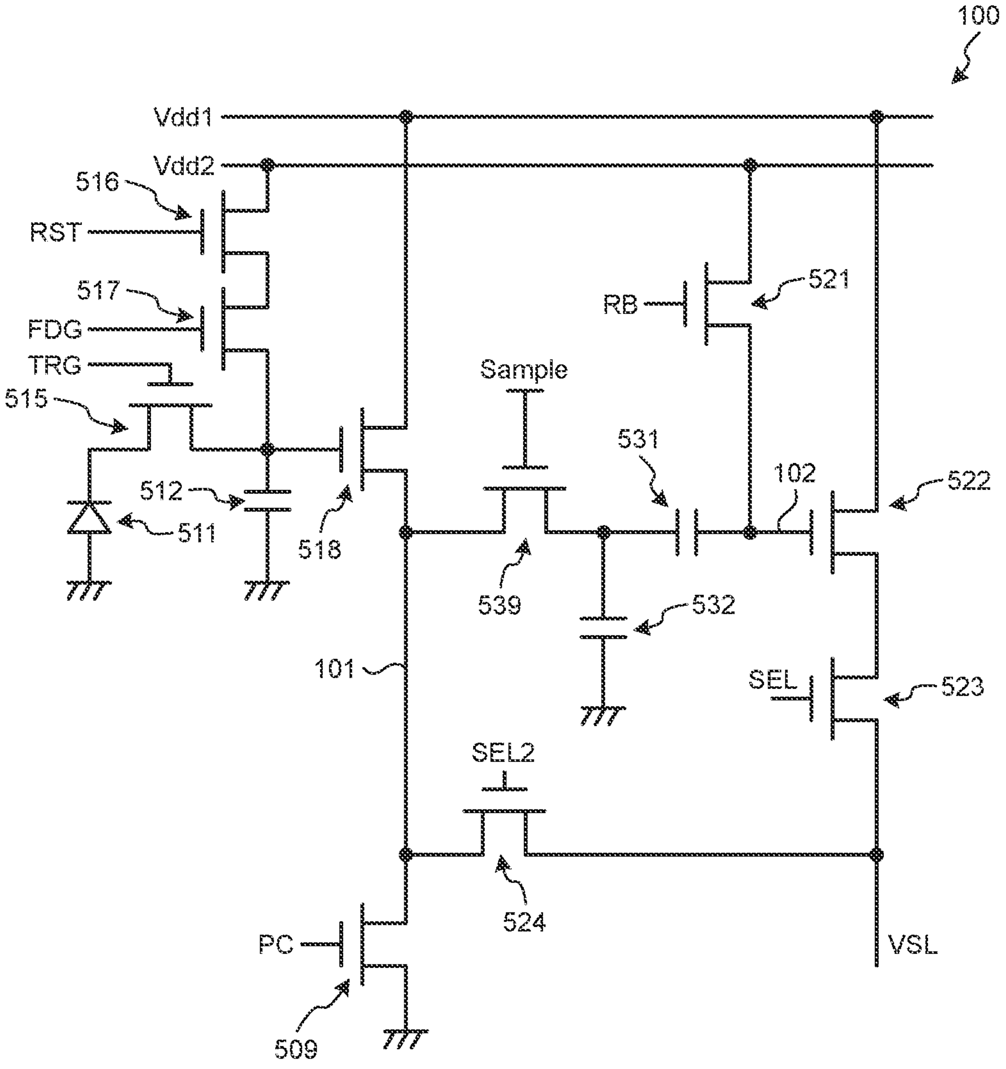
FIG. 24 is a diagram depicting a configuration example of a pixel according to a sixth embodiment of the present disclosure.

FIG. 24 is a diagram depicting a configuration example of the pixel according to the sixth embodiment of the present disclosure. The drawing is a circuit diagram depicting a configuration example of the pixel 100 as in FIG. 2. The pixel 100 in the drawing includes a photoelectric conversion unit 511, a charge holding unit 512, a charge transfer unit 515, a first reset unit 516, a coupling unit 517, an amplification unit 518, a MOS transistor 509, a second amplification unit 522, and a selection unit 523. Further, the pixel 100 in the drawing further includes a sampling unit 539, a first capacitive element 531, a second capacitive element 532, and a second selection unit 524. Note that a second charge holding unit (corresponding to the second charge holding unit 113 in FIG. 2) (not depicted) is disposed between the first reset unit 516 and the coupling unit 517.

The photoelectric conversion unit 511, the charge holding unit 512, the charge transfer unit 515, the first reset unit 516, and the coupling unit 517 are similar to the photoelectric conversion unit 111, the charge holding unit 112, the charge transfer unit 115, the first reset unit 116, and the coupling unit 117 in FIG. 2, and thus the description thereof will be omitted. Further, the amplification unit 518, the MOS transistor 509, the second reset unit 521, the second amplification unit 522, and the selection unit 523 are similar to the amplification unit 118, the MOS transistor 109, the second reset unit 121, the second amplification unit 122, and the second selection unit 123 in FIG. 2, and thus the description thereof will be omitted.

The sampling unit 539 opens and closes between the first capacitive element 531 and the second capacitive element 532, and a source of the amplification unit 518. The first capacitive element 531 is connected between the sampling unit 539 and the second amplification unit 522. The second capacitive element 532 is connected between a source of the sampling unit 539 and the ground line. Further, the second selection unit 524 is connected between the source of the amplification unit 518 and the output signal line VSL. In the circuit of the drawing, a node connected to the source of the amplification unit 518 corresponds to the first output node 101, and a node between the second capacitive element 532 and a gate of the second amplification unit 522 corresponds to the second output node 102. Note that the sampling unit 539 is an example of a capturing unit described in the claims.

[Configuration of Plane of Pixel]

Figure 25A:
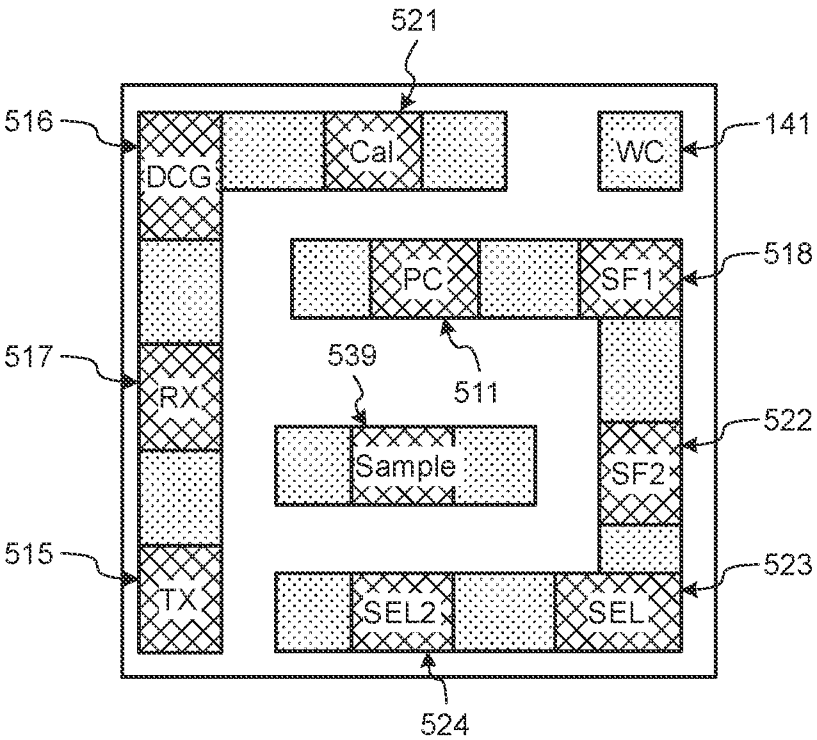
FIG. 25A is a plan view depicting a configuration example of the pixel according to the sixth embodiment of the present disclosure.
Figure 25B:
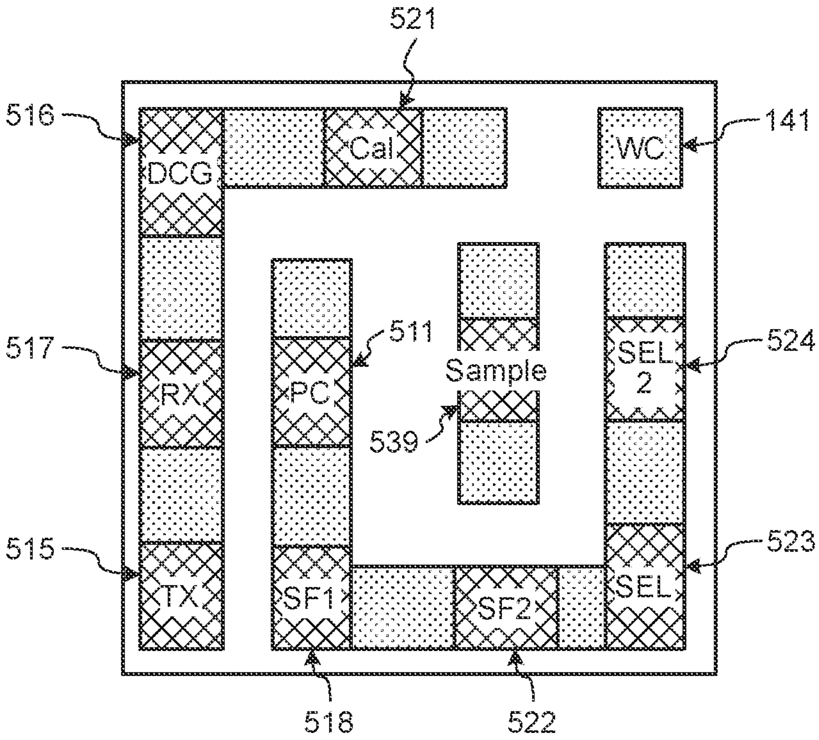
FIG. 25B is a plan view depicting a configuration example of the pixel according to the sixth embodiment of the present disclosure.

FIGS. 25A and 25B are plan views depicting configuration examples of the pixel according to the sixth embodiment of the present disclosure. FIGS. 25A and 25B are plan views depicting configuration examples of the pixel 100 as in FIG. 5.

In FIG. 25A, the semiconductor region 141 in which the well contact 107 is disposed is disposed at the upper right of the pixel 100. The second reset unit 521 (Cal) and the coupling unit 517 (DCG) are sequentially disposed on the left side of the semiconductor region 141. The coupling unit 517 (RX) and the charge transfer unit 515 (TX) are sequentially disposed on a lower side of the coupling unit 517 (DCG). The amplification unit 518 (SF1) is disposed on a lower side of the semiconductor region 141. The MOS transistor 509 (PC) is disposed on a left side thereof. Further, the second amplification unit 522 (SF2) and the selection unit 523 (SEL) are sequentially disposed on a lower side of the amplification unit 518 (SF1). The second selection unit 524 (SEL2) is disposed on a left side of the selection unit 523 (SEL). The sampling unit 539 (sample) is disposed at the center of the pixel 100.

In FIG. 25B, the second selection unit 524 (SEL2) and the selection unit 523 (SEL) are sequentially disposed below the semiconductor region 141. The second amplification unit 522 (SF2) and the amplification unit 518 (SF1) are disposed in this order on the left side of the selection unit 523 (SEL). The MOS transistor 509 (PC) is disposed on an upper side of the amplification unit 518 (SF1). The sampling unit 539 (sample) is disposed in a region between the MOS transistor 509 (PC) and the second selection unit 524 (SEL2).

In any of FIGS. 25A and 25B, the pixel 100 can be configured in a square shape. Further, the second reset unit 521 (Cal) and the coupling unit 517 (DCG) can share the diffusion layer. Furthermore, the amplification unit 518 (SF1) and the second amplification unit 522 (SF2) can share a diffusion layer. Further, the selection unit 523 (SEL) and the second selection unit 524 (SEL2) can share the diffusion layer.

Note that the configuration of the pixel 100 is not limited to this example. For example, a charge discharge unit that discharges the charge of the photoelectric conversion unit 511 can be disposed. The charge discharge unit can employ a configuration similar to that of the charge discharge unit 114 in FIG. 2.

7. Seventh Embodiment

In the above-described embodiment, the configuration of the pixel 100 has been described. On the other hand, in a seventh embodiment of the present disclosure, a configuration of the photodetection device 1 will be described.

[Configuration of Imaging Element]

Figure 26A:
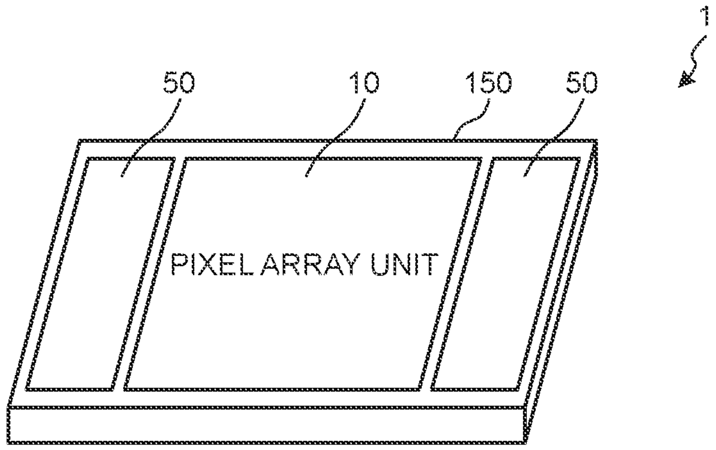
FIG. 26A is a diagram depicting a configuration example of an imaging element according to a seventh embodiment of the present disclosure.
Figure 26B:
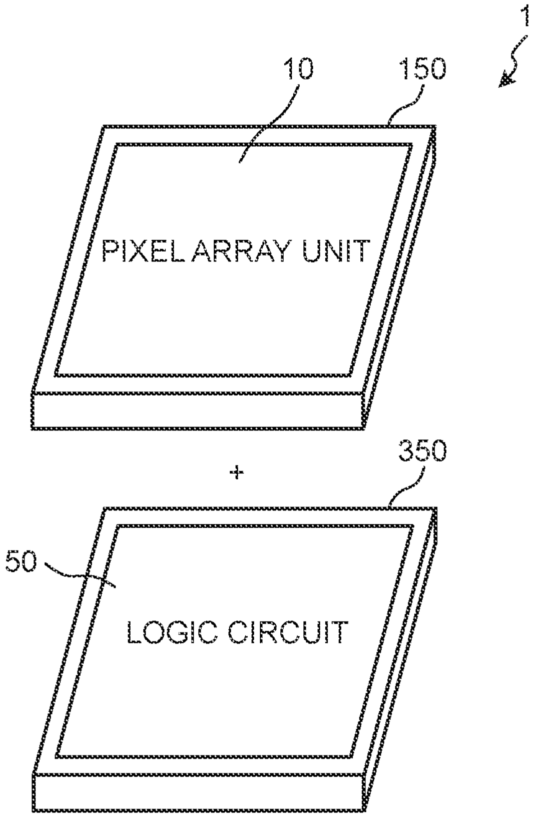
FIG. 26B is a diagram depicting a configuration example of an imaging element according to the seventh embodiment of the present disclosure.

FIGS. 26A and 26B are diagrams depicting a configuration example of an imaging element according to the seventh embodiment of the present disclosure. FIGS. 26A and 26B are diagrams depicting a substrate configuration of the photodetection device 1.

FIG. 26A is a diagram depicting an example in a case where the photodetection device 1 is formed on the semiconductor substrate 150. Specifically, it is a diagram depicting an example in a case where the pixel array unit 10 described in FIG. 1 and a logic circuit 50 are formed on the semiconductor substrate 150. Here, the logic circuit 50 is a circuit including the vertical drive unit 20, the column signal processing unit 30, and the control unit 40 in FIG. 1. The imaging element in FIG. 26A represents an example in which the pixel array unit 10 is disposed at the center of the semiconductor substrate 150 and the logic circuit 50 is disposed in a region outside the pixel array unit 10.

FIG. 26B is a diagram depicting an example of the photodetection device 1 including two stacked semiconductor substrates. The photodetection device 1 in the drawing is configured by stacking the semiconductor substrate 150 on which the pixel array unit 10 is formed and a semiconductor substrate 350 on which the logic circuit 50 is formed.

In this manner, the pixel array unit 10 in FIGS. 26A and 26B is formed on the single semiconductor substrate 150. In the pixel array unit 10, the pixels 100 described in FIGS. 2 and 3 are disposed.

[Configuration of Cross-Section of Imaging Element]

Figure 27:
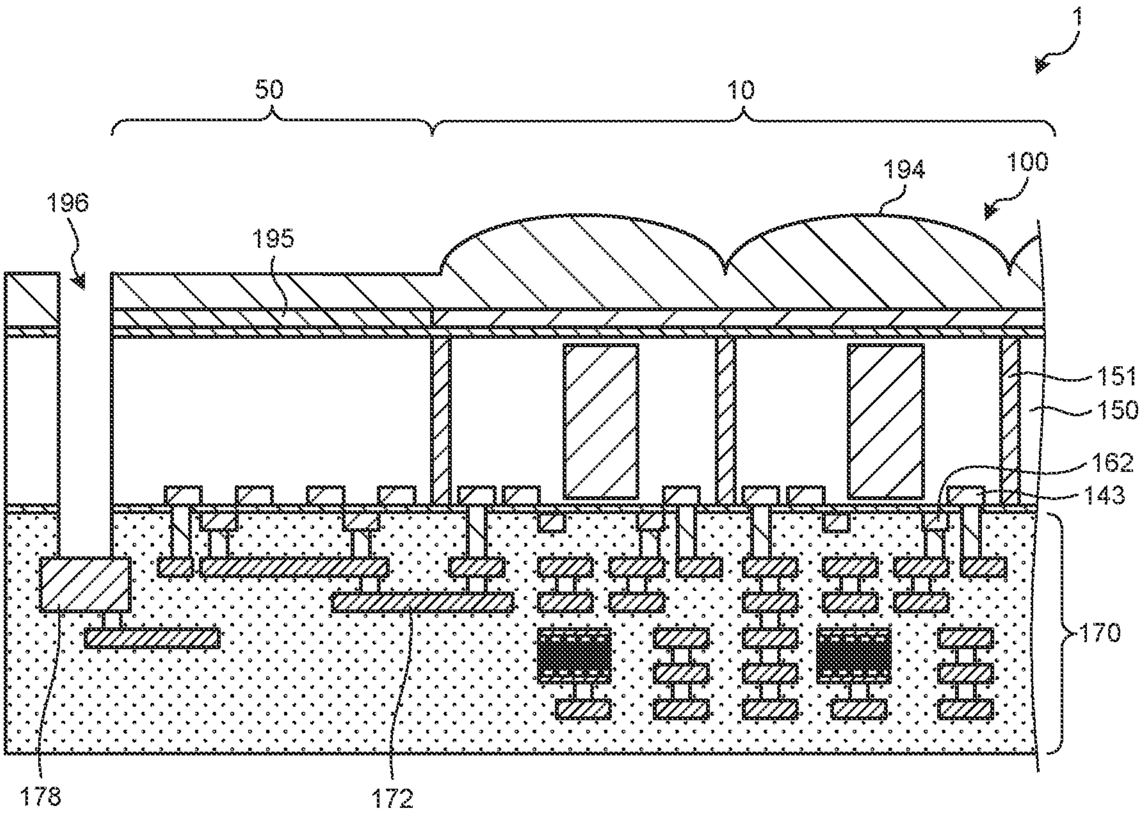
FIG. 27 is a cross-sectional view depicting a configuration example of an imaging element according to the seventh embodiment of the present disclosure.

FIG. 27 is a cross-sectional view depicting a configuration example of an imaging element according to the seventh embodiment of the present disclosure. The drawing is a cross-sectional view depicting a configuration example of the photodetection device 1, and is a view depicting an example in a case of the photodetection device 1 of FIG. 26A.

A separation unit 151 is disposed on the semiconductor substrate 150 at a boundary of the pixel 100 in the drawing. The separation unit 151 electrically and optically separates the pixel 100. The separation unit 151 can include, for example, an insulator embedded in the semiconductor substrate 150. The configuration of the pixel 100 other than this is similar to that in FIG. 3, and thus the description thereof will be omitted. Note that, in this drawing, the description of reference numerals of parts common to FIG. 3 such as the semiconductor region 142 and the wirings 172 is omitted.

The logic circuit 50 is disposed adjacent to the pixel array unit 10. In the semiconductor substrate 150 in the region of the logic circuit 50, elements such as MOS transistors constituting the logic circuit 50 are formed. Further, in the wiring region 170 in the region of the logic circuit 50, the wirings 172 and the like connected to the MOS transistor of the logic circuit 50 are disposed. Further, a light shielding film 195 is disposed instead of the color filter 192 on the back surface side of the semiconductor substrate 150 in the region of the logic circuit 50.

An opening 196 for wire bonding is disposed at an end of the semiconductor substrate 150. The opening 196 is formed in a shape extending from the back surface side of the semiconductor substrate 150 to the wiring region 170. A pad 178 for wire bonding is disposed at the bottom of the opening 196.

[Another Configuration of Cross-Section of Imaging Element]

Figure 28:
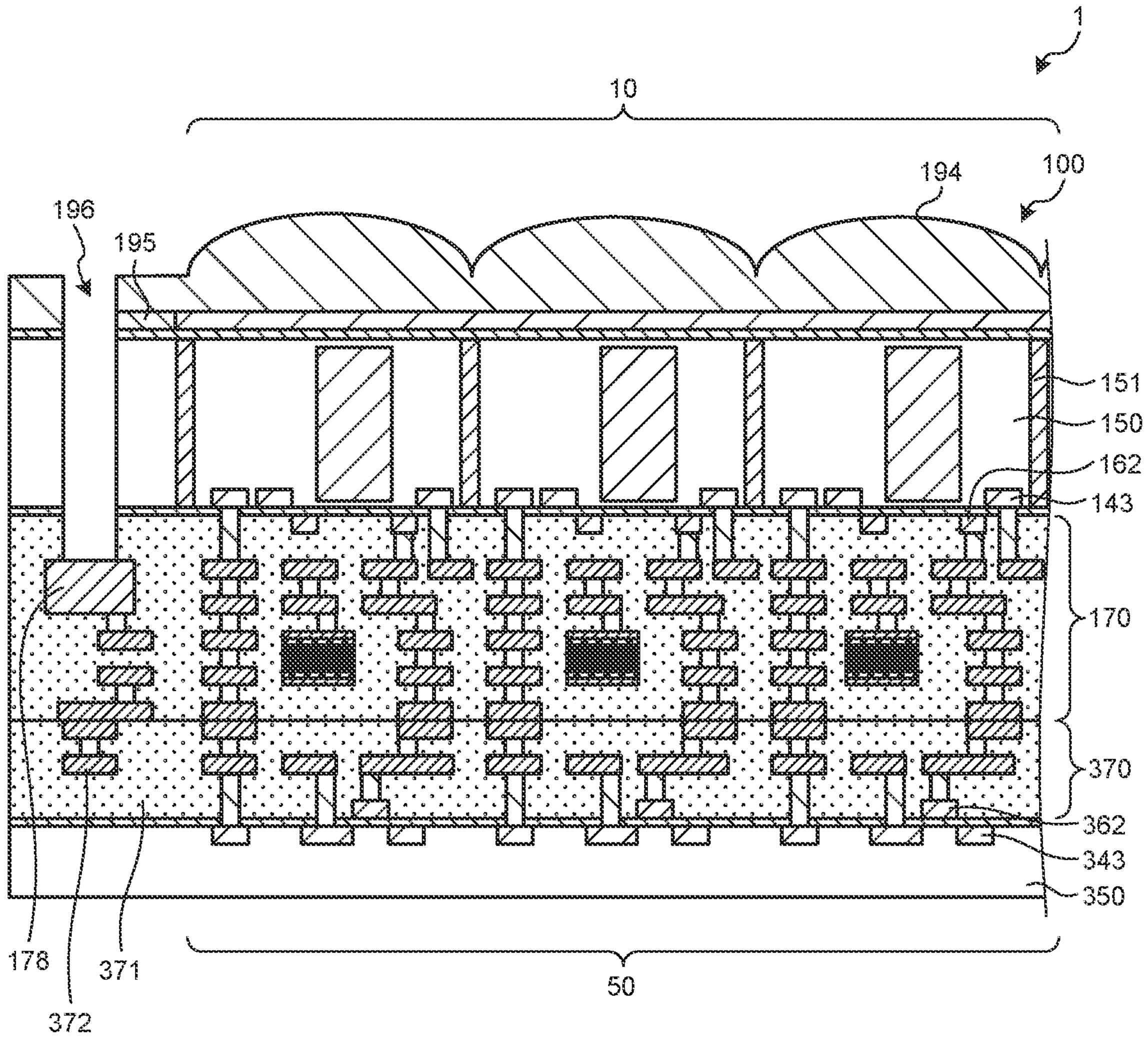
FIG. 28 is a cross-sectional view depicting another configuration example of the imaging element according to the seventh embodiment of the present disclosure.

FIG. 28 is a cross-sectional view depicting another configuration example of the imaging element according to the seventh embodiment of the present disclosure. The drawing is a cross-sectional view depicting a configuration example of the photodetection device 1, and is a view depicting an example in a case of the photodetection device 1 of FIG. 26B.

On the semiconductor substrate 350 in the drawing, elements such as MOS transistors constituting the logic circuit 50 are formed. As does the MOS transistor of the semiconductor substrate 150, the MOS transistor includes a semiconductor region 343 and a gate 362 formed in the semiconductor substrate 350. Further, in a wiring region 370 disposed on the semiconductor substrate 350, an insulating layer 371, a wiring 372 connected to the MOS transistor of the logic circuit 50, and the like are disposed. As depicted in the drawing, the wiring region 170 of the semiconductor substrate 150 and the wiring region 370 of the semiconductor substrate 350 are joined, and two semiconductor substrates 150 and 350 are stacked. The CuCu connection described in FIG. 17 can be used to connect wiring layers of the wiring region 170 and the wiring region 370. Further, the reference potentials of the semiconductor substrate 350 and the semiconductor substrate 150 can be transmitted to each other via the CuCu connection.

[Another Configuration of Imaging Element]

Figure 29:
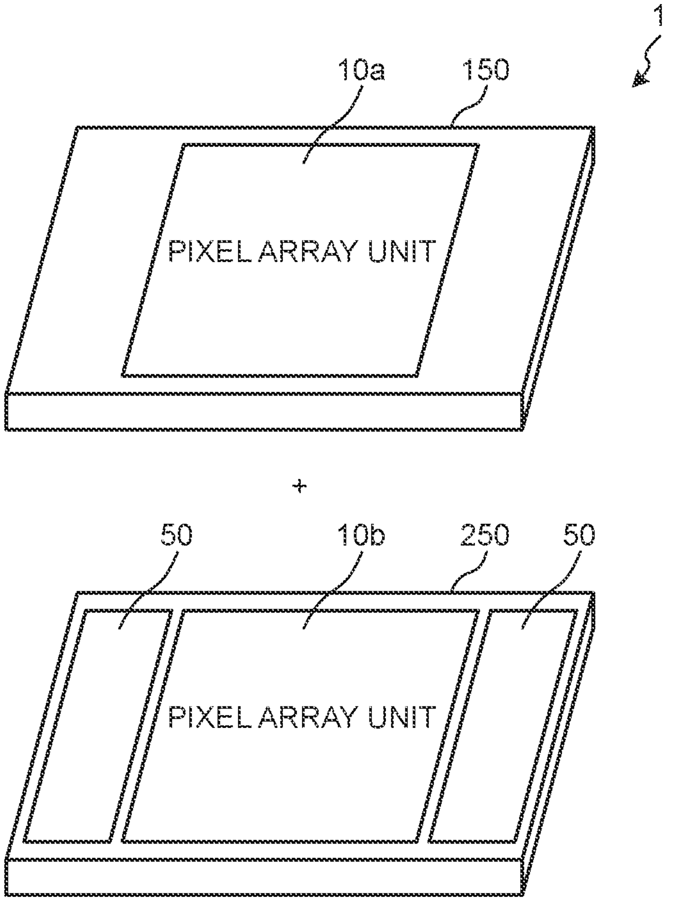
FIG. 29 is a diagram depicting another configuration example of the imaging element according to the seventh embodiment of the present disclosure.

FIG. 29 is a diagram depicting another configuration example of the imaging element according to the seventh embodiment of the present disclosure. As in FIGS. 26A and 26B, the drawing is a diagram for describing a substrate configuration of the photodetection device 1. The photodetection device 1 in the drawing is different from the photodetection device 1 in FIGS. 26A and 26B in that the pixel array unit 10 is divided and disposed on two stacked semiconductor substrates 150 and 250.

A pixel array unit 10*a* is disposed on the semiconductor substrate 150, and a pixel array unit 10*b* is disposed on the semiconductor substrate 250. The pre-stage circuit 110 described in FIG. 16 can be disposed in the pixel 100 of the pixel array unit 10*a*. Further, the constant current circuit 105, the signal level holding circuit 130, and the post-stage circuit 120 of FIG. 16 can be disposed in the pixel 100 of the pixel array unit 10*b*. That is, the pixel 100 of the pixel array unit 10 in the drawing can employ the configurations depicted in FIGS. 17 and 18. Furthermore, in the semiconductor substrate 250 in the drawing, the logic circuit 50 is further disposed outside the pixel array unit 10*b*.

[Another Configuration of Cross-Section of Imaging Element]

Figure 30:
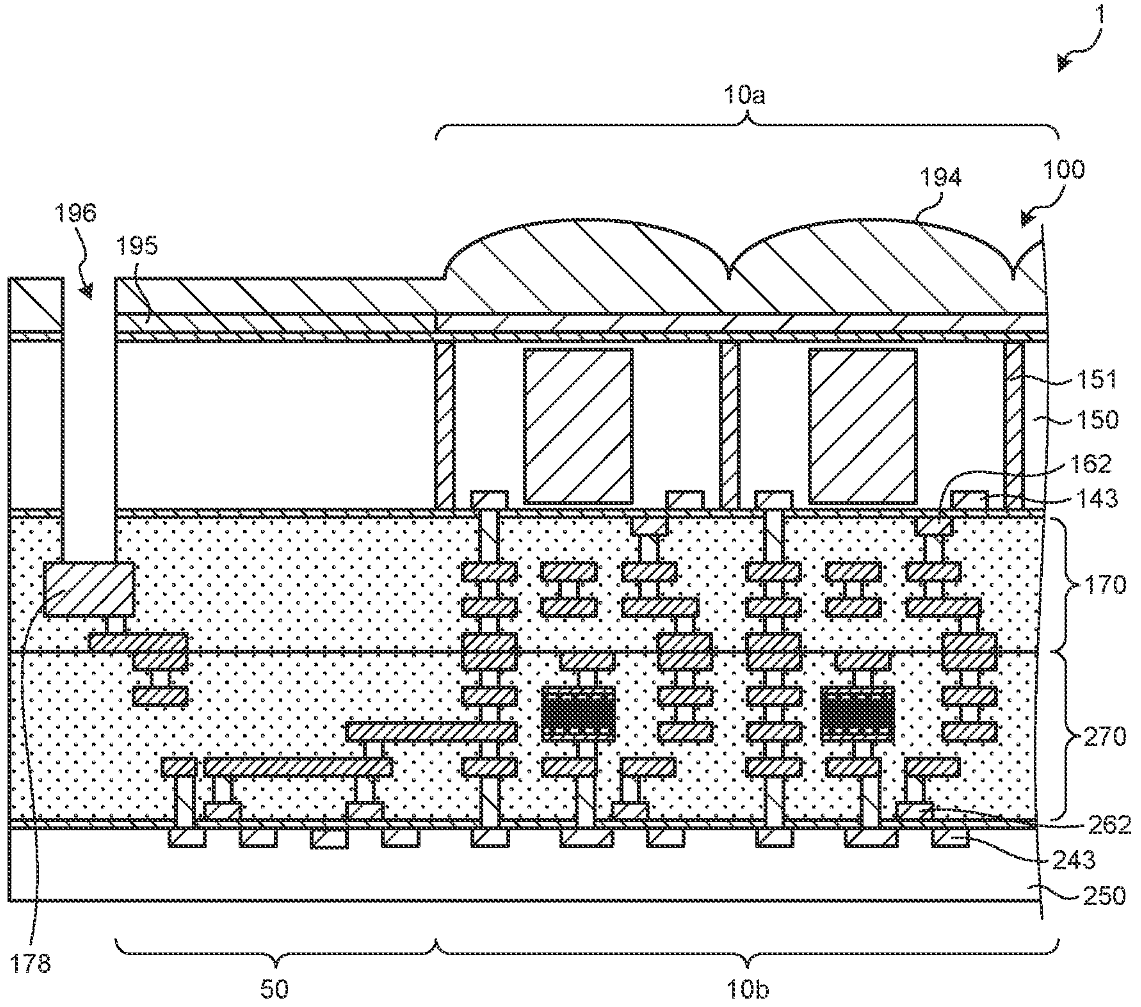
FIG. 30 is a cross-sectional view depicting another configuration example of the imaging element according to the seventh embodiment of the present disclosure.
Figure 31:
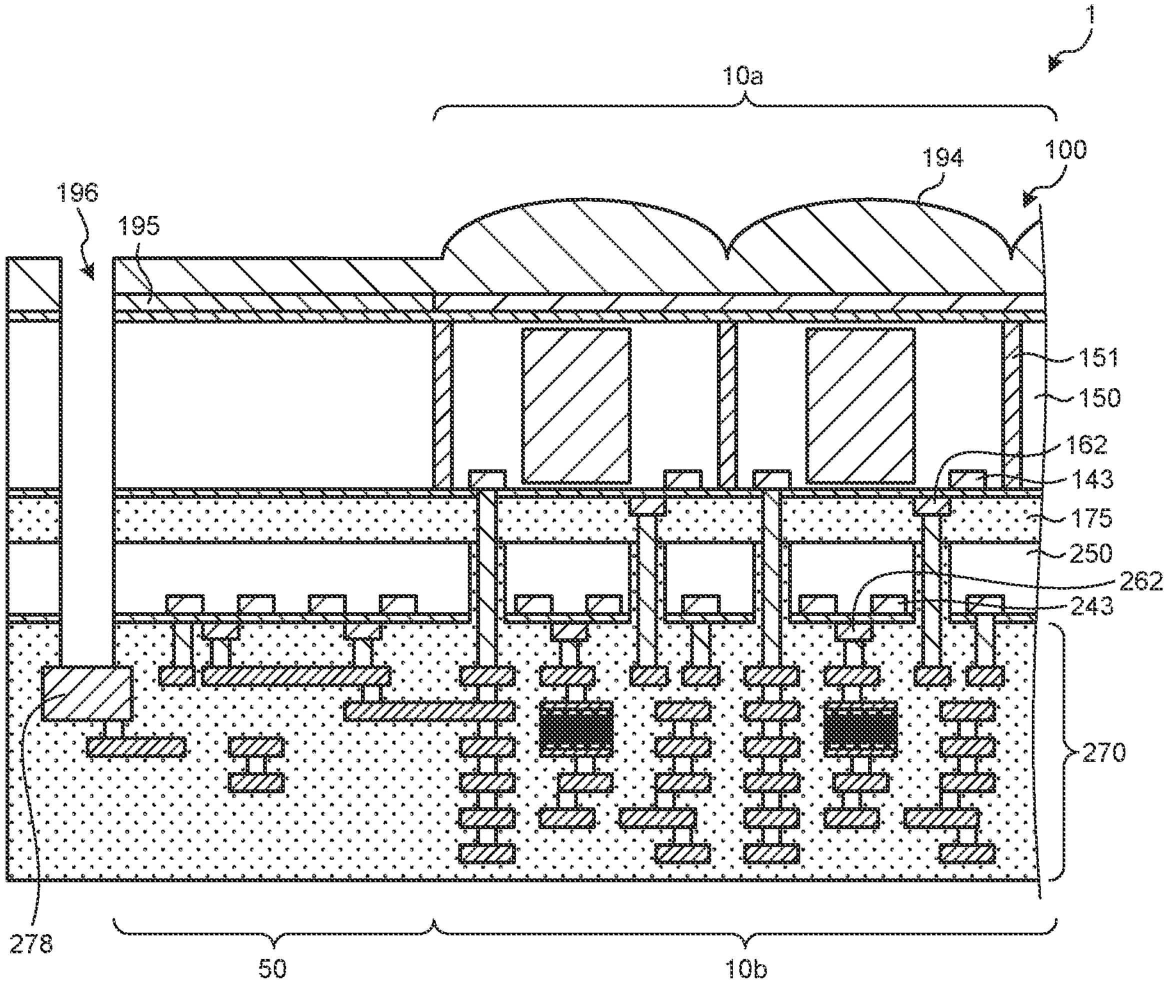
FIG. 31 is a cross-sectional view depicting another configuration example of the imaging element according to the seventh embodiment of the present disclosure.

FIGS. 30 and 31 are cross-sectional views depicting other configuration examples of the imaging element according to the seventh embodiment of the present disclosure. The drawing is a view depicting a cross-sectional configuration of the photodetection device 1 of FIG. 29.

FIG. 30 is a view depicting an example of the photodetection device 1 including the pixel 100 configured by joining the wiring region 170 and the wiring region 270 as in the pixel 100 in FIG. 17. The logic circuit 50 is further disposed on the semiconductor substrate 250 in the drawing. As in FIG. 17, the pad 178 for wire bonding is disposed in the wiring region 170 of the semiconductor substrate 150.

FIG. 31 is a view depicting an example of the photodetection device 1 including the pixel 100 configured by joining the back surface side of the semiconductor substrate 250 to the interlayer film 175 of the semiconductor substrate 150 as in the pixel 100 in FIG. 18. As in FIG. 30, the logic circuit 50 is further disposed on the semiconductor substrate 250 in the drawing. A semiconductor region 243 and a gate 262 of the MOS transistor constituting the element of the logic circuit 50 are described on the semiconductor substrate 250 in the drawing. Note that, in the photodetection device 1 of the drawing, a bonding pad 278 is disposed in the wiring region 270 of the semiconductor substrate 250.

[Another Configuration of Imaging Element]

Figure 32:
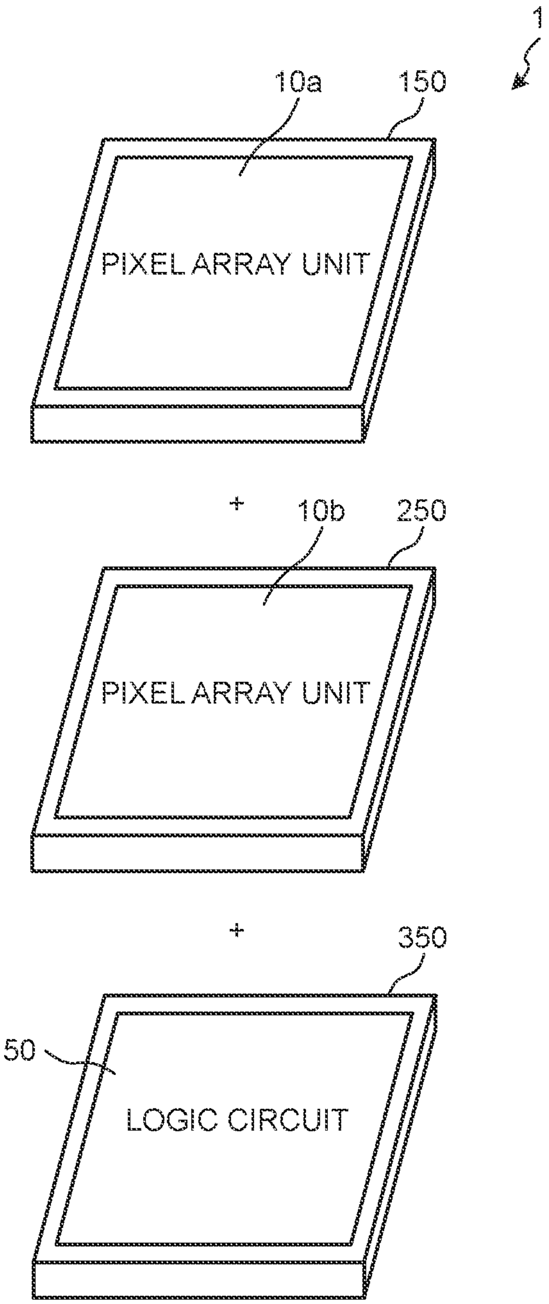
FIG. 32 is a diagram depicting another configuration example of the imaging element according to the seventh embodiment of the present disclosure.

FIG. 32 is a diagram depicting another configuration example of the imaging element according to the seventh embodiment of the present disclosure. As in FIGS. 26A and 26B, the drawing is a diagram for describing a substrate configuration of the photodetection device 1. The photodetection device 1 in the drawing is different from the photodetection device 1 in FIGS. 26A and 26B in that the semiconductor substrates 150, 250, and 350 are stacked. The pixel array unit 10*a* is disposed on the semiconductor substrate 150, and the pixel array unit 10*b* is disposed on the semiconductor substrate 250. Further, the logic circuit 50 is disposed on the semiconductor substrate 350.

[Another Configuration of Cross-Section of Imaging Element]

Figure 33:
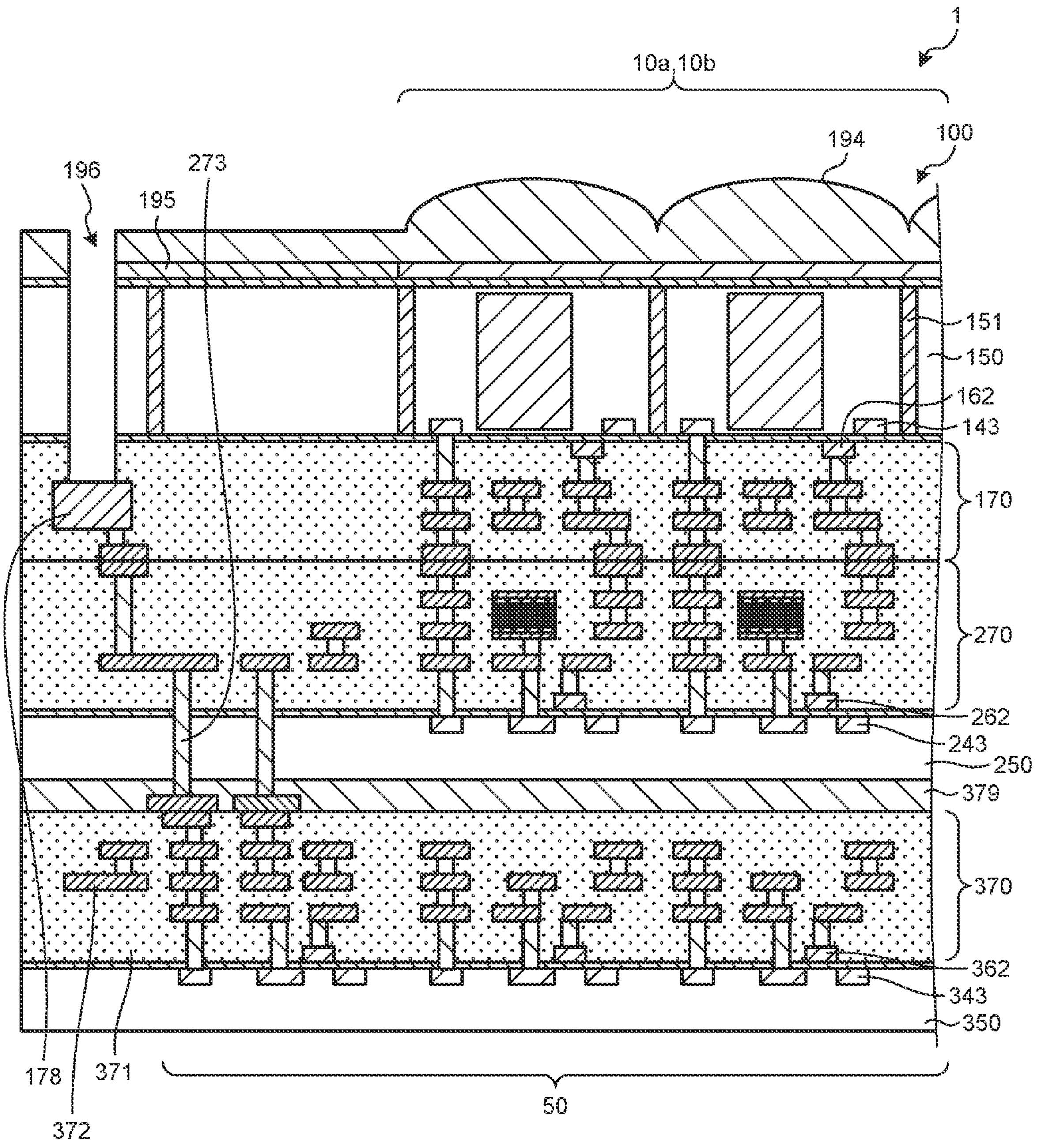
FIG. 33 is a cross-sectional view depicting another configuration example of the imaging element according to the seventh embodiment of the present disclosure.
Figure 34:
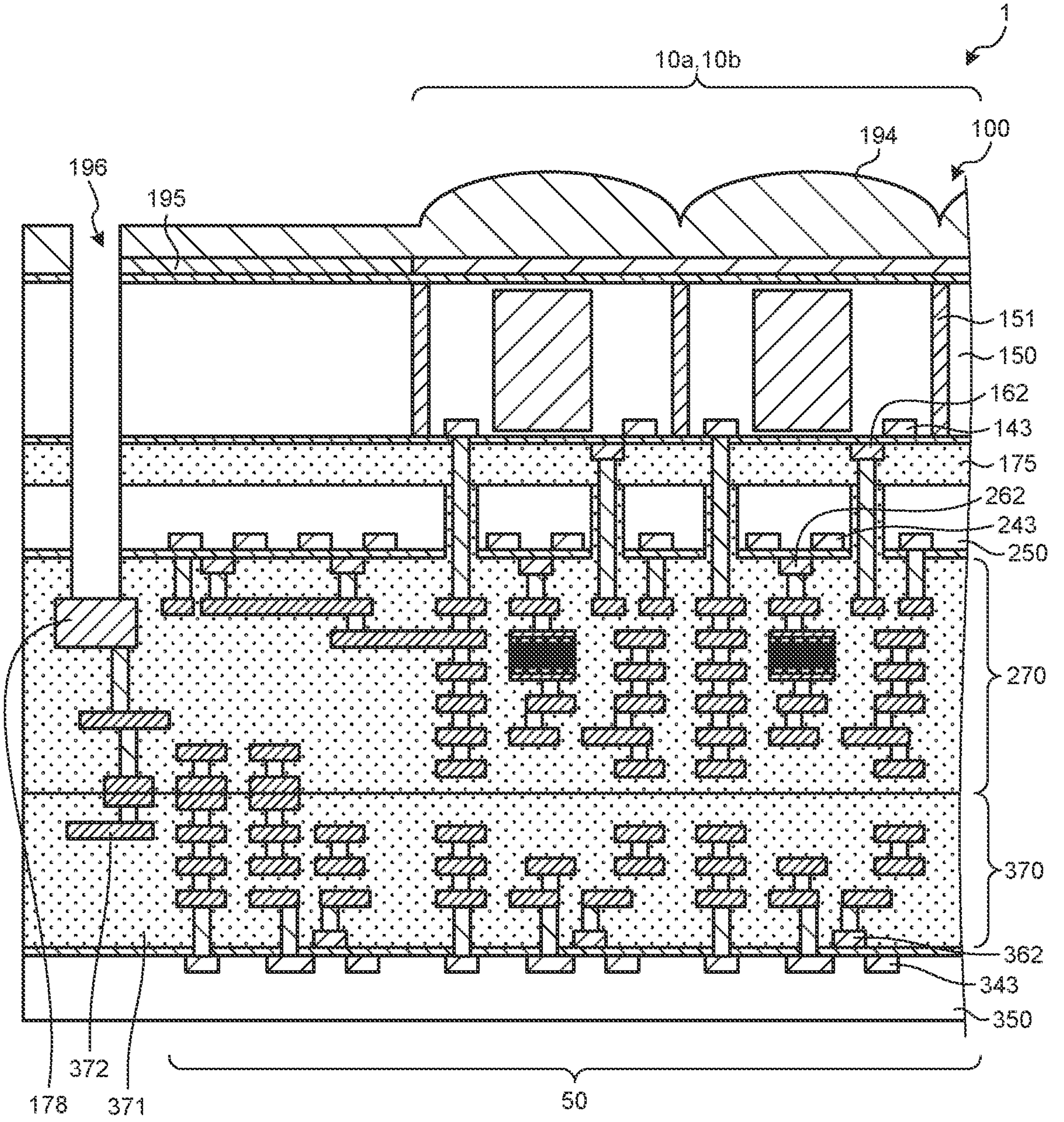
FIG. 34 is a cross-sectional view depicting another configuration example of the imaging element according to the seventh embodiment of the present disclosure.

FIGS. 33 and 34 are cross-sectional views depicting another configuration example of the imaging element according to the seventh embodiment of the present disclosure. The drawing is a view depicting a cross-sectional configuration of the photodetection device 1 of FIG. 32.

FIG. 33 is a view depicting an example of the photodetection device 1 configured by joining the wiring region 370 of the semiconductor substrate 350 to the back surface side of the semiconductor substrate 250. An interlayer film 379 is disposed on the back surface side of the semiconductor substrate 250 in the drawing. The wiring region 370 of the semiconductor substrate 350 is joined with the semiconductor substrate 250 via the interlayer film 379. The wiring region 270 of the semiconductor substrate 250 and the wiring region of the semiconductor substrate 350 can be connected by a through via 273. Note that, as in the photodetection device 1 of FIG. 30, the semiconductor substrate 150 and the semiconductor substrate 250 are stacked with the wiring region 170 and the wiring region 270 joined.

FIG. 34 is a view depicting an example of the photodetection device 1 configured by joining the wiring region 270 of the semiconductor substrate 250 to the wiring region 370 of the semiconductor substrate 350. The CuCu connection can be used for connection between the wiring region 270 and the wiring region 370. Note that, as is the photodetection device 1 of FIG. 31, the semiconductor substrate 150 and the semiconductor substrate 250 are stacked such that the interlayer film 175 disposed on the front surface side of the semiconductor substrate 150 and the back surface side of the semiconductor substrate 250 are joined with each other.

8. Eighth Embodiment

The pixel 100 according to the first embodiment described above includes the pre-stage circuit 110, the constant current circuit 105, the signal level holding circuit 130, and the post-stage circuit 120. On the other hand, a pixel 100 according to an eighth embodiment of the present disclosure is different from that of the above-described first embodiment in including a part corresponding to the pre-stage circuit 110.

In order to reduce the size of the photodetection device, for example, a photodetection device (imaging element) has been proposed in which a photoelectric conversion unit is disposed on a first semiconductor substrate, a signal readout circuit is disposed on a second semiconductor substrate, and these semiconductor substrates are stacked (for example, WO 2019/131965 A). In this imaging element, a signal is transmitted between the first semiconductor substrate and the second semiconductor substrate using a through wiring having a shape penetrating the second semiconductor substrate.

However, as the size of the photodetection device is reduced, there is a problem that the capacitance of the charge holding unit that holds the charge generated by the photoelectric conversion unit is insufficient.

Accordingly, a photodetection device that increases the capacitance of the charge holding unit is proposed.

[Configuration of Pixel]

Figure 35:
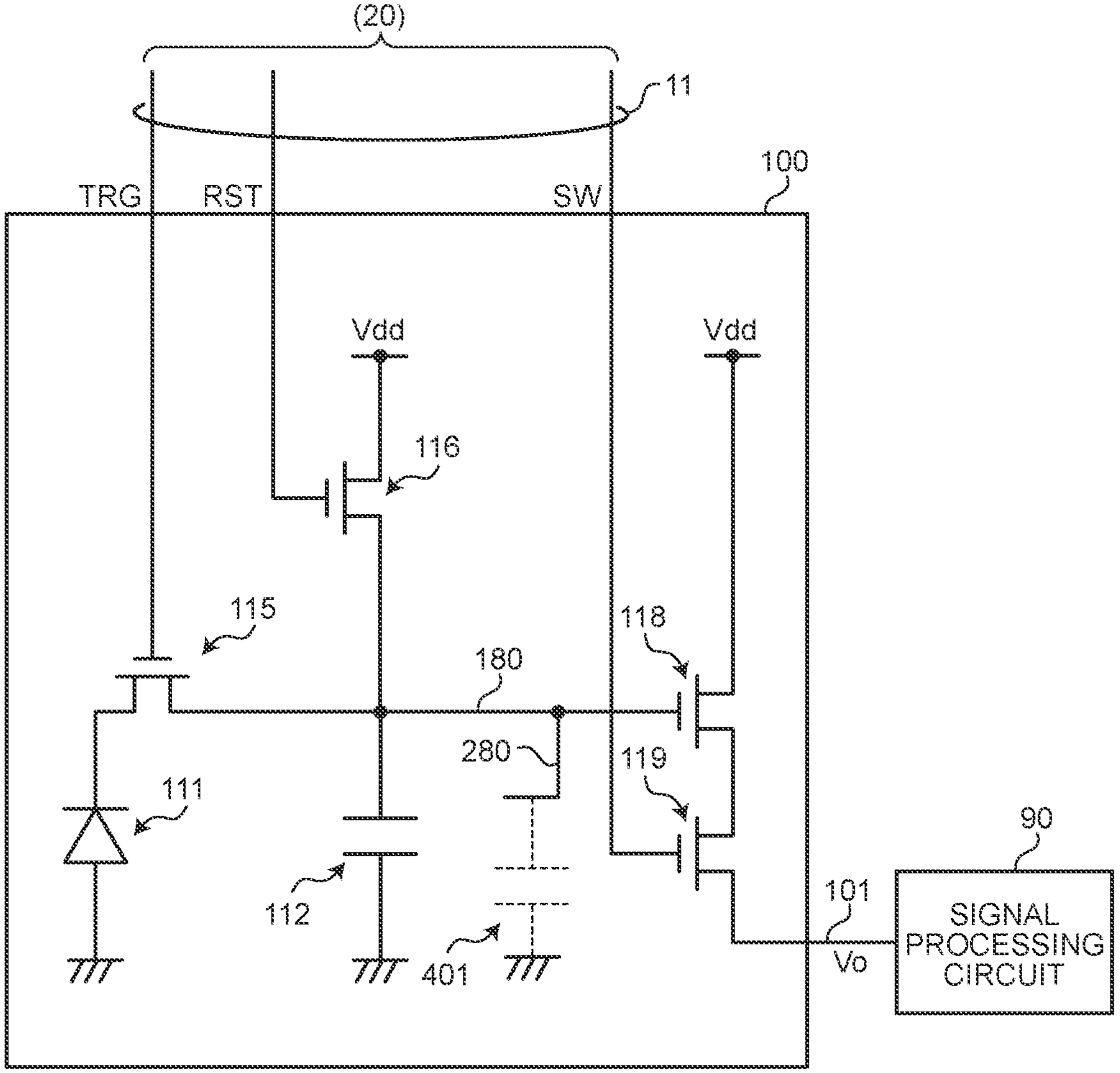
FIG. 35 is a diagram depicting a configuration example of a photodetection device according to an eighth embodiment of the present disclosure.

FIG. 35 is a diagram depicting a configuration example of a photodetection device according to the eighth embodiment of the present disclosure. The drawing is a circuit diagram depicting a configuration example of the pixel 100. The pixel 100 in the drawing includes the photoelectric conversion unit 111, the charge holding unit 112, the charge transfer unit 115, the first reset unit 116, the amplification unit 118, and the first selection unit 119. The pixel 100 in the drawing is equivalent to a circuit in which the charge discharge unit 114, the coupling unit 117, and the second charge holding unit are excluded in the pre-stage circuit 110 in FIG. 2, and thus the description of connection and the like will be omitted. Note that a wiring connecting the charge holding unit 112 and the amplification unit 118 is referred to as a charge holding unit wiring.

In the drawing, a charge holding unit wiring 180 is depicted. A capacitance addition wiring 280 is connected to the charge holding unit wiring 180. The capacitance addition wiring 280 is a wiring that adds capacitance to the charge holding unit 112 via the charge holding unit wiring 180. As described later, the capacitance addition wiring 280 is a wiring configured in a shape penetrating the semiconductor substrate 250 as is the through via 273 described in FIG. 18.

Note that a signal processing circuit 90 is connected to the output (first output node 101) of the pixel 100 in the drawing. The signal processing circuit 90 is a circuit that processes a signal generated by the pixel 100. The signal processing circuit 90 can include, for example, the constant current circuit 105, the signal level holding circuit 130, and the post-stage circuit 120 described in FIG. 2. Note that the pixel 100 is disposed on the semiconductor substrate 150, and the signal processing circuit 90, which is a circuit in the subsequent stage, is disposed on the semiconductor substrate 250.

[Configuration of Plane of Pixel]

Figure 36:
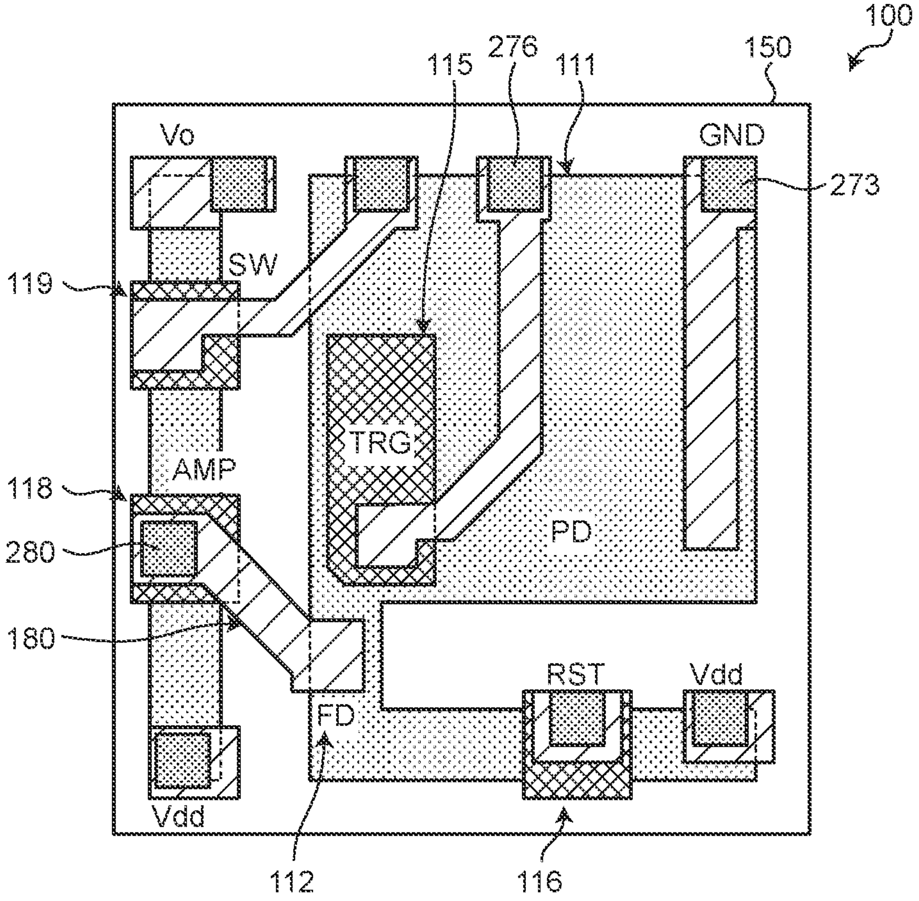
FIG. 36 is a plan view depicting a configuration example of a pixel according to the eighth embodiment of the present disclosure.

FIG. 36 is a plan view depicting a configuration example of the pixel according to the eighth embodiment of the present disclosure. The drawing is a plan view depicting a configuration example of the pixel 100 as in FIG. 5. The drawing depicts an arrangement example of the constituent members of the pixel 100 on the surface of the semiconductor substrate 150. In the drawing, hatched regions represent wirings disposed in the wiring region 170 of the semiconductor substrate 150. Other than this, notations similar to those in FIG. 5 are used.

The photoelectric conversion unit 111 (PD) is disposed at the center of the pixel 100. The through via 273 is disposed on the upper right of the photoelectric conversion unit 111 in the drawing via wiring. The wiring below the through via 273 is connected to the well contact. Further, the charge transfer unit 115 (TRG) is disposed adjacent to a left side of the photoelectric conversion unit 111. The charge holding unit 112 (FD) is disposed on a lower side of the charge transfer unit 115. A first reset unit 116 (RST) is disposed on a right side of the charge holding unit 112. The power supply line Vdd is disposed on a drain side of the first reset unit 116, and the through via 273 is disposed in the power supply line Vdd. The first selection unit 119 (SW) and the amplification unit 118 (AMP) are disposed on the left side of the photoelectric conversion unit 111. An upper side of the first selection unit 119 is connected to the wiring of the output node 101 (Vo), and the through via 273 is disposed. A source side of the amplification unit 118 is connected to the power supply line Vdd.

The charge holding unit wiring 180 is disposed between the gate of the amplification unit 118 and the semiconductor region of the charge holding unit 112. The capacitance addition wiring 280 is disposed on the charge holding unit wiring 180. Note that, as described later, the charge holding unit wiring 180 includes a wiring 183 connecting the gate of the amplification unit 118 and the charge holding unit 112, and contact plugs 181 and 182. For convenience, in the plan view, a wiring connecting the gate of the amplification unit 118 and the charge holding unit 112 is referred to as the charge holding unit wiring 180.

[Configuration of Cross-Section of Pixel]

Figure 37:
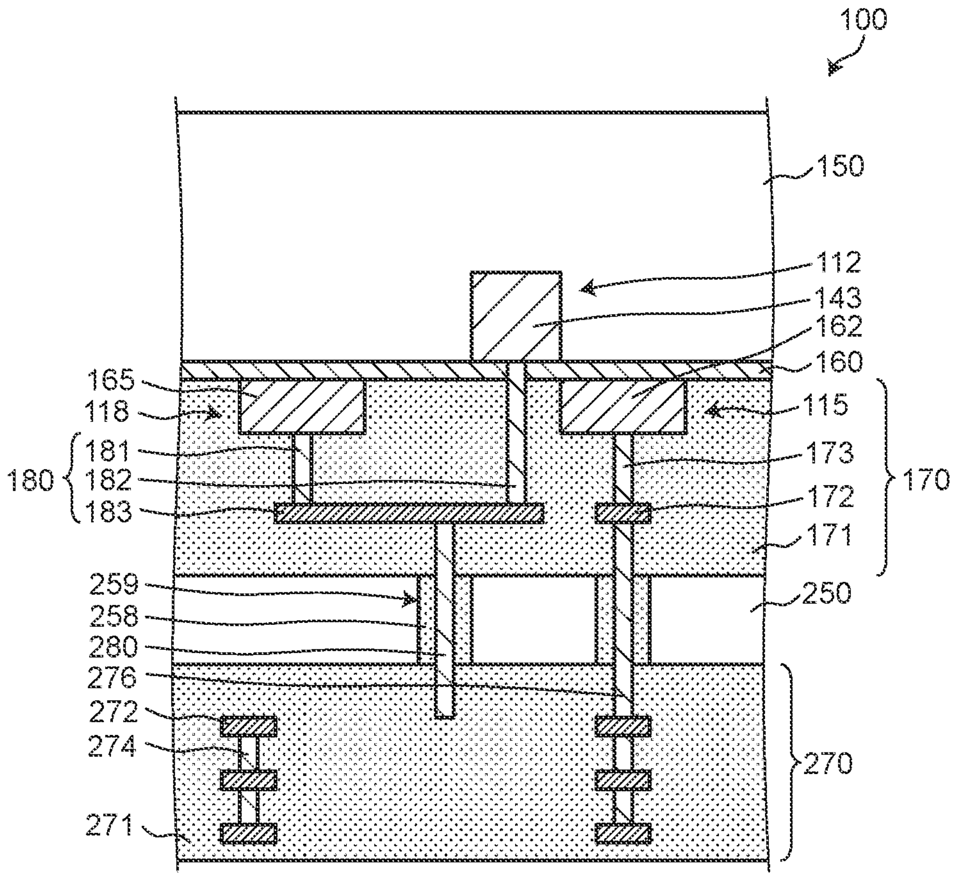
FIG. 37 is a cross-sectional view depicting a configuration example of a pixel according to the eighth embodiment of the present disclosure.

FIG. 37 is a cross-sectional view depicting a configuration example of the pixel according to the eighth embodiment of the present disclosure. The drawing is a cross-sectional view depicting a configuration example of the pixel 100 as in FIG. 18. For convenience, description of the color filter 192, the on-chip lens 194, the semiconductor region of the semiconductor substrate 150, and the like is omitted. The pixel 100 in the drawing is disposed on the semiconductor substrate 250 of the stacked semiconductor substrates 150 and 250. In the drawing, the charge holding unit 112, the charge transfer unit 115, and the amplification unit 118 of the pixel 100 are depicted. As described above, the charge holding unit 112 includes the semiconductor region 143 formed in the semiconductor substrate 150. Further, in the drawing, the gate 162 of the charge transfer unit 115 and a gate 165 of the amplification unit 118 are depicted.

The gate 162 of the charge transfer unit 115 is connected to the wiring 172 via a contact plug 173. A through via 276 is connected to the wiring 172. The through via 276 penetrates the semiconductor substrate 250 and is connected to the wiring (wiring 272) of the wiring region 270 of the semiconductor substrate 250.

The contact plug 181 is connected to the gate 165 of the amplification unit 118. Further, the contact plug 182 is connected to the semiconductor region 143 of the charge holding unit 112. The contact plugs 181 and 182 are commonly connected to the wiring 183. The contact plugs 181 and 182 and the wiring 183 constitute the charge holding unit wiring 180. The capacitance addition wiring 280 is connected to the wiring 183 of the charge holding unit wiring 180. The capacitance addition wiring 280 is formed in a shape penetrating the semiconductor substrate 250 as is the through via 276. Specifically, the capacitance addition wiring 280 is disposed in an opening 259 formed in the semiconductor substrate 250, and a separation layer 258 is disposed around the capacitance addition wiring 280 in the opening 259. The separation layer 258 separates the capacitance addition wiring 280 from the semiconductor substrate 250. The separation layer 258 can include, for example, a film of an oxide such as silicon oxide ($SiO_2$) or a dielectric. Note that the through via 276 can also employ a configuration similar to that of the capacitance addition wiring 280.

As described above, the charge holding unit 112 and the amplification unit 118 are disposed on the semiconductor substrate 150, and thus they can be connected using the wiring of the wiring region 170 of the semiconductor substrate 150. Since the wiring is completed in the wiring region 170, the pixel 100 can be downsized. On the other hand, in a case where the amplification unit 118 is disposed on the semiconductor substrate 250, it is necessary to connect the charge transfer unit 115 and the amplification unit 118 using the through via 273.

Note that, in the charge holding unit wiring 180, stray capacitance (parasitic capacitance) is formed between well regions and the like of the semiconductor substrate 150. This stray capacitance is connected in parallel with the charge holding unit 112, and hence the stray capacitance of the charge holding unit wiring 180 is added to the charge holding unit 112. This increases the capacitance of the charge holding unit 112. However, since the charge holding unit wiring 180 in the drawing is completed in the wiring region 170 as described above, the stray capacitance becomes small, and the capacitance added to the charge holding unit 112 becomes insufficient. When the capacitance of the charge holding unit 112 is insufficient, the saturation charge amount decreases, and the dynamic range of the signal generated by the amplification unit 118 becomes narrow. In a case where the output signal of the pixel 100 is used as an image signal, the image quality is deteriorated.

Accordingly, the capacitance addition wiring 280 is connected to the charge holding unit wiring 180. As depicted in the drawing, the capacitance addition wiring 280 is configured in a columnar shape reaching the wiring region 270, and hence the surface area is increased. This increases the stray capacitance. By connecting such a capacitance addition wiring 280 to the charge holding unit wiring 180, the stray capacitance of the charge holding unit wiring 180 increases, and the capacitance added to the charge holding unit 112 increases.

[Configuration of Capacitance Addition Wiring]

Figure 38:
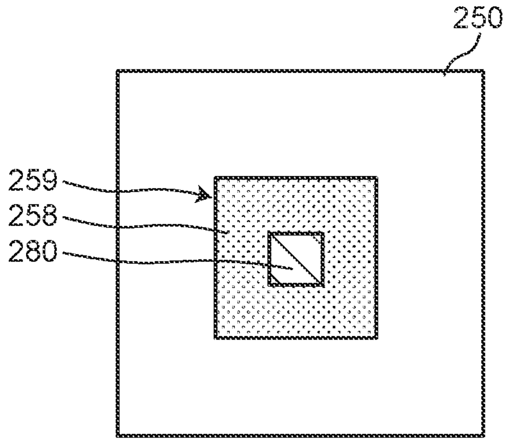
FIG. 38 is a diagram depicting a configuration example of a capacitance addition wiring according to the eighth embodiment of the present disclosure.

FIG. 38 is a diagram depicting a configuration example of the capacitance addition wiring according to the eighth embodiment of the present disclosure. The drawing is a cross-sectional view depicting a configuration example of the capacitance addition wiring 280 in the portion of the opening 259 of the semiconductor substrate 250. As described above, the capacitance addition wiring 280 is formed in a shape passing through the opening 259 formed in the semiconductor substrate 250. The separation layer 258 is disposed between the opening 259 and the capacitance addition wiring 280.

As described above, in the pixel 100 according to the eighth embodiment of the present disclosure, the capacitance addition wiring 280 is connected to the charge holding unit wiring 180 that connects the charge holding unit 112 and the amplification unit 118. Thus, the capacitance added to the charge holding unit 112 can be increased.

9. Ninth Embodiment

In the pixel 100 according to the eighth embodiment described above, the capacitance addition wiring 280 is disposed in the opening 259 of the semiconductor substrate 250. On the other hand, a pixel 100 according to a ninth embodiment of the present disclosure is different from that of the above-described eighth embodiment in that another through via is further disposed in the opening 259 of the semiconductor substrate 250.

[Configuration of Cross-Section of Pixel]

Figure 39:
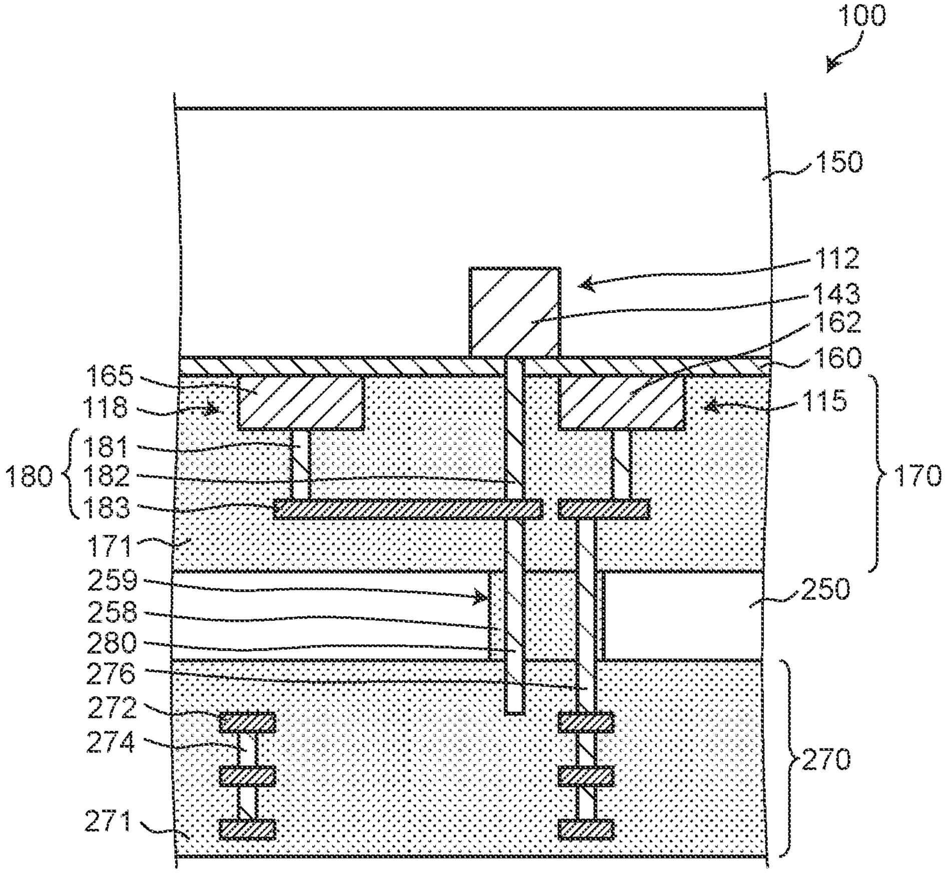
FIG. 39 is a cross-sectional view depicting a configuration example of a pixel according to a ninth embodiment of the present disclosure.

FIG. 39 is a cross-sectional view depicting a configuration example of the pixel according to a ninth embodiment of the present disclosure. The drawing is a cross-sectional view depicting a configuration example of the pixel 100 as in FIG. 37. The pixel 100 is different from the pixel in FIG. 37 in that the through via 276 is disposed in addition to the capacitance addition wiring 280 in the opening 259 of the semiconductor substrate 250.

As depicted in the drawing, by collectively arranging the capacitance addition wiring 280 and the through via 276 in one opening 259, it is possible to reduce the occupied area of the opening as compared with a case where a plurality of openings is formed in the semiconductor substrate 250. A region where the signal processing circuit 90 can be disposed in the semiconductor substrate 250 can be expanded.

Note that it is preferable that the capacitance addition wiring 280 and the through via 276 connected to the gate of the charge transfer unit 115 are disposed in the same opening 259 because the both are disposed close to each other. This is because the coupling capacitance of the capacitance addition wiring 280 and the through via 276 increases, and the amount of increase in the potential of the charge holding unit 112 due to the signal applied to the gate of the charge transfer unit 115 increases.

[Configuration of Capacitance Addition Wiring]

Figure 40A:
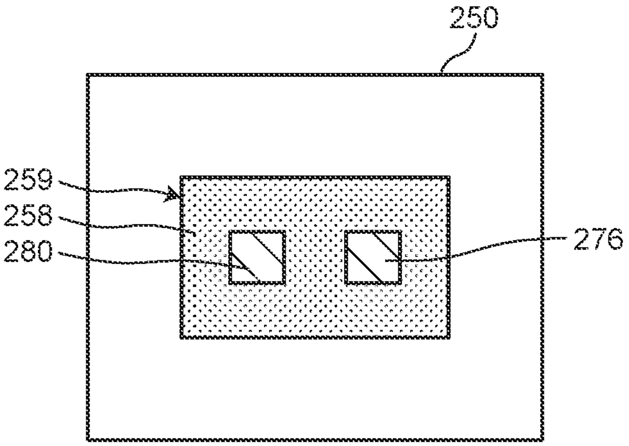
FIG. 40A is a diagram depicting a configuration example of the capacitance addition wiring according to the ninth embodiment of the present disclosure.
Figure 40B:
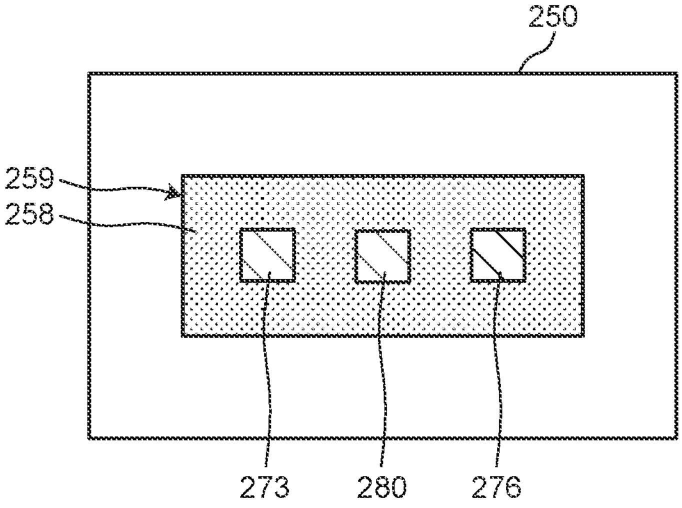
FIG. 40B is a diagram depicting a configuration example of the capacitance addition wiring according to the ninth embodiment of the present disclosure.

FIGS. 40A and 40B are diagrams depicting configuration examples of the capacitance addition wiring according to the ninth embodiment of the present disclosure. As in FIG. 38, the drawing is a view depicting a configuration example of the capacitance addition wiring 280 in the portion of the opening 259 of the semiconductor substrate 250.

FIG. 40A is a diagram depicting an example of a case where the capacitance addition wiring 280 and the through via 276 are disposed in the opening 259. Further, FIG. 40B is a diagram depicting an example of a case where the through via 273 is disposed in the opening 259 in addition to the capacitance addition wiring 280 and the through via 276. The through via 273 is, for example, a through via that transmits the reference potential (ground potential).

The configuration of the photodetection device 1 other than this is similar to the configuration of the photodetection device 1 in the eighth embodiment of the present disclosure, and thus the description thereof will be omitted.

As described above, in the pixel 100 according to the ninth embodiment of the present disclosure, the capacitance addition wiring 280 and the through via are disposed in the opening 259 of the semiconductor substrate 250. Thus, the area occupied by the opening in the semiconductor substrate 250 can be reduced, and the area in which the signal processing circuit 90 can be disposed can be expanded.

10. Tenth Embodiment

In the pixel 100 according to the eighth embodiment described above, the capacitance addition wiring 280 is connected to the charge holding unit wiring 180. On the other hand, a pixel 100 according to a tenth embodiment of the present disclosure is different from the above-described eighth embodiment in that a plurality of capacitance addition wirings 280 is connected to the charge holding unit wiring 180.

[Configuration of Plane of Pixel]

Figure 41:
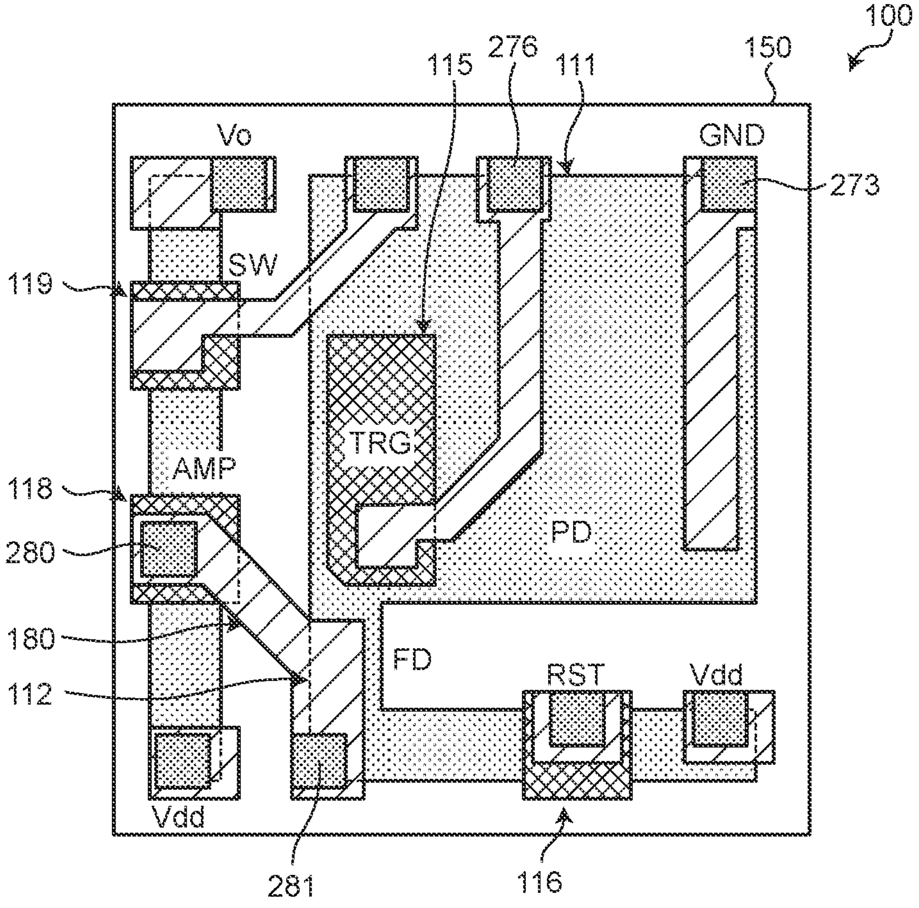
FIG. 41 is a plan view depicting a configuration example of a pixel according to a tenth embodiment of the present disclosure.

FIG. 41 is a plan view depicting a configuration example of the pixel according to a tenth embodiment of the present disclosure. The drawing is a plan view depicting a configuration example of the pixel 100 as in FIG. 36. The pixel 100 in the drawing is different from the pixel 100 in FIG. 36 in that the capacitance addition wiring 280 and a capacitance addition wiring 281 are connected to the charge holding unit wiring 180. Since a plurality of capacitance addition wirings (the capacitance addition wirings 280 and 281) is connected to the charge holding unit wiring 180, the capacitance added to the charge holding unit 112 increases as compared with a case where only the capacitance addition wiring 280 is connected to the charge holding unit wiring 180.

[Configuration of Cross-Section of Pixel]

Figure 42:
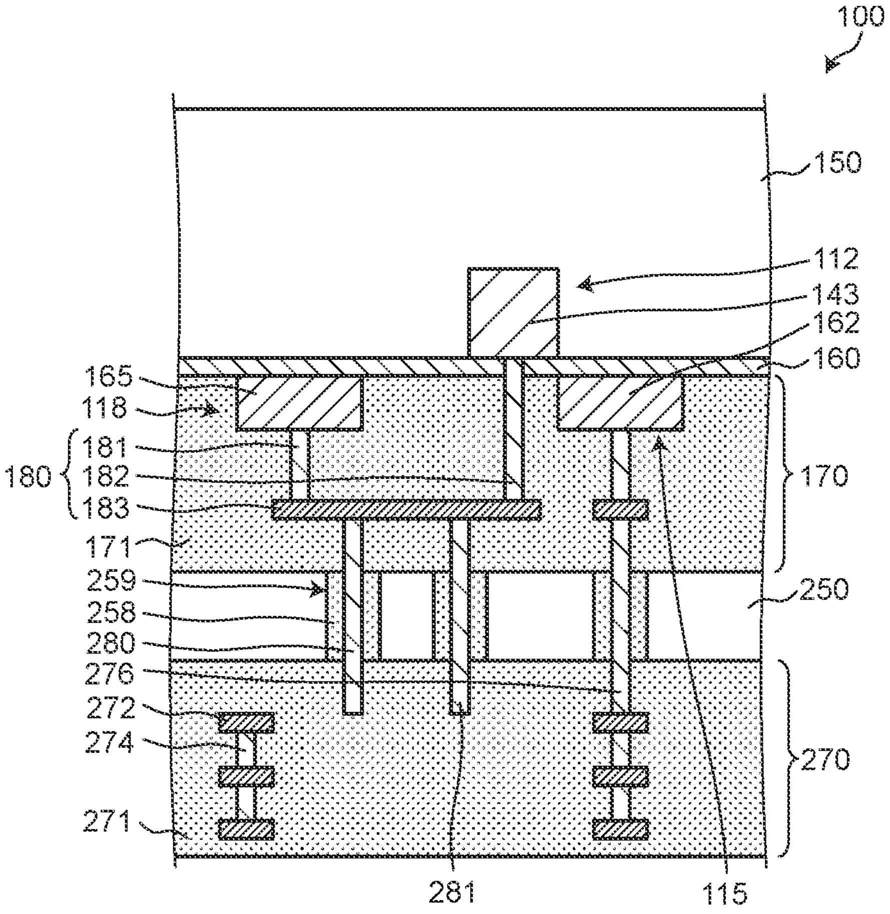
FIG. 42 is a cross-sectional view depicting a configuration example of the pixel according to the tenth embodiment of the present disclosure.

FIG. 42 is a cross-sectional view depicting a configuration example of the pixel according to the tenth embodiment of the present disclosure. The drawing is a cross-sectional view depicting a configuration example of the pixel 100 as in FIG. 37. The pixel 100 in the drawing is different from the pixel 100 in FIG. 37 in that the capacitance addition wiring 281 connected to the charge holding unit wiring 180 is further disposed. As is the capacitance addition wiring 280, the capacitance addition wiring 281 is also disposed in an opening formed in the semiconductor substrate 250.

The configuration of the photodetection device 1 other than this is similar to the configuration of the photodetection device 1 in the eighth embodiment of the present disclosure, and thus the description thereof will be omitted.

As described above, the pixel 100 according to the tenth embodiment of the present disclosure connects the plurality of capacitance addition wirings to the charge holding unit wiring 180. Thus, the capacitance added to the charge holding unit 112 can be further increased.

11. Eleventh Embodiment

In the pixel 100 according to the eighth embodiment described above, the charge holding unit 112 holds the charge generated by the photoelectric conversion unit 111. On the other hand, a pixel 100 according to an eleventh embodiment of the present disclosure is different from that of the above-described eighth embodiment in further including a second charge holding unit 113 and the coupling unit 117, and causing the charge holding unit 112 and the second charge holding unit 113 to hold the charge generated by the photoelectric conversion unit 111.

[Configuration of Pixel]

Figure 43:
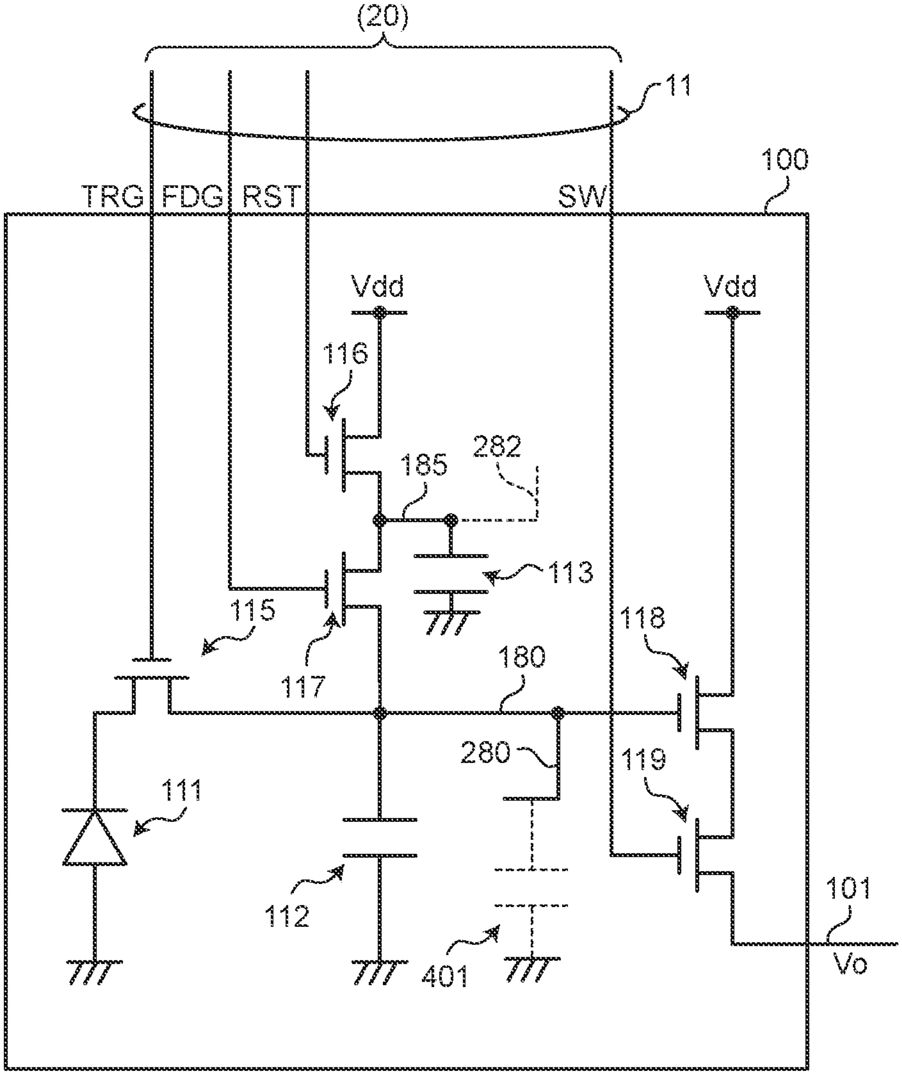
FIG. 43 is a diagram depicting a configuration example of a photodetection device according to an eleventh embodiment of the present disclosure.

FIG. 43 is a diagram depicting a configuration example of a photodetection device according to the eleventh embodiment of the present disclosure. The drawing is a circuit diagram depicting a configuration example of the pixel 100 as in FIG. 35. The pixel 100 in the drawing is different from the pixel 100 in FIG. 35 in further including the coupling unit 117 and the second charge holding unit 113. The connection between the coupling unit 117 and the second charge holding unit 113 is similar to that in FIG. 2, and thus the description thereof will be omitted. Note that a wiring connecting the coupling unit 117 and the second charge holding unit 113 is referred to as a second charge holding unit wiring 185. The second charge holding unit wiring 185 is a wiring to which the second charge holding unit 113 is connected. A capacitance addition wiring can be further connected to the second charge holding unit wiring 185. The capacitance addition wiring 282 in the drawing represents an example of a capacitance addition wiring connected to the second charge holding unit wiring 185.

[Configuration of Plane of Pixel]

Figure 44:
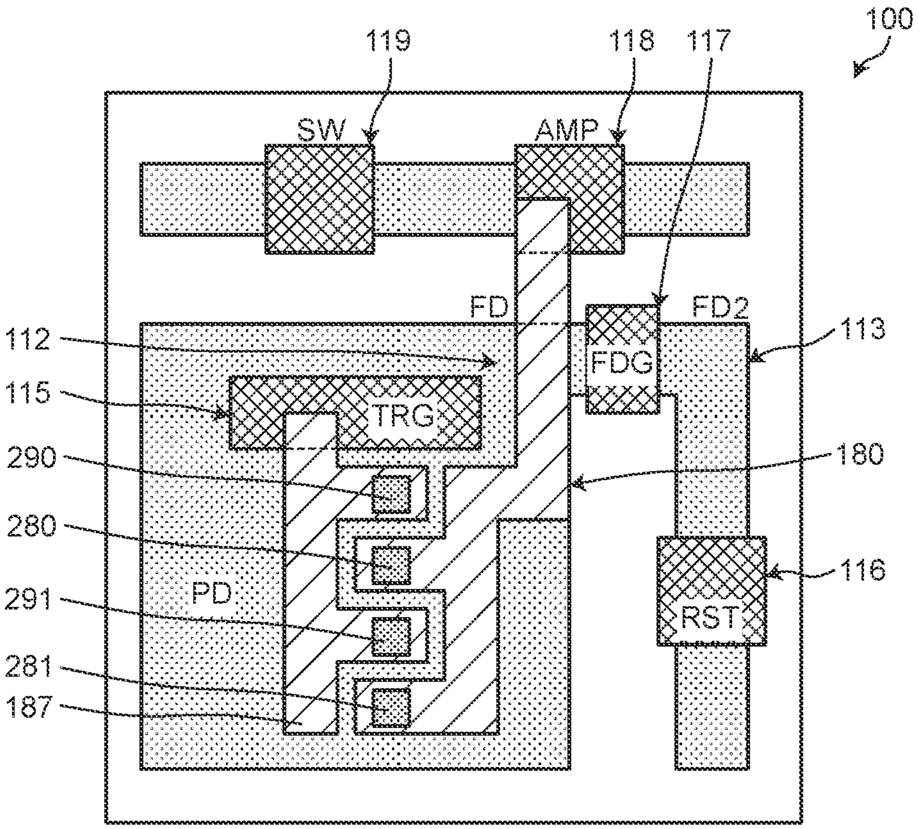
FIG. 44 is a plan view depicting a configuration example of a pixel according to the eleventh embodiment of the present disclosure.

FIG. 44 is a plan view depicting a configuration example of the pixel according to the eleventh embodiment of the present disclosure. The drawing is a plan view depicting a configuration example of the pixel 100 as in FIG. 36. The pixel 100 in the drawing is different from the pixel 100 in FIG. 36 in that the coupling unit 117 (FDG) and the second charge holding unit 113 (FD2) are further disposed. Further, the plurality of capacitance addition wirings (the capacitance addition wirings 280 and 281) is disposed in the charge holding unit wiring 180 in the drawing, and a plurality of through vias (through vias 290 and 291) is disposed in a wiring 187 of the gate of the charge transfer unit 115. The capacitance addition wirings 280 and 281 and the through vias 290 and 291 are alternately disposed adjacent to each other. Thus, the coupling capacitance between the capacitance addition wiring 280 and the wiring 187 increases, and the amount of increase in the potential of the charge holding unit 112 due to the signal applied to the gate of the charge transfer unit 115 can be further increased.

Figure 45:
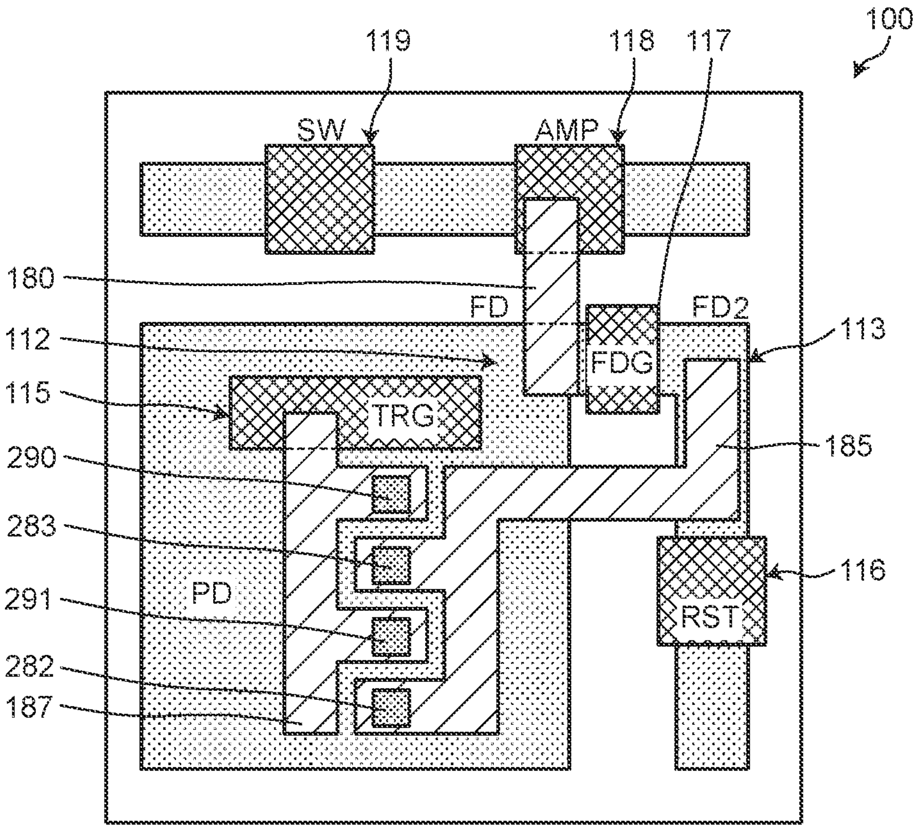
FIG. 45 is a plan view depicting another configuration example of the pixel according to the eleventh embodiment of the present disclosure.
Figure 46:
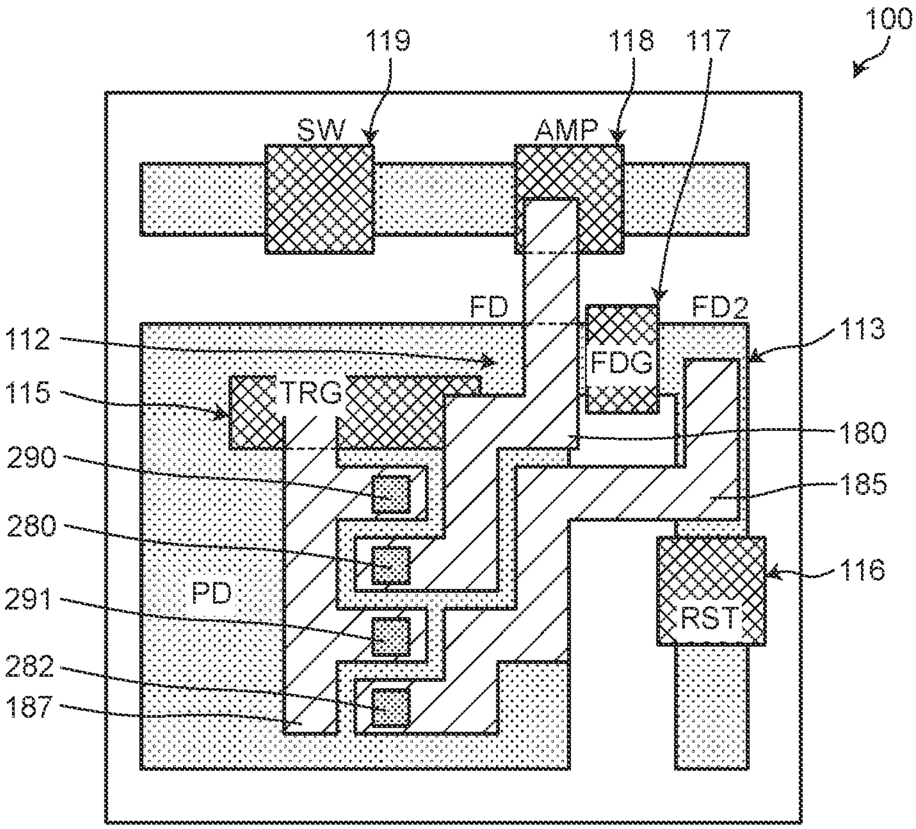
FIG. 46 is a plan view depicting another configuration example of the pixel according to the eleventh embodiment of the present disclosure.

FIGS. 45 and 46 are plan views depicting other configuration examples of the pixel according to the eleventh embodiment of the present disclosure. The drawing is a plan view depicting a configuration example of the pixel 100 as in FIG. 44. FIG. 45 depicts an example in which capacitance addition wirings 282 and 283 are disposed on the second charge holding unit wiring 185. The capacitance addition wirings 282 and 283 and the through vias 290 and 291 are alternately disposed adjacent to each other.

FIG. 46 depicts an example in which the capacitance addition wiring 280 is disposed on the charge holding unit wiring 180 and the capacitance addition wiring 282 is disposed on the second charge holding unit wiring 185. The capacitance addition wirings 280 and 282 and the through vias 290 and 291 are alternately disposed adjacent to each other.

The configuration of the photodetection device 1 other than this is similar to the configuration of the photodetection device 1 in the eighth embodiment of the present disclosure, and thus the description thereof will be omitted.

As described above, the pixel 100 according to the eleventh embodiment of the present disclosure further includes the coupling unit 117 and the second charge holding unit 113. Thus, the sensitivity of the pixel 100 can be adjusted.

12. Twelfth Embodiment

The pixel 100 according to the above-described eleventh embodiment includes the second charge holding unit 113 and the coupling unit 117 to adjust the sensitivity of the pixel 100. On the other hand, a pixel 100 according to a twelfth embodiment of the present disclosure is different from the above-described eleventh embodiment in further including a second coupling unit 410 and a third charge holding unit 411.

[Configuration of Pixel]

Figure 47:
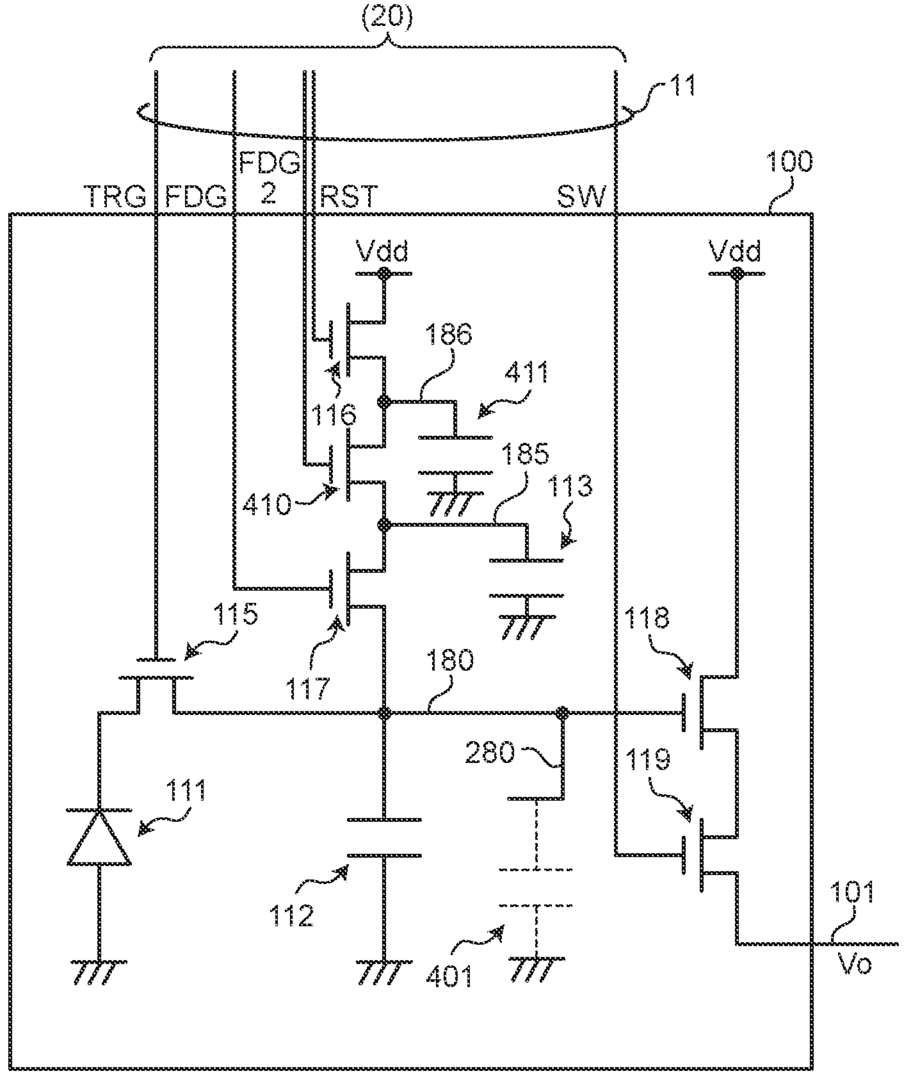
FIG. 47 is a diagram depicting a configuration example of a photodetection device according to a twelfth embodiment of the present disclosure.

FIG. 47 is a diagram depicting a configuration example of a photodetection device according to the twelfth embodiment of the present disclosure. The drawing is a circuit diagram depicting a configuration example of the pixel 100 as in FIG. 43. The pixel 100 in the drawing is different from the pixel 100 in FIG. 35 in further including a second coupling unit 410 and a third charge holding unit 411.

The second coupling unit 410 couples the third charge holding unit 411 to the second charge holding unit 113. The second coupling unit 410 can include an n-channel MOS transistor. A drain of the second coupling unit 410 is connected to the source of the first reset unit 116 and one end of the third charge holding unit 411. Another end of the third charge holding unit 411 is grounded. A source of the second coupling unit 410 is connected to the drain of the coupling unit 117. A signal line FDG2 is connected to a gate of the second coupling unit 410.

As is the charge holding unit 112, the third charge holding unit 411 is a charge holding unit including a semiconductor region disposed on the semiconductor substrate 150. By causing conduction of the coupling unit 117 and the second coupling unit 410, the third charge holding unit 411 can be coupled to the charge holding unit 112. In this manner, the pixel 100 in the drawing can adjust the sensitivity in three stages.

The wiring connecting the second coupling unit 410 and the third charge holding unit 411 is referred to as a third charge holding unit wiring 186. The third charge holding unit wiring 186 is a wiring to which the third charge holding unit 411 is connected. A capacitance addition wiring can be further connected to the third charge holding unit wiring 186.

[Configuration of Plane of Pixel]

Figure 48A:
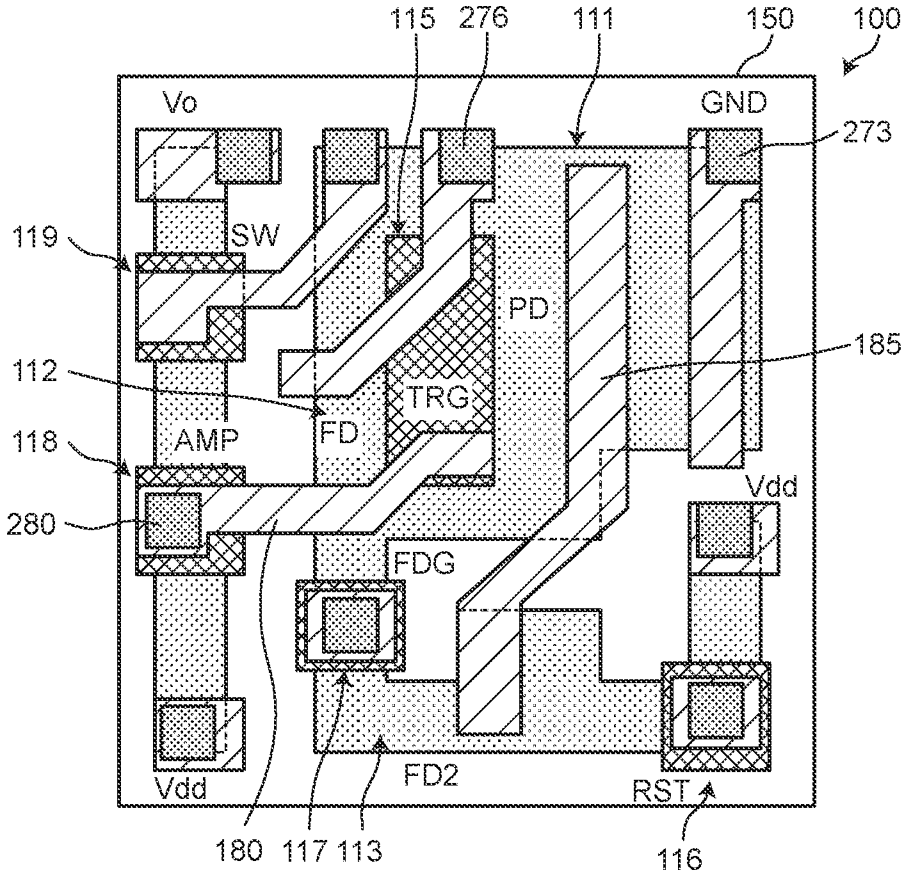
FIG. 48A is a plan view depicting a configuration example of a pixel according to the twelfth embodiment of the present disclosure.
Figure 48B:
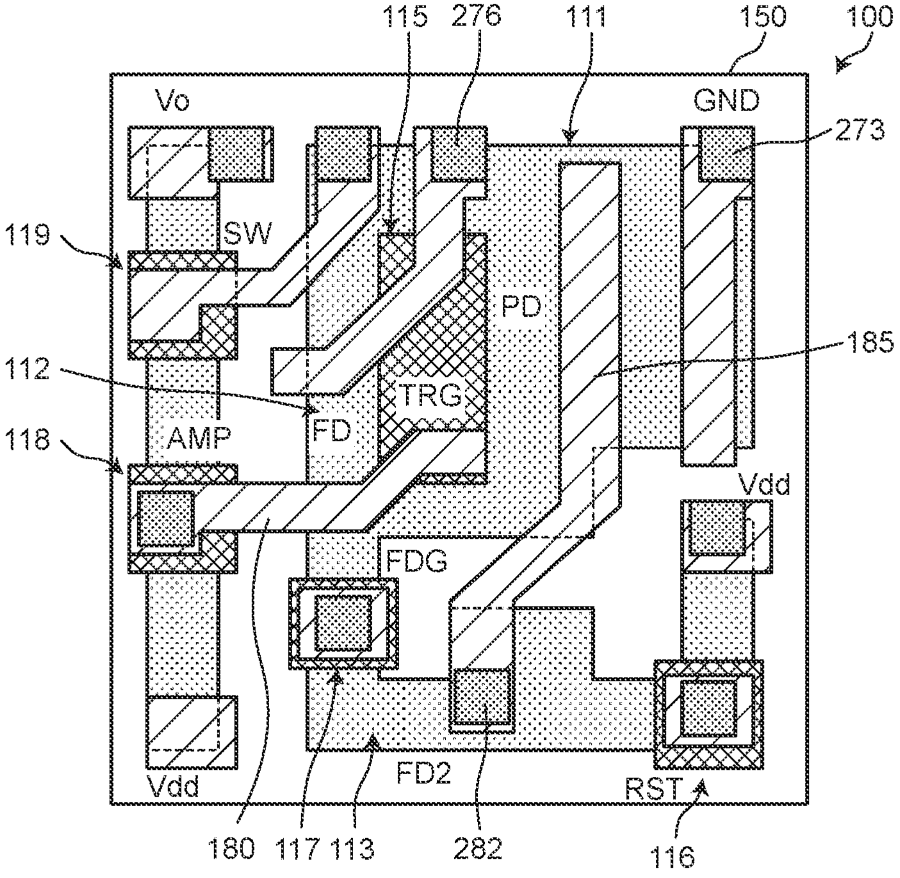
FIG. 48B is a plan view depicting a configuration example of the pixel according to the twelfth embodiment of the present disclosure.
Figure 48C:
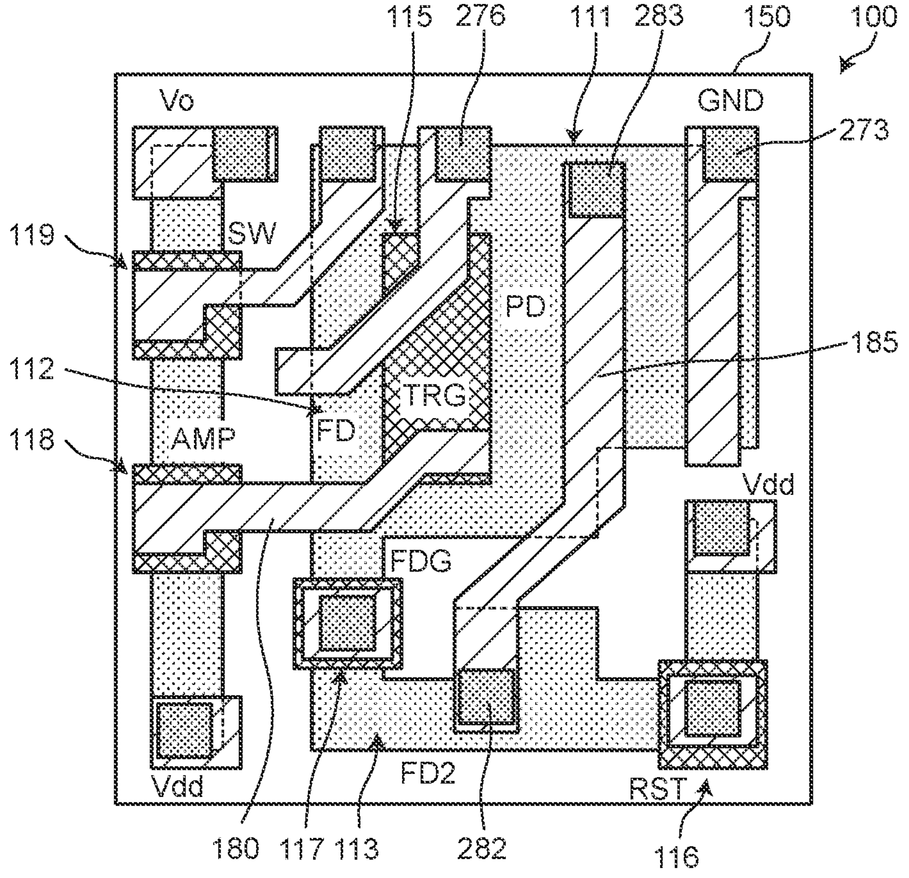
FIG. 48C is a plan view depicting a configuration example of the pixel according to the twelfth embodiment of the present disclosure.

FIGS. 48A to 48C are plan views depicting configuration examples of the pixel according to the twelfth embodiment of the present disclosure. The drawing is a plan view depicting a configuration example of the pixel 100 as in FIG. 36. Note that the pixel 100 in the same drawing is a diagram depicting an example of a case where the second coupling unit 410 and the third charge holding unit 411 in FIG. 47 are omitted.

In FIG. 48A, the coupling unit 117 (FDG) is disposed on a lower side of the charge holding unit 112 (FD). The second charge holding unit 113 (FD2) is disposed on a lower side of the coupling unit 117. The first reset unit 116 (RST) is disposed on a right side of the second charge holding unit 113. Further, the second charge holding unit wiring 185 is disposed in the second charge holding unit 113. The second charge holding unit wiring 185 in the drawing is a wiring configured in a relatively long shape. By disposing the second charge holding unit wiring 185, the capacitance added to the second charge holding unit 113 can be increased.

FIG. 48B depicts an example of a case where the capacitance addition wiring 280 of the charge holding unit wiring 180 is deleted and the capacitance addition wiring 282 is disposed on the second charge holding unit wiring 185.

FIG. 48C depicts an example of a case where the capacitance addition wiring 282 and the capacitance addition wiring 283 are disposed on the second charge holding unit wiring 185.

Figure 49A:
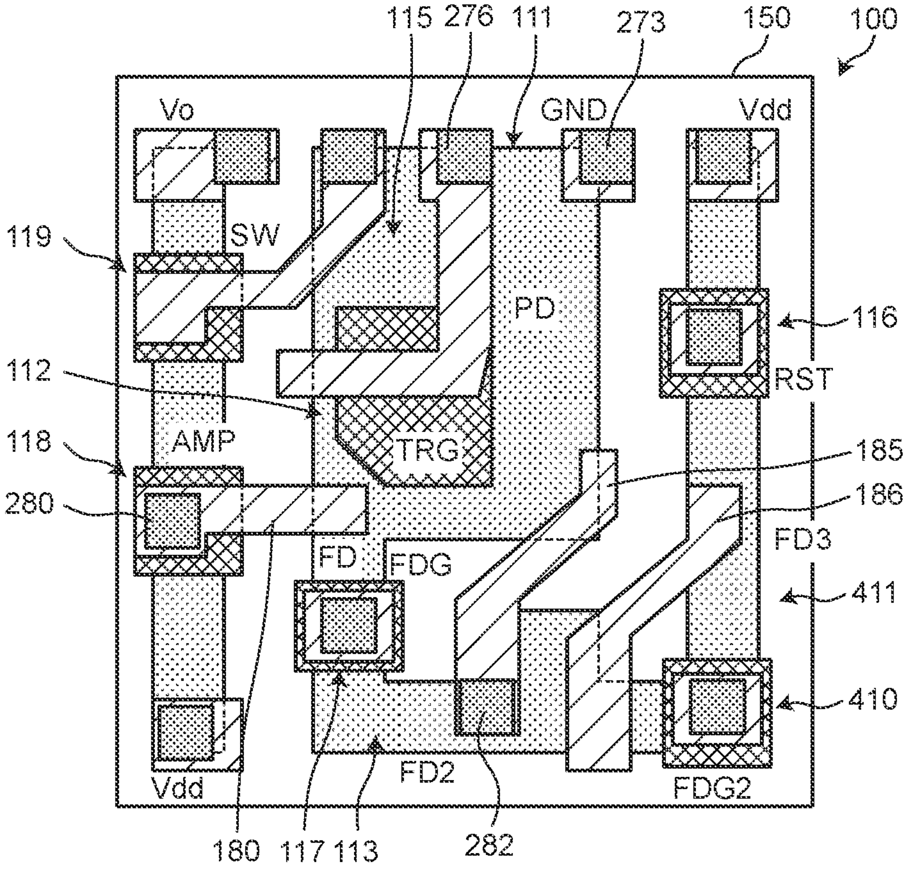
FIG. 49A is a plan view depicting a configuration example of the pixel according to the twelfth embodiment of the present disclosure.
Figure 49B:
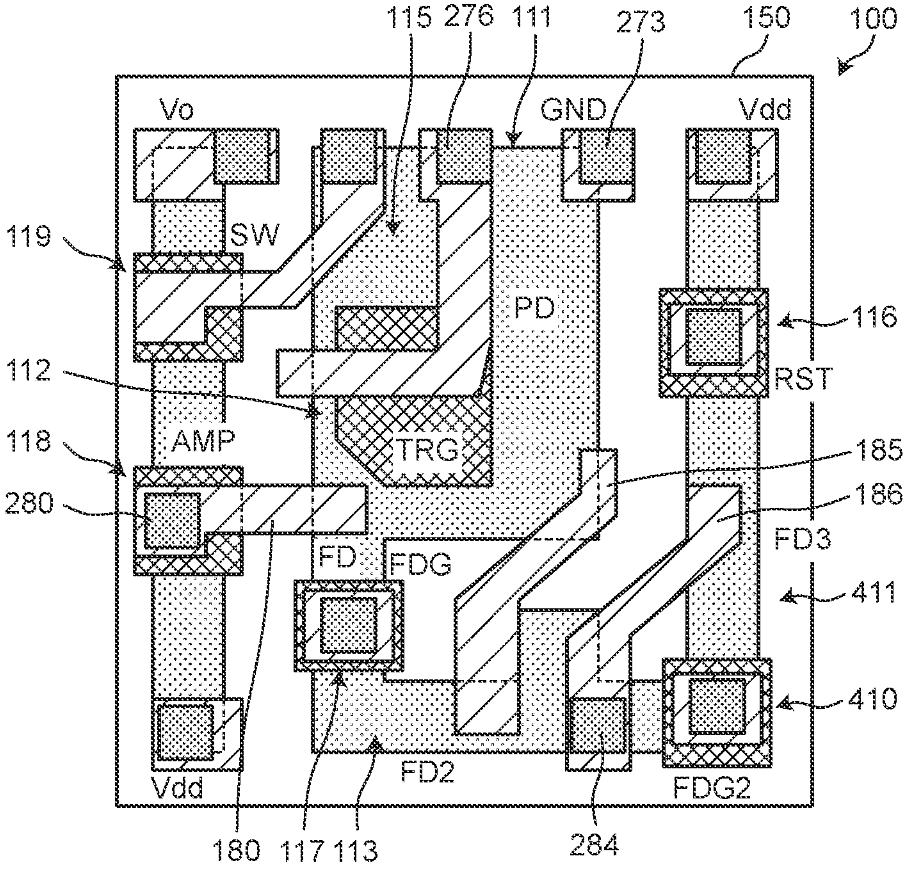
FIG. 49B is a plan view depicting a configuration example of the pixel according to the twelfth embodiment of the present disclosure.

FIGS. 49A and 49B are plan views depicting configuration examples of the pixel according to the twelfth embodiment of the present disclosure. The drawing is a plan view depicting a configuration example of the pixel 100 as in FIG. 48A and the like. It is different from FIG. 48A and the like in that the second coupling unit 410 and the third charge holding unit 411 are disposed.

In FIGS. 49A and 49B, the second coupling unit 410 (FDG2) is disposed on a right side of the second charge holding unit 113. The third charge holding unit 411 (FD3) is disposed on an upper side of the second coupling unit 410. The first reset unit 116 is disposed on an upper side of the third charge holding unit 411. Further, the second charge holding unit wiring 185 is disposed in the second charge holding unit 113. Further, the third charge holding unit wiring 186 is disposed in the third charge holding unit 411. By disposing the third charge holding unit wiring 186, the capacitance added to the third charge holding unit 411 can be increased. FIG. 49A depicts an example in which the capacitance addition wiring 282 is disposed on the second charge holding unit wiring 185. Further, FIG. 49B depicts an example in which a capacitance addition wiring 284 is disposed on the third charge holding unit wiring 186.

The configuration of the photodetection device 1 other than this is similar to the configuration of the photodetection device 1 in the eleventh embodiment of the present disclosure, and thus the description thereof will be omitted.

As described above, the pixel 100 according to the twelfth embodiment of the present disclosure further includes the second coupling unit 410 and the third charge holding unit 411. Thus, the sensitivity of the pixel 100 can be adjusted in three stages.

13. Thirteenth Embodiment

The pixel 100 according to the above-described first embodiment includes a circuit that generates a signal based on the charge of the charge holding unit 112. On the other hand, a pixel 100 according to a thirteenth embodiment of the present disclosure is different from the above-described first embodiment in that the circuit that generates the signal based on the charge of the charge holding unit 112 is shared by a plurality of pixels 100.

[Configuration of Plane of Pixel]

Figure 50:
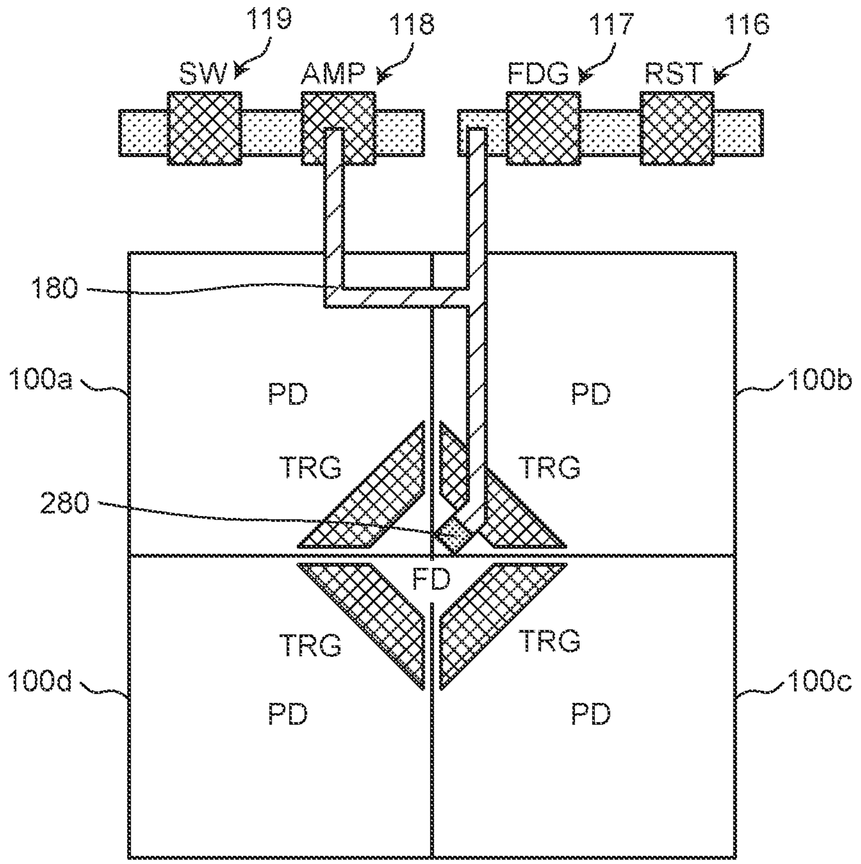
FIG. 50 is a plan view depicting a configuration example of pixels according to a thirteenth embodiment of the present disclosure.

FIG. 50 is a plan view depicting a configuration example of pixels according to the thirteenth embodiment of the present disclosure. This drawing depicts an example in which the pixels 100*a*, 100*b*, 100*c*, and 100*d* each including the photoelectric conversion unit 111 (PD) and the charge transfer unit 115 (TRG) are arranged in two rows and two columns, and the common charge holding unit 112 (FD) is included. Further, the first reset unit 116, the coupling unit 117, the amplification unit 118, and the first selection unit 119 are disposed adjacent to the pixels 100*a* to 100*d*. Further, the charge holding unit wiring 180 is connected to the common charge holding unit 112 of the pixels 100*a* to 100*d*. The capacitance addition wiring 280 is connected to the charge holding unit wiring 180.

Figure 51A:
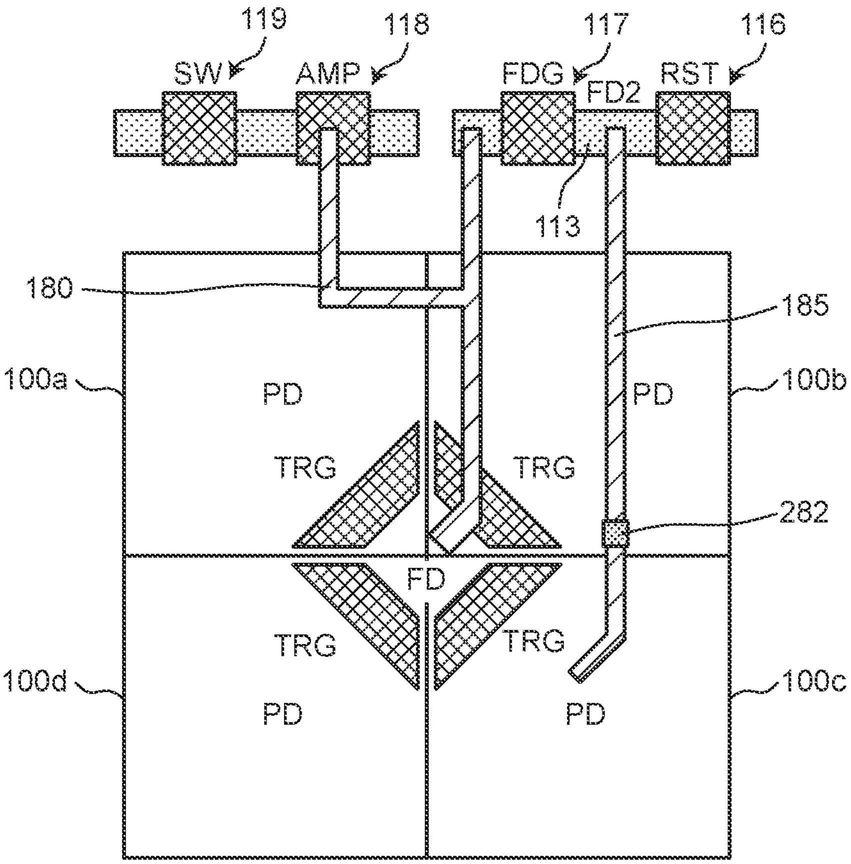
FIG. 51A is a plan view depicting another configuration example of the pixels according to the thirteenth embodiment of the present disclosure.
Figure 51B:
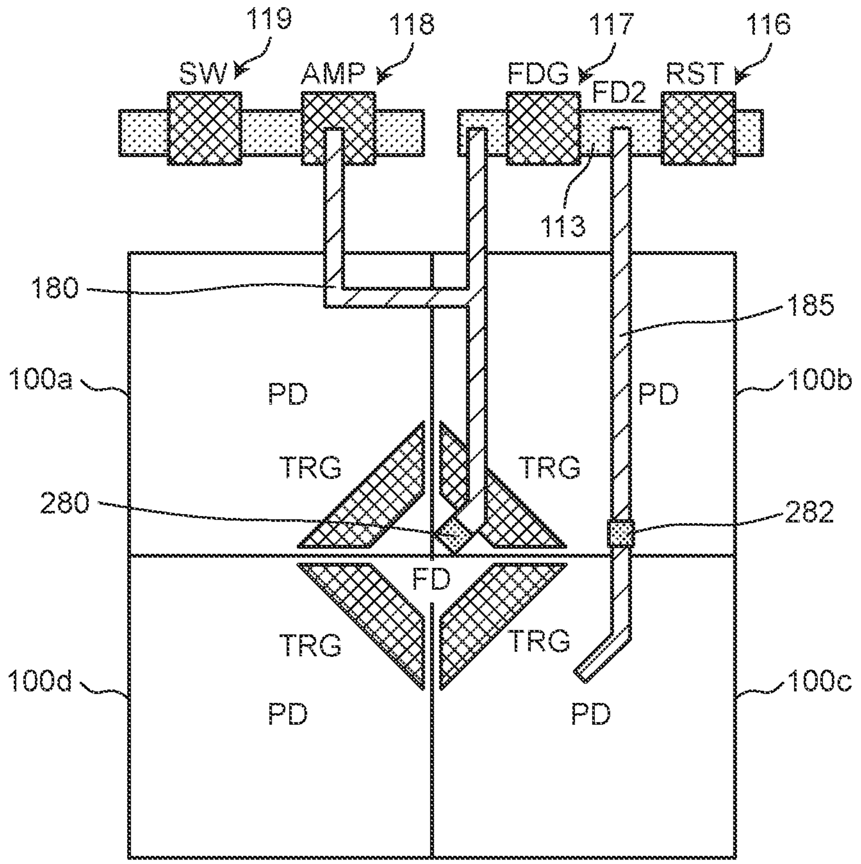
FIG. 51B is a plan view depicting another configuration example of the pixels according to the thirteenth embodiment of the present disclosure.

FIGS. 51A and 51B are plan views depicting other configuration examples of the pixels according to the thirteenth embodiment of the present disclosure. The drawings are plan views depicting configuration examples of the pixels 100*a* to 100*d* as in FIG. 50. They are different from the pixels 100*a* to 100*d* in FIG. 50 in further including the second charge holding unit wiring 185. FIG. 51A depicts an example of a case where the capacitance addition wiring 282 is disposed on the second charge holding unit wiring 185. Further, FIG. 51B depicts an example in a case where the capacitance addition wiring 280 is disposed on the charge holding unit wiring 180 and the capacitance addition wiring 282 is disposed on the second charge holding unit wiring 185.

The configuration of the photodetection device 1 other than this is similar to the configuration of the photodetection device 1 in the eleventh embodiment of the present disclosure, and thus the description thereof will be omitted.

As described above, the pixel 100 according to the thirteenth embodiment of the present disclosure shares the circuit that generates the signal based on the charge of the charge holding unit 112 in the plurality of pixels 100. Thus, the size of the photodetection device 1 can be reduced.

14. Fourteenth Embodiment

Variations of the capacitance addition wiring 280 will be described.

[Configuration of Cross-Section of Pixel]

Figure 52A:
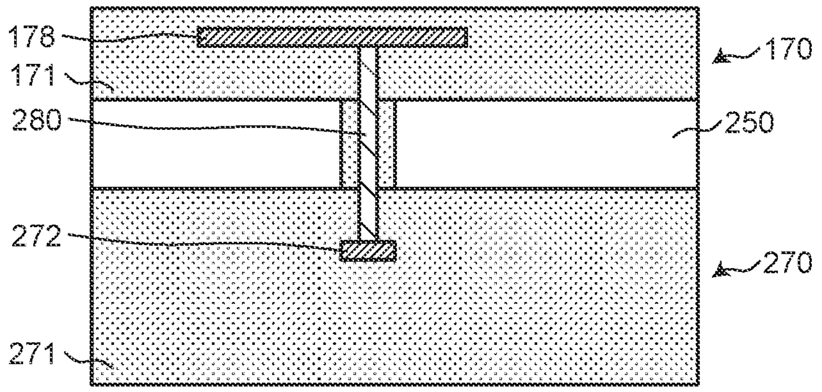
FIG. 52A is a cross-sectional view depicting a configuration example of a capacitance addition wiring according to a fourteenth embodiment of the present disclosure.
Figure 52B:
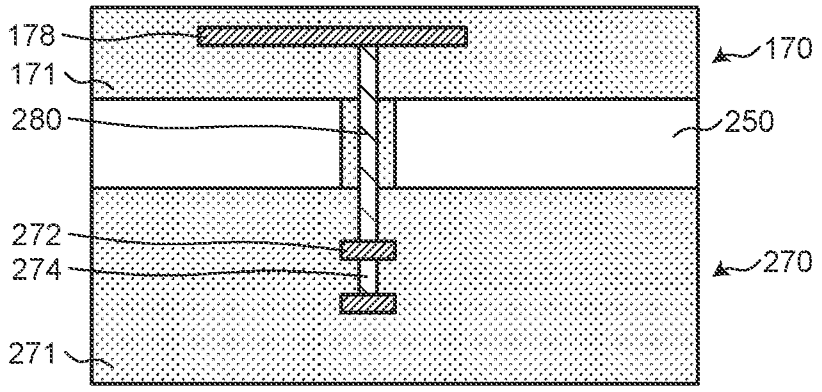
FIG. 52B is a cross-sectional view depicting a configuration example of a capacitance addition wiring according to the fourteenth embodiment of the present disclosure.
Figure 52C:
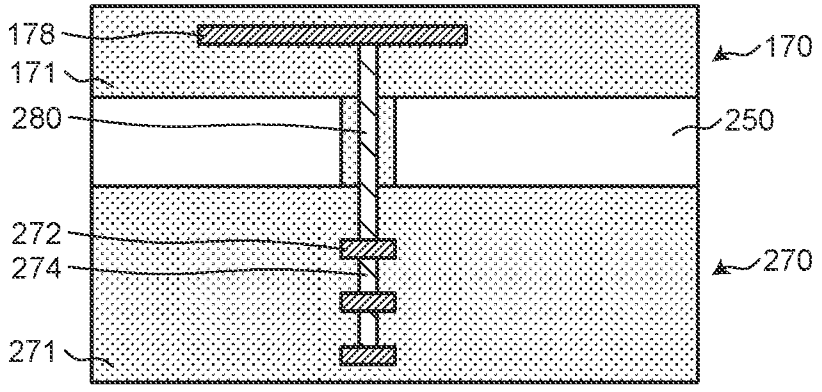
FIG. 52C is a cross-sectional view depicting a configuration example of a capacitance addition wiring according to the fourteenth embodiment of the present disclosure.

FIGS. 52A to 52C are cross-sectional views depicting configuration examples of a capacitance addition wiring according to a fourteenth embodiment of the present disclosure. FIG. 52A is a view depicting an example in which a first-layer wiring 272 of the wiring region 270 is connected to the capacitance addition wiring 280. FIG. 52B is a view depicting an example in which first-layer and second-layer wirings 272 are connected to the capacitance addition wiring 280. The wirings disposed in different layers are connected by the via plug 274. FIG. 52C is a view depicting an example in which first to third layer wirings 272 are connected to the capacitance addition wiring 280.

In this way, by connecting the wiring 272 to the capacitance addition wiring 280, the stray capacitance of the capacitance addition wiring 280 can be further increased.

15. Application Example

Figure 53:
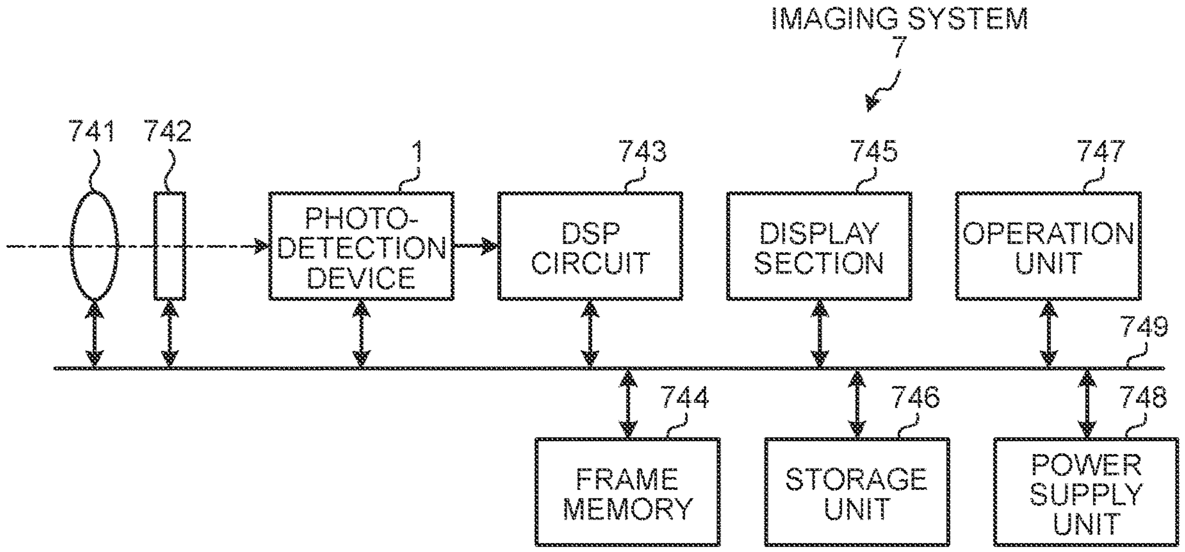
FIG. 53 is a diagram depicting an example of a schematic configuration of an imaging system including the imaging device according to the above-described embodiment and modifications thereof.

FIG. 53 depicts an example of a schematic configuration of an imaging system 7 including the photodetection device 1 according to the above-described embodiment and the modifications thereof.

The imaging system 7 is, for example, an electronic device such as an imaging device such as a digital still camera or a video camera, or a portable terminal device such as a smartphone or a tablet terminal. The imaging system 7 includes, for example, the photodetection device 1 according to the above-described embodiment and the modifications thereof, an optical system including an imaging lens driving mechanism 741 and a diaphragm mechanism 742, a DSP circuit 743, a frame memory 744, a display section 745, a storage unit 746, an operation unit 747, and a power supply unit 748. In the imaging system 7, the photodetection device 1, the imaging lens driving mechanism 741, the mechanism 742, the DSP circuit 743, the frame memory 744, the display section 745, the storage unit 746, the operation unit 747, and the power supply unit 748 according to the above-described embodiment and the modifications thereof are connected to each other via a bus line 749.

The photodetection device 1 according to the above-described embodiment and the modifications thereof outputs image data corresponding to incident light. The DSP circuit 743 is a signal processing circuit that processes a signal (image data) output from the photodetection device 1 according to the above-described embodiment and the modifications thereof. The frame memory 744 temporarily holds the image data processed by the DSP circuit 743 in units of frames. The display section 745 includes, for example, a panel-type display device such as a liquid crystal panel or an organic electro luminescence (EL) panel, and displays a moving image or a still image captured by the photodetection device 1 according to the above-described embodiment and the modifications thereof. The storage unit 746 records image data of a moving image or a still image captured by the photodetection device 1 according to the above-described embodiment and the modifications thereof in a recording medium such as a semiconductor memory or a hard disk. The operation unit 747 issues operation commands for various functions of the imaging system 7 in accordance with an operation by the user. The power supply unit 748 appropriately supplies various power supplies serving as operation power supplies for the photodetection device 1, the DSP circuit 743, the frame memory 744, the display section 745, the storage unit 746, and the operation unit 747 according to the above-described embodiment and the modifications thereof to these supply targets.

Next, an imaging procedure in the imaging system 7 will be described.

Figure 54:
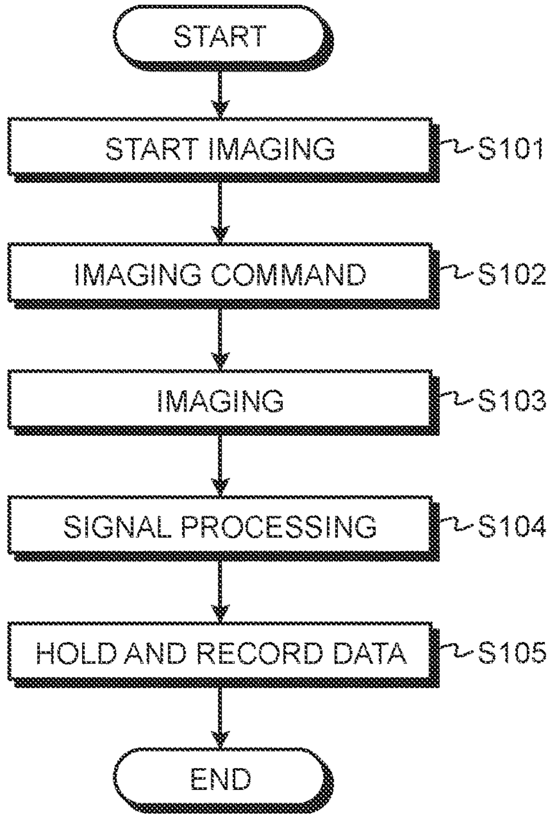
FIG. 54 is a diagram depicting an example of an imaging procedure of the imaging system depicted in FIG. 54.

FIG. 54 depicts an example of a flowchart of an imaging operation in the imaging system 7. The user instructs start of imaging by operating the operation unit 747 (Step S101). Then, the operation unit 747 transmits an imaging command to the photodetection device 1 (Step S102). Upon receiving the imaging command, the photodetection device 1 (specifically, the system control circuit 36) executes imaging by a predetermined imaging method (Step S103).

The photodetection device 1 outputs image data obtained by imaging to the DSP circuit 743. Here, the image data is data for all pixels of a pixel signal generated on the basis of the charge temporarily held in the floating diffusion FD. The DSP circuit 743 performs predetermined signal processing (for example, noise reduction processing or the like) on the basis of the image data input from the photodetection device 1 (Step S104). The DSP circuit 743 causes the frame memory 744 to hold the image data subjected to predetermined signal processing, and the frame memory 744 causes the storage unit 746 to store the image data (Step S105). In this manner, imaging in the imaging system 7 is performed.

In the present application example, the photodetection device 1 according to the above-described embodiment and the modifications thereof is applied to the imaging system 7. Thus, since the photodetection device 1 can be downsized or have high definition, it is possible to provide the small or high definition imaging system 7.

16. Application Example to Mobile Body

The technology according to the present disclosure (present technology) can be applied to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a boat, a robot, and the like.

Figure 55:
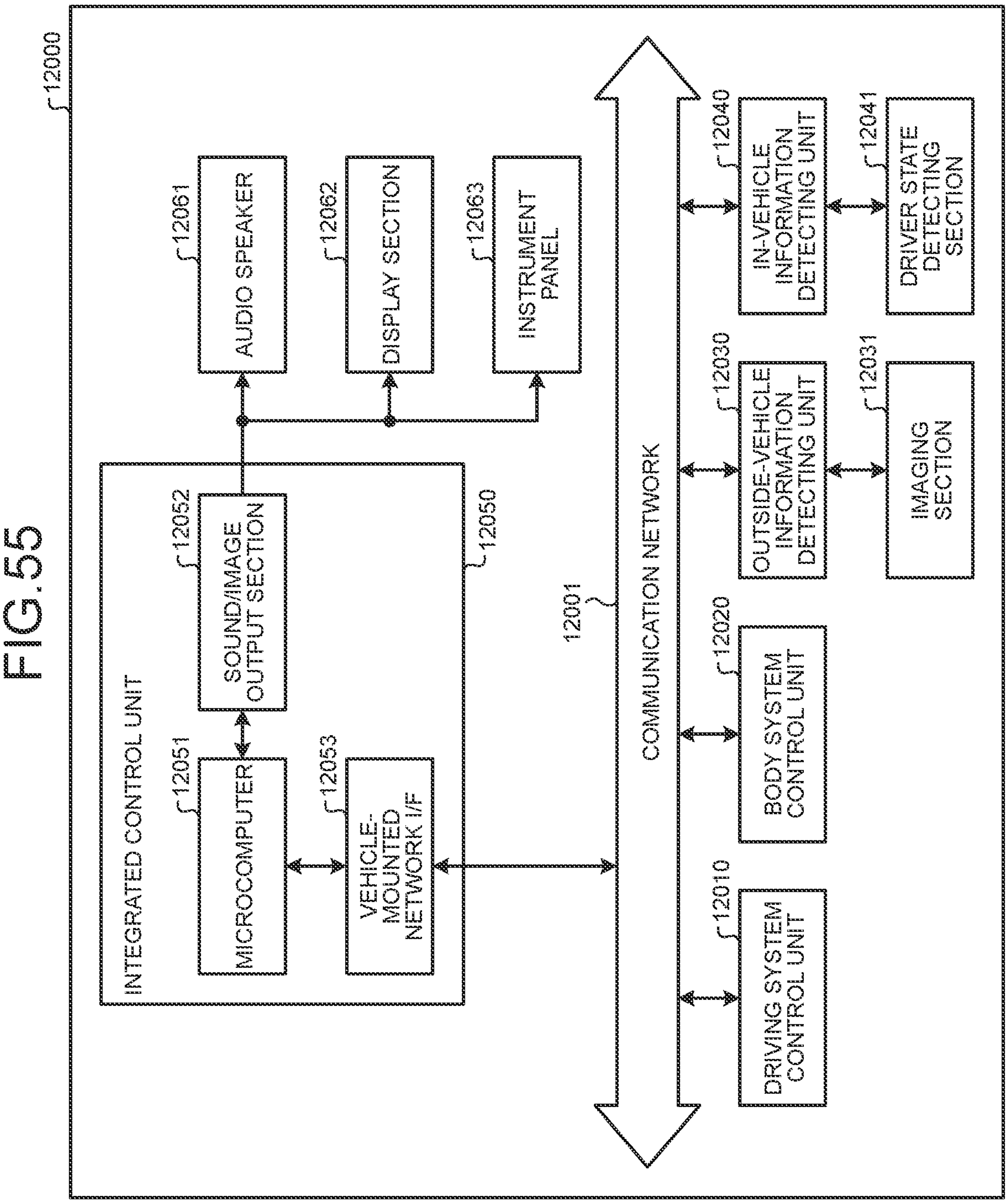
FIG. 55 is a block diagram depicting an example of schematic configuration of a vehicle control system.

FIG. 55 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 56, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

Figure 56:
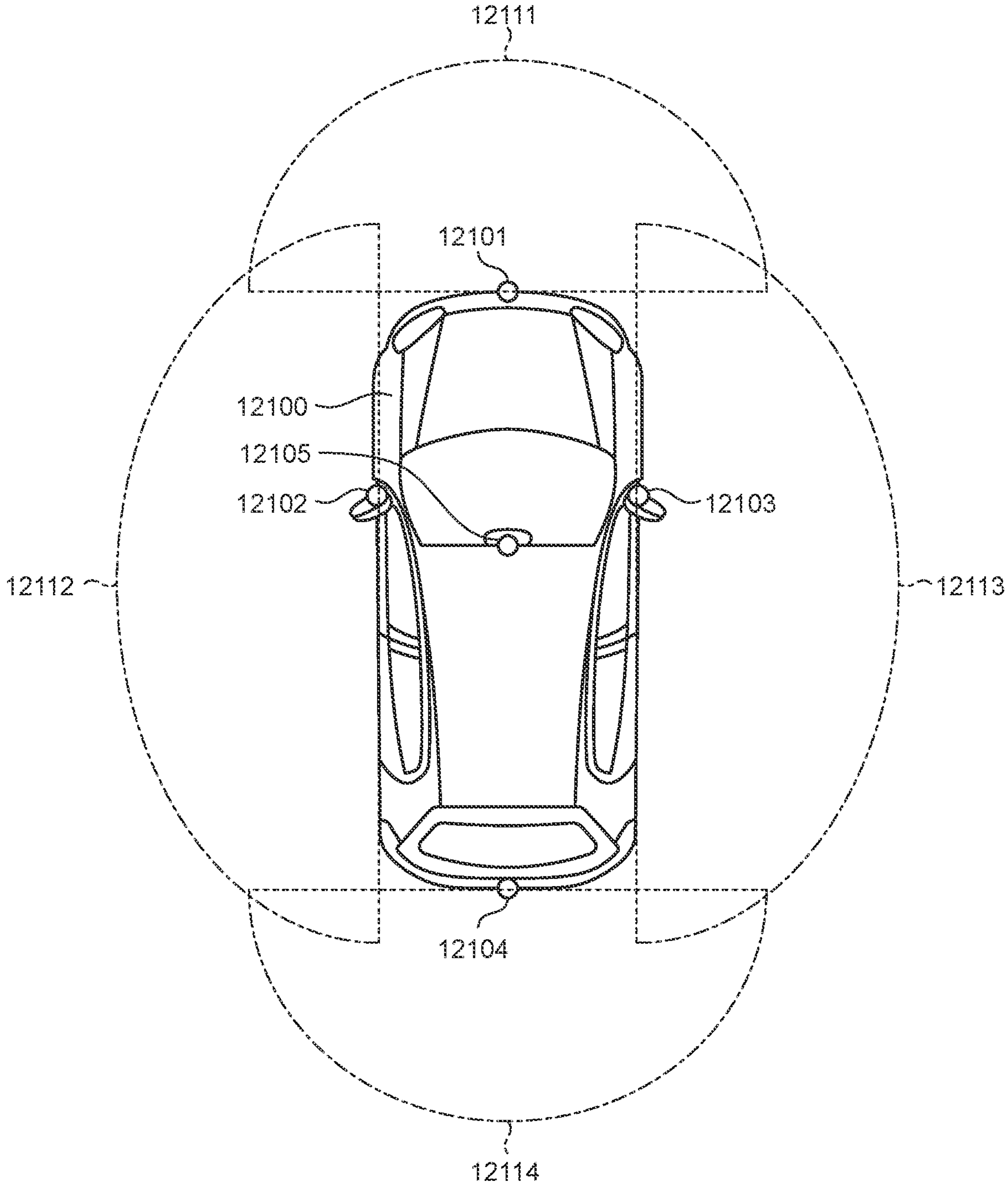
FIG. 56 is a diagram of assistance in explaining an example of installation positions of an outside-vehicle information detecting section and an imaging section.

The sound/image output section 12052 transmits an output signal of at least one of a sound and an image to an output device capable of visually or auditorily notifying information to an occupant of the vehicle or the outside of the vehicle. In the example of FIG. 56, an audio speaker 12061, a display section 12062, and an instrument panel 12063 are illustrated as the output device. The display section 12062 may, for example, include at least one of an on-board display and a head-up display.

FIG. 56 is a diagram depicting an example of the installation position of the imaging section 12031.

In FIG. 56, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 56 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 among the configurations described above. Specifically, the photodetection device 1 of FIG. 1 can be applied to the imaging section 12031. By applying the technology according to the present disclosure to the imaging section 12031, the imaging section 12031 can be downsized.

17. Application Example to Endoscopic Surgery System

The technology according to the present disclosure (present technology) can be applied to various products. For example, the technology according to the present disclosure may be applied to an endoscopic surgery system.

Figure 57:
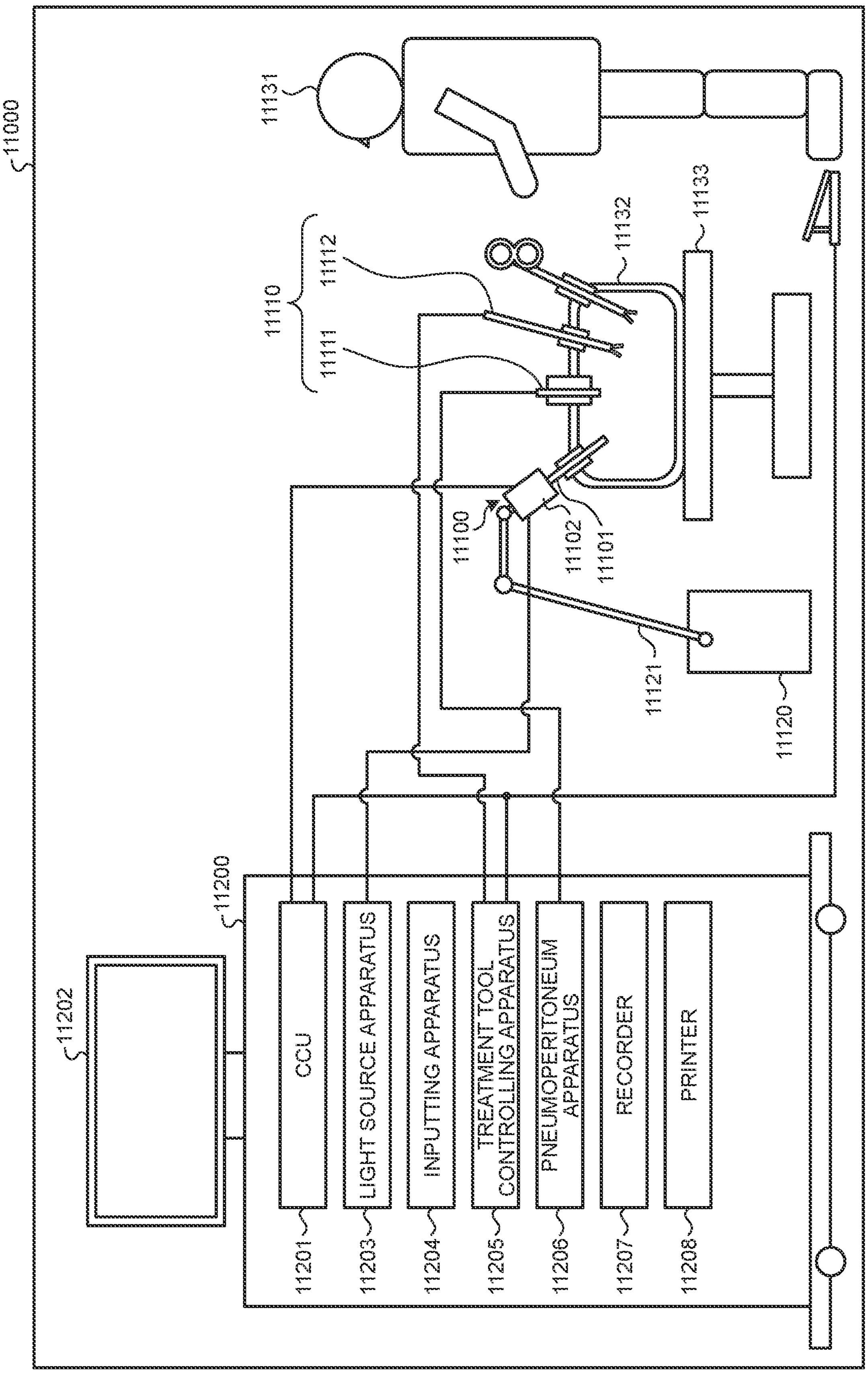
FIG. 57 is a view depicting an example of a schematic configuration of an endoscopic surgery system.

FIG. 57 is a view depicting an example of a schematic configuration of an endoscopic surgery system to which the technology according to an embodiment of the present disclosure (present technology) can be applied.

In FIG. 57, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 58:
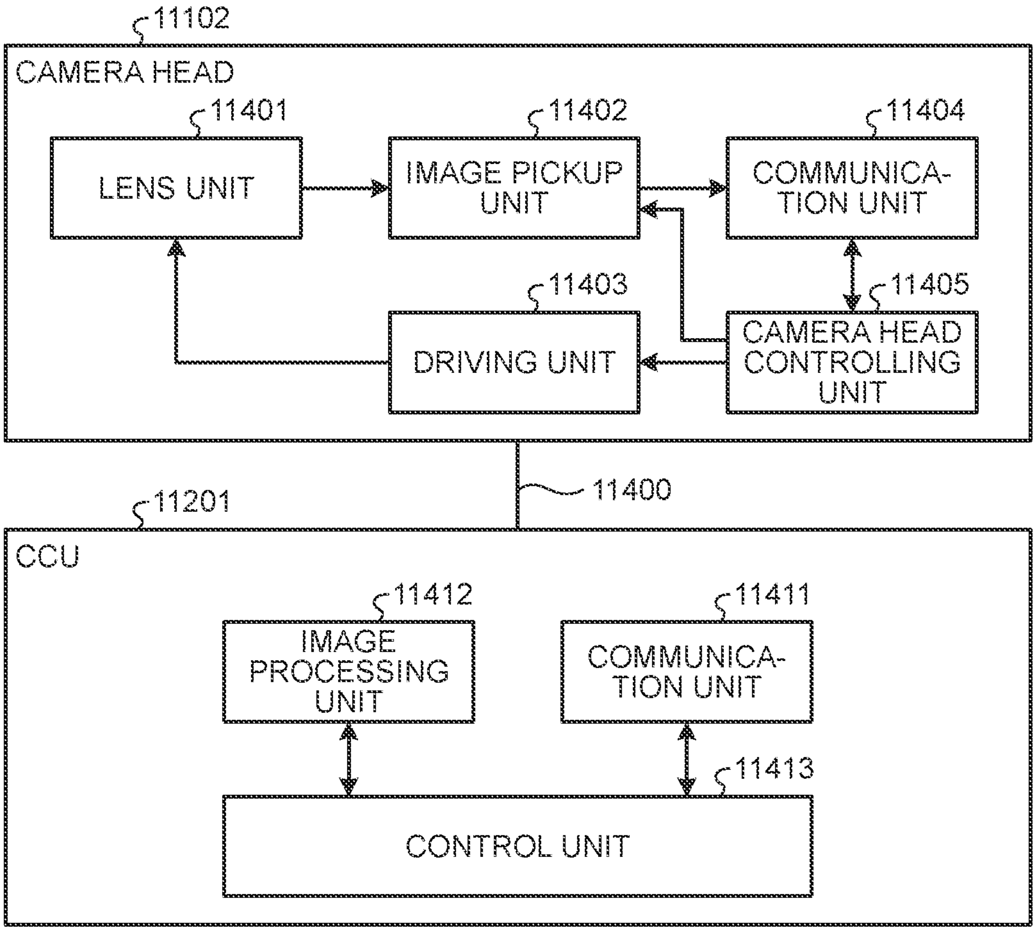
FIG. 58 is a block diagram depicting an example of a functional configuration of a camera head and a camera control unit (CCU).

FIG. 58 is a block diagram depicting an example of a functional configuration of the camera head 11102 and the CCU 11201 depicted in FIG. 57.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the endoscope 11100 and the image pickup unit 11402 of the camera head 11102 among the above-described configurations. Specifically, the photodetection device 1 of FIG. 1 can be applied to the image pickup unit 11402. By applying the technology according to the present disclosure to the image pickup unit 11402, the image pickup unit 11402 can be downsized.

Note that, here, the endoscopic surgery system has been described as an example, but the technology according to the present disclosure may be applied to, for example, a microscopic surgery system or the like.

Note that the effects described in the present specification are merely examples and are not limited, and other effects may be provided.

Note that the present technology can also have the following configurations.

(1)

A photodetection element, comprising:

a photoelectric conversion unit that is formed on a semiconductor substrate and generates a charge corresponding to incident light;

a charge transfer unit that transfers the charge to a charge holding unit that holds the charge;

a first reset unit that is disposed adjacent to the charge holding unit and resets the charge holding unit;

an amplification unit that generates a signal corresponding to the charge held in the charge holding unit and outputs the signal to a predetermined first output node;

a constant current circuit that is connected to the first output node and constitutes a load of the amplification unit;

a first capacitive element that has one end connected to the first output node and holds a reset level that is a level of the signal at a time of resetting by the first reset unit;

a second capacitive element that has one end connected to the first output node and holds an image signal level that is a level of the signal when the charge is transferred to the charge holding unit;

a first switch element that is connected between another end of the first capacitive element and a predetermined second output node and controls a current flowing through the first capacitive element;

a second switch element that is connected between another end of the second capacitive element and the second output node and controls a current flowing through the second capacitive element;

a second reset unit that resets the second output node;

a readout circuit that is connected to the second output node, reads each of the reset level held in the first capacitive element and the image signal level held in the second capacitive element, and outputs the reset level and the image signal level as a reset signal and an image signal, respectively; and a substrate contact that supplies a reference potential to the semiconductor substrate.

(2)

The photodetection element according to the above (1), further comprising a charge discharge unit that discharges a charge of the photoelectric conversion unit.

(3)

The photodetection element according to the above (1) or (2), further comprising:

a second charge holding unit that holds the charge; and a coupling unit that couples the charge holding unit and the second charge holding unit, wherein the first reset unit resets the charge holding unit via the coupling unit.

(4)

The photodetection element according to any one of the above (1) to (3), further comprising a selection unit connected between the amplification unit and the first output node.

(5)

The photodetection element according to any one of the above (1) to (4), further comprising a plurality of pixels including the photoelectric conversion unit, the charge transfer unit, the first reset unit, the amplification unit, the constant current circuit, the first capacitive element, the second capacitive element, the first switch element, the second switch element, the second reset unit, the readout circuit, and the substrate contact.

(6)

The photodetection element according to the above (5), wherein the pixels that are adjacent to each other share the substrate contact, and the photoelectric conversion unit, the charge transfer unit, the first reset unit, the amplification unit, the constant current circuit, the first capacitive element, the second capacitive element, the first switch element, the second switch element, the second reset unit, and the readout circuit are disposed symmetrically to each other.

(7)

The photodetection element according to the above (5), wherein the second reset unit and the readout circuit are shared by the pixels that are adjacent to each other.

(8)

The photodetection element according to any one of the above (1) to (7), further comprising:

a second semiconductor substrate that is stacked on the semiconductor substrate and includes the constant current circuit, the first capacitive element, the second capacitive element, the first switch element, the second switch element, and the second reset unit; and a second substrate contact that supplies a reference potential to the second semiconductor substrate, wherein the charge transfer unit, the first reset unit, the amplification unit, and the substrate contact are formed on the semiconductor substrate.

(9)

The photodetection element according to the above (8), wherein the charge holding unit includes a floating diffusion layer that is a semiconductor region formed in a diffusion layer of the semiconductor substrate.

(10)

The photodetection element according to the above (9), wherein the charge holding unit is disposed between the charge transfer unit and the first reset unit.

(11)

The photodetection element according to the above (9), wherein the amplification unit is disposed in a normal direction of a line connecting the charge holding unit and the first reset unit.

(12)

The photodetection element according to the above (9), further comprising:

a second charge holding unit that is formed on the semiconductor substrate and holds the charge; and a coupling unit that is formed on the semiconductor substrate and couples the charge holding unit and the second charge holding unit, wherein the first reset unit resets the charge holding unit via the coupling unit.

(13)

The photodetection element according to the above (12), wherein the charge holding unit is disposed between the charge transfer unit and the coupling unit.

(14)

The photodetection element according to the above (12), wherein the amplification unit is disposed in a normal direction of a line connecting the charge holding unit and the coupling unit.

(15)

The photodetection element according to the above (9), further comprising:

a charge discharge unit that is formed on the semiconductor substrate and discharges a charge of the photoelectric conversion unit, wherein the first reset unit is formed in a same diffusion layer as the charge discharge unit.

(16)

The photodetection element according to the above (8), wherein the semiconductor substrate is stacked on a side of a surface of the second semiconductor substrate on which a wiring region is formed.

(17)

The photodetection element according to the above (8), wherein the semiconductor substrate is stacked on a side different from a surface of the second semiconductor substrate on which a wiring region is formed.

(18)

The photodetection element according to any one of the above (1) to (17), wherein the constant current circuit includes two MOS transistors connected in series and each having a gate to which a bias voltage is applied.

(19)

A photodetection device, comprising:

a photoelectric conversion unit that is formed on a semiconductor substrate and generates a charge corresponding to incident light;

a charge transfer unit that transfers the charge to a charge holding unit that holds the charge;

a first reset unit that is disposed adjacent to the charge holding unit and resets the charge holding unit;

an amplification unit that generates a signal corresponding to the charge held in the charge holding unit and outputs the signal to a predetermined first output node;

a constant current circuit that is connected to the first output node and constitutes a load of the amplification unit;

a first capacitive element that has one end connected to the first output node and holds a reset level that is a level of the signal at a time of resetting by the first reset unit;

a second capacitive element that has one end connected to the first output node and holds an image signal level that is a level of the signal when the charge is transferred to the charge holding unit;

a first switch element that is connected between another end of the first capacitive element and a predetermined second output node and controls a current flowing through the first capacitive element;

a second switch element that is connected between another end of the second capacitive element and the second output node and controls a current flowing through the second capacitive element;

a second reset unit that resets the second output node;

a readout circuit that is connected to the second output node, reads each of the reset level held in the first capacitive element and the image signal level held in the second capacitive element, and outputs the reset level and the image signal level as a reset signal and an image signal, respectively;

a substrate contact that supplies a reference potential to the semiconductor substrate; and a processing circuit that processes the reset signal and the image signal.

(20)

A photodetection element, comprising:

a photoelectric conversion unit that is formed on a semiconductor substrate and generates a charge corresponding to incident light;

a charge transfer unit that transfers the charge to a charge holding unit that holds the charge;

a first reset unit that is disposed adjacent to the charge holding unit and resets the charge holding unit;

an amplification unit that generates a signal corresponding to the charge held in the charge holding unit and outputs the signal to a predetermined first output node;

a constant current circuit that is connected to the first output node and constitutes a load of the amplification unit;

a first capacitive element that holds a level of the signal at a time of resetting by the first reset unit;

a second capacitive element that holds a level of the signal when the charge is transferred to the charge holding unit;

a capturing unit that transmits the signal of the first output node to the first capacitive element and the second capacitive element;

a second reset unit that resets a second output node to which another end of the first capacitive element is connected;

a readout circuit that is connected to the second output node, reads levels of the signal held in the first capacitive element and the second capacitive element, and outputs the levels as an image signal; and a substrate contact that supplies a reference potential to the semiconductor substrate.

(21)

The photodetection element according to the above (20), further comprising a charge discharge unit that discharges a charge of the photoelectric conversion unit.

(22)

The photodetection element according to the above (20), further comprising:

a second charge holding unit that holds the charge; and a coupling unit that couples the charge holding unit and the second charge holding unit, wherein the first reset unit resets the charge holding unit via the coupling unit.

(23)

The photodetection element according to the above (22), wherein the first reset unit and the coupling unit are formed in a common diffusion layer.

(24)

The photodetection element according to any one of the above (20) to (23), wherein the readout circuit includes a second amplification unit that generates a signal of a voltage corresponding to a signal level of the second output node as the image signal, and a first selection unit that selects and outputs the generated image signal.

(25)

The photodetection element according to the above (24), wherein the amplification unit and the second amplification unit are formed in a common diffusion layer.

(26)

The photodetection element according to the above (24), further comprising a second selection unit that selects and outputs a level of a signal of the first output node.

(27)

The photodetection element according to the above (26), wherein the first selection unit and the second selection unit are formed in a common diffusion layer.

(28)

The photodetection element according to the above (20), comprising a pixel including the photoelectric conversion unit, the charge transfer unit, the first reset unit, the amplification unit, the constant current circuit, the first capacitive element, the second capacitive element, the capturing unit, the second reset unit, the readout circuit, and the substrate contact.

(29)

The photodetection element according to the above (28), wherein the pixel has a square shape in plan view.

(30)

A photodetection element, comprising:

a photoelectric conversion unit that is formed on a first semiconductor substrate and generates a charge corresponding to incident light;

a charge holding unit that is formed on the first semiconductor substrate and holds the charge;

a charge transfer unit that transfers a charge of the photoelectric conversion unit to the charge holding unit;

an amplification unit that is formed on the first semiconductor substrate, generates a signal corresponding to the charge held in the charge holding unit, and outputs the signal to a predetermined output node;

a reset unit that resets the charge holding unit;

a substrate contact that supplies a reference potential to the first semiconductor substrate;

a signal processing circuit that is disposed on a second semiconductor substrate stacked on a side of a wiring region of the first semiconductor substrate and processes a signal of the output node;

a charge holding unit wiring that is a wiring disposed in the wiring region of the first semiconductor substrate and connecting the charge holding unit and the amplification unit; and a capacitance addition wiring that is connected to the charge holding unit wiring and adds a capacitance to the charge holding unit, and is configured as a through wiring having a shape penetrating the second semiconductor substrate.

(31)

The photodetection element according to the above (30), further comprising a separation layer disposed between the capacitance addition wiring and the second semiconductor substrate.

(32)

The photodetection element according to the above (31), wherein the separation layer is disposed in an opening formed in the second semiconductor substrate, and a plurality of the through wirings including the capacitance addition wiring is disposed in the opening.

(33)

The photodetection element according to any one of the above (30) to (32), further comprising a plurality of the capacitance addition wirings connected to the charge holding unit wiring.

(34)

The photodetection element according to any one of the above (30) to (33), further comprising:

a second charge holding unit that is formed on the first semiconductor substrate and holds the charge; and a coupling unit that is formed on the first semiconductor substrate and couples the charge holding unit and the second charge holding unit, wherein the reset unit resets the charge holding unit via the coupling unit.

(35)

The photodetection element according to the above (34), wherein the capacitance addition wiring is connected to a second charge holding unit wiring that is a wiring disposed in the wiring region of the first semiconductor substrate and connecting the coupling unit and the second charge holding unit.

(36)

The photodetection element according to any one of the above (30) to (35), further comprising:

a plurality of pixels including the photoelectric conversion unit and the charge transfer unit; and the charge holding unit that holds charges of the plurality of pixels in common.

(37)

The photodetection element according to any one of the above (30) to (36), wherein the capacitance addition wiring is connected to a wiring disposed in a wiring region of the second semiconductor substrate.

REFERENCE SIGNS LIST

1 PHOTODETECTION DEVICE
10, 10*a*, 10*b* PIXEL ARRAY UNIT
30 COLUMN SIGNAL PROCESSING UNIT
50 LOGIC CIRCUIT
90 SIGNAL PROCESSING CIRCUIT
100, 100*a*, 100*b*, 100*c*, 100*d* PIXEL
101 FIRST OUTPUT NODE
102 SECOND OUTPUT NODE
105, 105*a*, 105*b*, 105*c*, 105*d* CONSTANT CURRENT CIRCUIT
107 WELL CONTACT
108, 109, 509 MOS TRANSISTOR
110, 110*a*, 110*b*, 110*c*, 110*d* PRE-STAGE CIRCUIT
111, 511 PHOTOELECTRIC CONVERSION UNIT
112 CHARGE HOLDING UNIT
113 SECOND CHARGE HOLDING UNIT
114 CHARGE DISCHARGE UNIT
115, 515 CHARGE TRANSFER UNIT
116, 516 FIRST RESET UNIT
117, 517 COUPLING UNIT
118, 518 AMPLIFICATION UNIT
119 FIRST SELECTION UNIT
120 POST-STAGE CIRCUIT
121, 521 SECOND RESET UNIT
122, 522 SECOND AMPLIFICATION UNIT
123, 524 SECOND SELECTION UNIT
130, 130*a*, 130*b*, 130*c*, 130*d* SIGNAL LEVEL HOLDING CIRCUIT
131, 531 FIRST CAPACITIVE ELEMENT
132, 532 SECOND CAPACITIVE ELEMENT
133 THIRD CAPACITIVE ELEMENT
134 FOURTH CAPACITIVE ELEMENT
135 FIRST SWITCH ELEMENT
136 SECOND SWITCH ELEMENT
137 THIRD SWITCH ELEMENT
138 FOURTH SWITCH ELEMENT
141 to 144, 243, 343 SEMICONDUCTOR REGION
150, 250, 350 SEMICONDUCTOR SUBSTRATE
161, 162, 262, 362 GATE
170, 270, 370 WIRING REGION
172, 183, 187, 272 WIRING
173, 181, 182 CONTACT PLUG
175, 379 INTERLAYER FILM
180 CHARGE HOLDING UNIT WIRING
185 SECOND CHARGE HOLDING UNIT WIRING
186 THIRD CHARGE HOLDING UNIT WIRING
258 SEPARATION LAYER
259 OPENING
273, 276, 290 THROUGH VIA
274 VIA PLUG
280 to 284 CAPACITANCE ADDITION WIRING
410 SECOND COUPLING UNIT

411 THIRD CHARGE HOLDING UNIT
523 SELECTION UNIT
539 SAMPLING UNIT
11402, 12031, 12101 to 12105 IMAGE PICKUP UNIT, IMAGING SECTION

What is claimed is:

1. A photodetection element, comprising:
a photoelectric conversion unit that is formed on a semiconductor substrate and generates a charge corresponding to incident light;
a charge transfer unit that transfers the charge to a charge holding unit that holds the charge;
a first reset unit that is disposed adjacent to the charge holding unit and resets the charge holding unit;
an amplification unit that generates a signal corresponding to the charge held in the charge holding unit and outputs the signal to a predetermined first output node;
a constant current circuit that is connected to the first output node and constitutes a load of the amplification unit;
a first capacitive element that has one end connected to the first output node and holds a reset level that is a level of the signal at a time of resetting by the first reset unit;
a second capacitive element that has one end connected to the first output node and holds an image signal level that is a level of the signal when the charge is transferred to the charge holding unit;
a first switch element that is connected between another end of the first capacitive element and a predetermined second output node and controls a current flowing through the first capacitive element;
a second switch element that is connected between another end of the second capacitive element and the second output node and controls a current flowing through the second capacitive element;
a second reset unit that resets the second output node;
a readout circuit that is connected to the second output node, reads each of the reset level held in the first capacitive element and the image signal level held in the second capacitive element, and outputs the reset level and the image signal level as a reset signal and an image signal, respectively; and
a substrate contact that supplies a reference potential to the semiconductor substrate.

2. The photodetection element according to claim 1, further comprising a charge discharge unit that discharges a charge of the photoelectric conversion unit.

3. The photodetection element according to claim 1, further comprising:
a second charge holding unit that holds the charge; and
a coupling unit that couples the charge holding unit and the second charge holding unit, wherein
the first reset unit resets the charge holding unit via the coupling unit.

4. The photodetection element according to claim 1, further comprising a selection unit connected between the amplification unit and the first output node.

5. The photodetection element according to claim 1, further comprising a plurality of pixels including the photoelectric conversion unit, the charge transfer unit, the first reset unit, the amplification unit, the constant current circuit, the first capacitive element, the second capacitive element, the first switch element, the second switch element, the second reset unit, the readout circuit, and the substrate contact.

6. The photodetection element according to claim 5, wherein the pixels that are adjacent to each other share the substrate contact, and the photoelectric conversion unit, the charge transfer unit, the first reset unit, the amplification unit, the constant current circuit, the first capacitive element, the second capacitive element, the first switch element, the second switch element, the second reset unit, and the readout circuit are disposed symmetrically to each other.

7. The photodetection element according to claim 5, wherein the second reset unit and the readout circuit are shared by the pixels that are adjacent to each other.

8. The photodetection element according to claim 1, further comprising:
a second semiconductor substrate that is stacked on the semiconductor substrate and includes the constant current circuit, the first capacitive element, the second capacitive element, the first switch element, the second switch element, and the second reset unit; and
a second substrate contact that supplies a reference potential to the second semiconductor substrate, wherein
the charge transfer unit, the first reset unit, the amplification unit, and the substrate contact are formed on the semiconductor substrate.

9. The photodetection element according to claim 8, wherein the charge holding unit includes a floating diffusion layer that is a semiconductor region formed in a diffusion layer of the semiconductor substrate.

10. The photodetection element according to claim 9, wherein the charge holding unit is disposed between the charge transfer unit and the first reset unit.

11. The photodetection element according to claim 9, wherein the amplification unit is disposed in a normal direction of a line connecting the charge holding unit and the first reset unit.

12. The photodetection element according to claim 9, further comprising:
a second charge holding unit that is formed on the semiconductor substrate and holds the charge; and
a coupling unit that is formed on the semiconductor substrate and couples the charge holding unit and the second charge holding unit, wherein
the first reset unit resets the charge holding unit via the coupling unit.

13. The photodetection element according to claim 12, wherein the charge holding unit is disposed between the charge transfer unit and the coupling unit.

14. The photodetection element according to claim 12, wherein the amplification unit is disposed in a normal direction of a line connecting the charge holding unit and the coupling unit.

15. The photodetection element according to claim 9, further comprising:
a charge discharge unit that is formed on the semiconductor substrate and discharges a charge of the photoelectric conversion unit, wherein
the first reset unit is formed in a same diffusion layer as the charge discharge unit.

16. The photodetection element according to claim 8, wherein the semiconductor substrate is stacked on a side of a surface of the second semiconductor substrate on which a wiring region is formed.

17. The photodetection element according to claim 8, wherein the semiconductor substrate is stacked on a side different from a surface of the second semiconductor substrate on which a wiring region is formed.

18. The photodetection element according to claim 1, wherein the constant current circuit includes two MOS transistors connected in series and each having a gate to which a bias voltage is applied.

19. A photodetection device, comprising:

a photoelectric conversion unit that is formed on a semiconductor substrate and generates a charge corresponding to incident light;

a charge transfer unit that transfers the charge to a charge holding unit that holds the charge;

a first reset unit that is disposed adjacent to the charge holding unit and resets the charge holding unit;

an amplification unit that generates a signal corresponding to the charge held in the charge holding unit and outputs the signal to a predetermined first output node;

a constant current circuit that is connected to the first output node and constitutes a load of the amplification unit;

a first capacitive element that has one end connected to the first output node and holds a reset level that is a level of the signal at a time of resetting by the first reset unit;

a second capacitive element that has one end connected to the first output node and holds an image signal level that is a level of the signal when the charge is transferred to the charge holding unit;

a first switch element that is connected between another end of the first capacitive element and a predetermined second output node and controls a current flowing through the first capacitive element;

a second switch element that is connected between another end of the second capacitive element and the second output node and controls a current flowing through the second capacitive element;

a second reset unit that resets the second output node;

a readout circuit that is connected to the second output node, reads each of the reset level held in the first capacitive element and the image signal level held in the second capacitive element, and outputs the reset level and the image signal level as a reset signal and an image signal, respectively;

a substrate contact that supplies a reference potential to the semiconductor substrate; and a processing circuit that processes the reset signal and the image signal.

* * * * *